US011442125B2

(12) United States Patent
Yang et al.

(10) Patent No.: US 11,442,125 B2
(45) Date of Patent: Sep. 13, 2022

(54) GAPPED MULTI-BIRDCAGE MRI RF COIL

(71) Applicant: Quality Electrodynamics, LLC, Mayfield Village, OH (US)

(72) Inventors: Xiaoyu Yang, Indiana, PA (US); Thomas Eastlake, Cleveland, OH (US); Tsinghua Zheng, Chesterland, OH (US)

(73) Assignee: Quality Electrodynamics, LLC, Mayfield Village, OH (US)

( * ) Notice: Subject to any disclaimer, the term of this patent is extended or adjusted under 35 U.S.C. 154(b) by 31 days.

(21) Appl. No.: 17/028,318

(22) Filed: Sep. 22, 2020

(65) Prior Publication Data

US 2022/0091203 A1   Mar. 24, 2022

(51) Int. Cl.
  *G01R 33/34* (2006.01)
  *G01R 33/36* (2006.01)
  *G01R 33/385* (2006.01)
  *G01R 33/422* (2006.01)

(52) U.S. Cl.
  CPC . *G01R 33/34076* (2013.01); *G01R 33/34092* (2013.01); *G01R 33/365* (2013.01); *G01R 33/3635* (2013.01); *G01R 33/385* (2013.01); *G01R 33/422* (2013.01)

(58) Field of Classification Search
  CPC .. G01R 33/422; G01R 33/385; G01R 33/365; G01R 33/3635; G01R 33/34092; G01R 33/34076
  See application file for complete search history.

(56) References Cited

U.S. PATENT DOCUMENTS

| 4,692,705 A | 9/1987 | Hayes |
| 4,825,162 A | 4/1989 | Roemer et al. |
| 6,060,883 A * | 5/2000 | Knuttel ............ G01R 33/34046 324/300 |
| 6,100,694 A | 8/2000 | Wong |

(Continued)

OTHER PUBLICATIONS

Mispelter et al. "NMR Probe-Heads for Biophysical and Biomedical Experiments: Theoretical Principles & Practical Guidelines." Imperial College Press: London, ISBN 978-1848166622, published on Oct. 1, 2015.

(Continued)

*Primary Examiner* — Dixomara Vargas
(74) *Attorney, Agent, or Firm* — Eschweiler & Potashnik, LLC

(57) ABSTRACT

Various embodiments of the present disclosure are directed towards a magnetic resonance imaging (MRI) radio frequency (RF) coil configured to operate in at least one of a transmit mode or a receive mode. A first birdcage coil includes a pair of first-birdcage end rings and at least four first-birdcage rungs circumferentially arranged along the first-birdcage end rings. A second birdcage coil including a pair of second-birdcage end rings and at least four second-birdcage rungs circumferentially arranged along the second-birdcage end rings. The first and second birdcage coils neighbor and are spaced by a first non-zero distance along an axis. The axis is surrounded by the first-birdcage end rings and the second-birdcage end rings, and the first non-zero distance is greater than individual lengths of the first and second birdcage coils along the axis.

20 Claims, 42 Drawing Sheets

(56) References Cited

U.S. PATENT DOCUMENTS

| | | | | |
|---|---|---|---|---|
| 6,198,962 | B1* | 3/2001 | Su | G01R 33/34046 |
| | | | | 324/318 |
| 6,313,633 | B1* | 11/2001 | Boskamp | G01R 33/34053 |
| | | | | 324/318 |
| 6,369,570 | B1* | 4/2002 | Wong | G01R 33/34046 |
| | | | | 324/307 |
| 6,377,836 | B1* | 4/2002 | Arakawa | A61B 5/055 |
| | | | | 324/318 |
| 6,404,201 | B1* | 6/2002 | Boskamp | G01R 33/34076 |
| | | | | 324/318 |
| 6,420,871 | B1* | 7/2002 | Wong | G01R 33/34046 |
| | | | | 324/318 |
| 6,850,064 | B1* | 2/2005 | Srinivasan | G01R 33/34046 |
| | | | | 324/318 |
| 10,386,430 | B2 | 8/2019 | Yang et al. | |
| 11,156,682 | B2* | 10/2021 | Yang | G01R 33/34046 |
| 2003/0020476 | A1* | 1/2003 | Duensing | G01R 33/34046 |
| | | | | 324/318 |
| 2004/0137872 | A1* | 7/2004 | Srinivasan | G01R 33/34046 |
| | | | | 455/344 |
| 2008/0309340 | A1* | 12/2008 | Cho | G01R 33/34069 |
| | | | | 324/318 |
| 2009/0256569 | A1* | 10/2009 | Hancu | G01R 33/3664 |
| | | | | 324/314 |
| 2011/0121834 | A1* | 5/2011 | Soutome | G01R 33/365 |
| | | | | 324/318 |
| 2012/0268132 | A1* | 10/2012 | Zhu | G01R 33/3692 |
| | | | | 324/322 |
| 2013/0127463 | A1* | 5/2013 | Matschl | G01R 33/3453 |
| | | | | 324/309 |
| 2014/0218025 | A1* | 8/2014 | Wong | G01R 33/44 |
| | | | | 324/309 |
| 2017/0299671 | A1* | 10/2017 | Holle | G01R 33/34076 |
| 2018/0081008 | A1* | 3/2018 | Yang | G01R 33/34046 |
| 2018/0275233 | A1* | 9/2018 | Yang | G01R 33/34046 |
| 2018/0313918 | A1* | 11/2018 | Yang | G01R 33/34007 |
| 2019/0331744 | A1* | 10/2019 | Yang | G01R 33/385 |
| 2020/0292642 | A1* | 9/2020 | Yang | G01R 33/3664 |
| 2020/0292643 | A1* | 9/2020 | Yang | G01R 33/3635 |
| 2021/0132169 | A1* | 5/2021 | Yang | G01R 33/422 |
| 2021/0223337 | A1* | 7/2021 | Loew | G01R 33/3657 |
| 2021/0318398 | A1* | 10/2021 | Yang | G01R 33/3635 |

OTHER PUBLICATIONS

Vaughan et al. "RF Coils for MRI." Wiley, ISBN 978-0470770764, published on Dec. 19, 2012.

Gotshal et al. "Isolation of Birdcage Coils Using Mutual Capacitors on a Common End-Ring." Proc. ISMRM 10:0165 (2002), published in 2002.

Heo et al. "A Study on Multiple Array Method of Birdcage Coils to Improve the Signal Intensity and Homogeneity in Small-Animal Whole-Body Magnetic Resonance Imaging at 7 T." Int J Imaging Syst Technol. 2020; 30:31-44. published on Nov. 29, 2019.

Brown, Ryan. "Multi-Tuned Coils." Proc. Intl. Soc. Mag. Reson. Med. 24 (2016), published in 2016.

\* cited by examiner

GAPPED MULTI-BIRDCAGE MRI RF COIL

BACKGROUND

Due to excellent $B_1$ magnetic field uniformity, the birdcage coil has become one of, if not, the most popular magnetic resonance imaging (MRI) transmit (Tx) coil in horizontal MRI systems. For example, the birdcage coil has become popular as a system built-in whole-body coil (WBC). As another example, the birdcage coil has become popular in many local cylindrical-like Tx/receive (Rx) coils, such as head coils, knee coils, wrist coils, etc.

The birdcage coil may be used from low magnetic $B_0$ fields to high $B_0$ magnetic fields. Low $B_0$ magnetic fields may, for example, include $B_0$ magnetic fields less than about 0.1 Tesla (T), whereas high $B_0$ magnetic fields may, for example, include $B_0$ fields greater than about 7 T. Further, the birdcage coil may be used as a Rx coil because any Tx coil is generally applicable as a Rx coil. Types of birdcage coil include a high pass birdcage coil, a low pass birdcage coil, and a band pass birdcage coil. If the birdcage coil is used as a WBC, it often includes a radio frequency (RF) shield separating it from gradient coils. As a result, there may be a gap of several centimeters between the birdcage WBC and the RF shield in a radial direction.

The power efficiency of the birdcage coil is an important performance parameter for assessing signal-to-noise ratio (SNR) and transmitter RF power requirements. It can be described by several parameters. One such parameter is the $H_1/I_{ER}$ ratio, where $H_1$ is the magnetic field at the iso-center of the birdcage coil and $I_{ER}$ is the current flowing in end rings of the birdcage coil. Note that a direction of $H_1$ is perpendicular to the longitudinal axis of the birdcage coil and, if the birdcage coil is driven in quadrature mode, the end ring current in each section of the end rings has the same magnitude but different phases. Assuming the birdcage coil is being used as a WBC and has an RF shield, the $H_1/I_{ER}$ ratio may be written as follows:

$$\frac{H_1}{I_{ER}} = \frac{N}{\pi d}\sin\left(\frac{\pi}{N}\right)\left(\frac{l}{\sqrt{l^2+d^2}}\right)\left(1+\frac{d^2}{l^2+d^2}\right)\left(1-\frac{d^2}{D^2}\right). \qquad \text{Eq. 1}$$

N is the number of rungs of the birdcage coil, d is the diameter of the birdcage coil, l is the length of the birdcage coil, and D is the diameter of the RF shield.

Besides use of a single birdcage coil, two birdcage coils may be used simultaneously. For example, two birdcage coils may share a common end ring. The common end ring facilitates decoupling, such that the two birdcage coils may be driven independently. As another example, two birdcage coils may overlap along a Z axis. The overlap facilitates decoupling, similar to the overlap approach used in phased array coils, such that the two birdcage coils may be driven independently. As yet another example, two birdcage coils may border along the Z and may be separated along the Z axis by a small gap. Capacitors may then facilitate decoupling, such that two birdcage coils may be driven independently.

While two birdcage coils may be used simultaneously, approaches for achieving simultaneous use of two birdcage coils depend upon decoupling between the two birdcage coils. This leads to increased complexity and increased cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
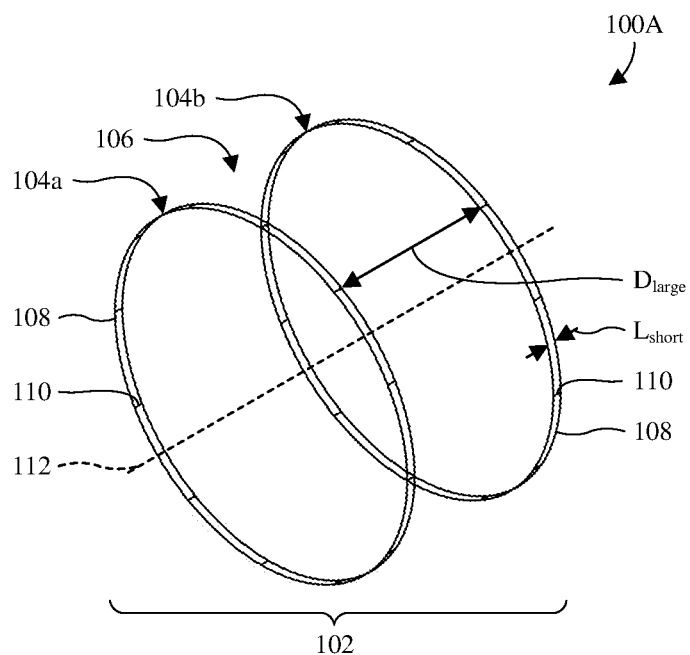
FIGS. 1A-1D illustrate various views of some embodiments of a gapped multi-birdcage magnetic resonance imaging (MRI) radio frequency (RF) coil.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments of the present disclosure are directed towards a gapped multi-birdcage magnetic resonance imaging (MRI) radio frequency (RF) coil, as well as an MRI system and a method for performing MRI that use the gapped multi-birdcage MRI RF coil. The gapped multi-birdcage MRI RF coil comprises multiple (e.g., two or more) birdcage coils that have short lengths and that are separated from each other by large gaps. By "short" lengths, it is meant that lengths of the birdcage coils are smaller than the large gaps. Similarly, by "large" gaps it is meant that the gaps are larger than the short lengths. The gapped multi-birdcage MRI RF coil achieves good signal-to-noise ratio (SNR) and transmit efficiency. Further, the gapped multi-birdcage MRI RF coil may be used for multi-channel transmit (Tx) and receive (Rx).

Figure 1B:
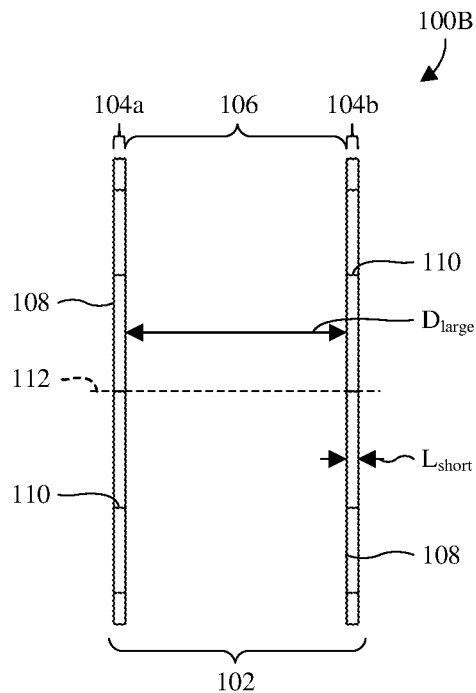
Figure 1C:
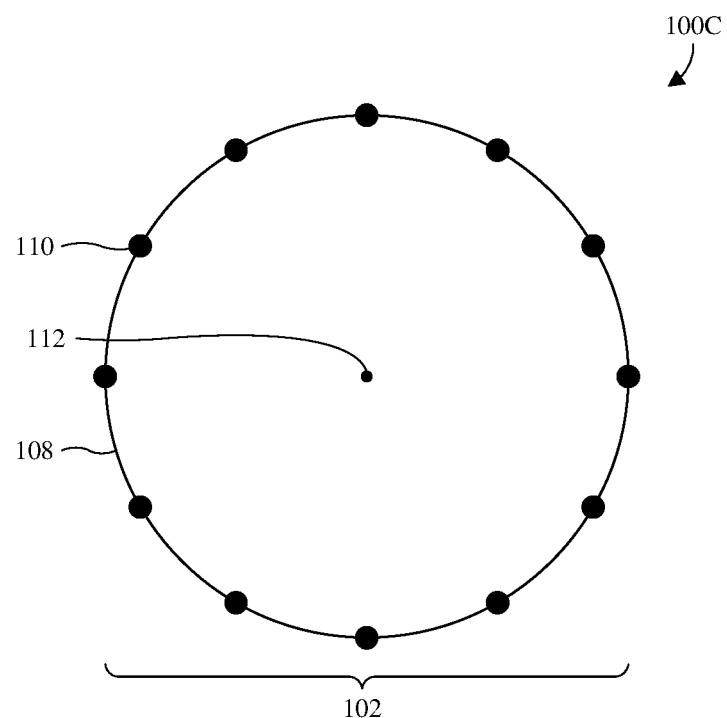
Figure 1D:
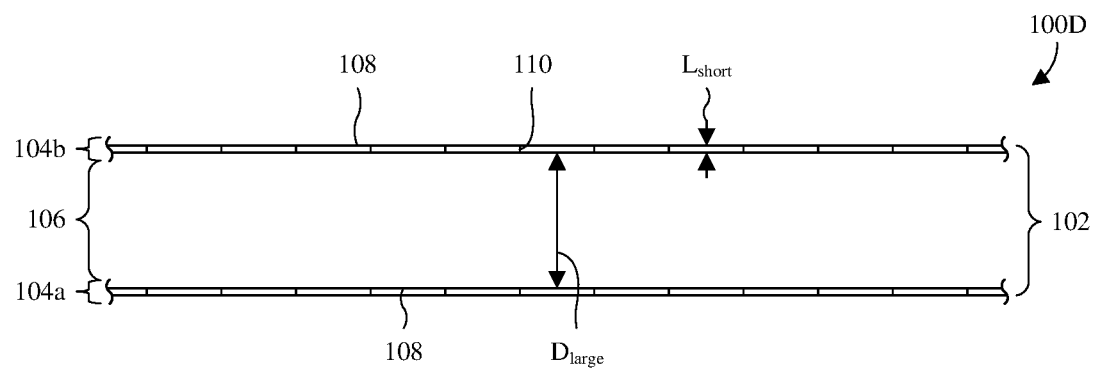

With reference to FIGS. 1A-1D, various views 100A-100D of some embodiments of a gapped multi-birdcage MRI RF coil 102 are provided. FIG. 1A provides a perspective view 100A, FIG. 1B provides a side view 100B, FIG. 1C provides an axial view 100C, and FIG. 1D provides a flattened view 100D. Note that for simplicity, capacitors and other electronics are not illustrated. The gapped multi-birdcage MRI RF coil 102 comprises a first birdcage coil 104a and a second birdcage coil 104b separated from each other by a gap 106. In some embodiments, the gapped multi-birdcage MRI RF coil 102 is used in a local cylindrical-like Tx/Rx MRI RF coil for a head, a knee, a wrist, or some other suitable anatomical feature. In other embodiments, the gapped multi-birdcage MRI RF coil 102 is used in some other suitable coil.

The first and second birdcage coils 104a, 104b have the same geometry, but may have different geometries in alternative embodiments. Many examples of differences are illustrated hereafter. The first and second birdcage coils 104a, 104b comprise individual pairs of end rings 108 and individual pluralities of rungs 110. Note that the rungs 110 are schematically illustrated by circles in FIG. 1C. The first birdcage coil 104a has the same number of rungs 110 as the second birdcage coil 104b but may alternatively have a different number of rungs 110. Further, the first and second birdcage coils 104a, 104b each have at least four rungs 110.

The end rings 108 have the same orientations and are spaced along a principal axis 112. Further, the end rings 108 are circular with the same diameter and individually surround the principal axis 112. The principal axis 112 extends through centers of the end rings 108 transverse to radii of the end rings 108. The principal axis 112 may, for example, be a Z axis extending through a magnetic isocenter of the gapped multi-birdcage MRI RF coil 102. Further, the principal axis 112 may, for example, be aligned with a $B_0$ magnetic field during use of the gapped multi-birdcage MRI RF coil 102.

In alternative embodiments, the end rings 108 of the first birdcage coil 104a have a different size and/or shape and/or the end rings 108 of the second birdcage coil 104b have a different size and/or shape. Further, in alternative embodiments, the end rings 108 of the first birdcage coil 104a have a different size and/or shape as the end rings 108 of the second birdcage coil 104b. In alternative embodiments, only one of the end rings 108 of the first birdcage coil 104a has a center on the principal axis 112 and/or only one of the end rings 108 of the second birdcage coil 104b has a center on the principal axis 112. Further, in alternative embodiments, only the first birdcage coil 104a (e.g., not the second birdcage coil 104b) has an end ring with a center on the principal axis 112. In alternative embodiments the end rings 108 of the first birdcage coil 104a have different orientations and/or the end rings 108 of the second birdcage coil 104b have different orientations. Further, in alternative embodiments the end rings 108 of the first birdcage coil 104a have a different orientation than the end rings 108 of the second birdcage coils 104b.

The rungs 110 interconnect the end rings 108 of the corresponding birdcage coils and surround the principal axis 112 circumferentially along the end rings 108 of the corresponding birdcage coils. The rungs 110 share a common length extending in parallel with the principal axis 112 and are evenly spaced circumferentially along the end rings 108 of along the end rings 108 of the corresponding birdcage coil. In alternative embodiments, the rungs 110 of the first birdcage coil 104a have a different length than the rungs 110 of the second birdcage coil 104b. In alternative embodiments, the rungs 110 of the first birdcage coil 104a and/or the rungs 110 of the second birdcage coil 104b are unevenly spaced circumferentially along the end rings 108 of the corresponding birdcage coils. In alternative embodiments, the rungs 110 of the first birdcage coil 104a and/or the rungs 110 of the second birdcage coil 104b are angled with respect to the principal axis 112.

The first and second birdcage coils 104a, 104b have individual resonant frequencies when operating in uniform mode with no coupling. These resonant frequencies may also be known as uniform mode frequencies. As described hereafter, coupling may, for example, refer to indirect coupling by mutual inductance and direct coupling by wire through phase shifters with a phase shift that is an integer multiple of 180 degrees. Because the first and second birdcage coils 104a, 104b are on the principal axis 112 and separated by the gap 106, coupling may result in two new resonant frequencies. A first new resonant frequency provides a new uniform mode frequency at which individual RF fields from the first and second birdcage coils 104a, 104b add in the gap 106. A second new resonant frequency provides an anti-uniform mode frequency at which the RF fields from the first and second birdcage coils 104a, 104b cancel in the gap 106.

By driving the first and second birdcage coils 104a, 104b simultaneously at the new uniform mode frequency when coupled, the first and second birdcage coils 104a, 104b coils act as one coil. This applies for both a linear drive mode as well as a quadrature drive mode. Therefore, the first and second birdcage coils 104a, 104b may be used together for MRI by ensuring coupling and by tuning the first and second birdcage coils 104a, 104b so the new uniform mode frequency is the same as the system working frequency (e.g., the Larmor frequency). To the extent that there is no coupling between the first and second birdcage coils 104a, 104b, the first and second birdcage coils 104a, 104b are separately driven at the system working frequency.

Figure 2:
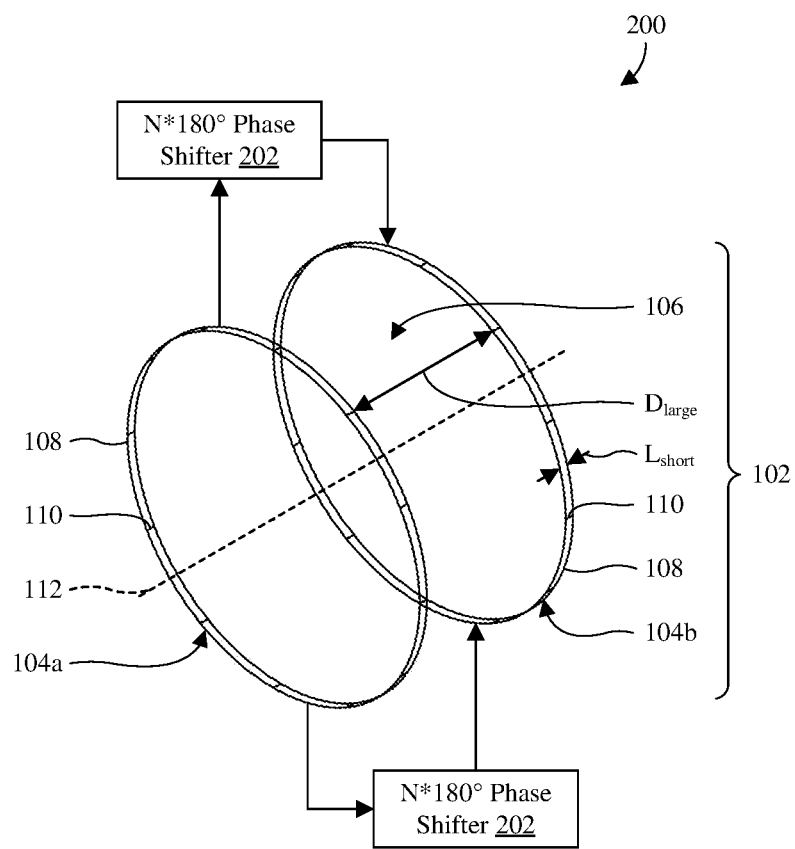
FIG. 2 illustrates a perspective view of some alternative embodiments of the gapped multi-birdcage MRI RF coil of FIGS. 1A-1D in which birdcage coils are coupled by phase shifters.

Normally, coupling by mutual inductance is sufficient to ensure the first and second birdcage coils 104a, 104b work together at the new uniform mode frequency. However, at high frequencies or high patient loads, mutual inductance may be insufficient to provide the coupling. With reference to FIG. 2, a perspective view 200 of some alternative embodiments of the gapped multi-birdcage MRI RF coil 102 of FIGS. 1A-1D is provided in which multiple phase shifters 202 couple the first and second birdcage coils 104a, 104b together so the first and second birdcage coils 104a, 104b work together at the new uniform mode frequency. Each of the phase shifters 202 provides a phase shift that is 180 degrees or that is an integer multiple of 180 degrees. Further, each of the phase shifters 202 is electrically coupled to the first and second birdcage coils 104a, 104b with a polarity aligned to the uniformity mode current. A wrong polarity may cause the first and second birdcage coils 104a, 104b to run in the non-uniform mode. Note that in FIG. 2, N is used to represent an integer greater than zero.

Referring back to FIGS. 1A-1D, the gap 106 separates the first and second birdcage coils 104a, 104b by a non-zero distance $D_{large}$ along the principal axis 112. The non-zero distance $D_{large}$ is large compared to individual lengths $L_{short}$ of the first and second birdcage coils 104a, 104b along the principal axis 112. In some embodiments, the non-zero distance $D_{large}$ is also large compared to individual lengths of the rungs 110. Further, in some embodiments, the non-zero distance $D_{large}$ is less than individual diameters of the end rings 108. Because the non-zero distance $D_{large}$ is comparatively large, the gap 106 may be regarded as large. Because the lengths $L_{short}$ are comparatively small, the lengths may be regarded as short and the first and second birdcage coils 104a, 104b may be regarded as short-length birdcage coils. In some embodiments, the end rings 108 have diameters of about 27 centimeters (cm), the non-zero distance $D_{large}$ is about 13.5 cm, and the lengths $L_{short}$ are about 2 cm. Other suitable values are, however, amenable.

Figure 3:
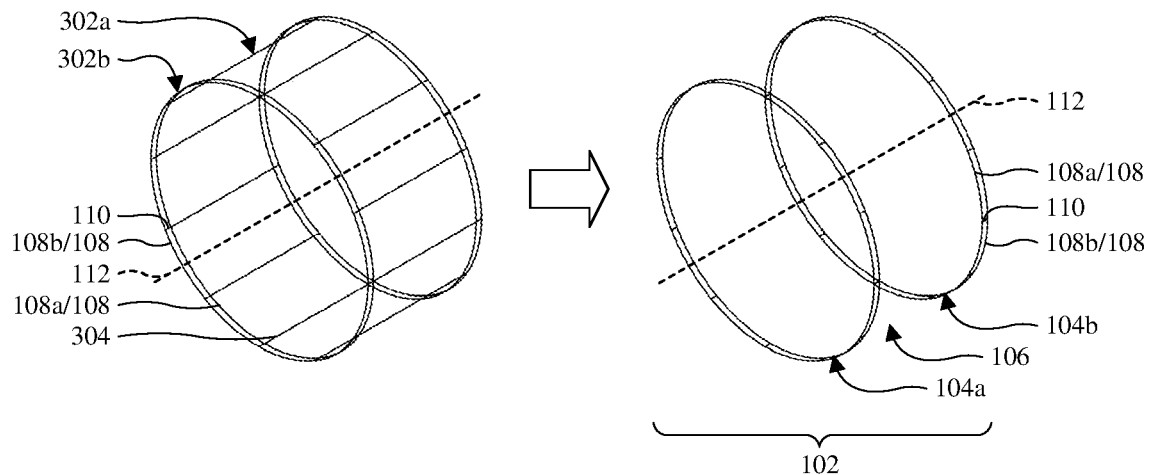
FIG. 3 illustrate a schematic diagram of some embodiments in which a pair of long-length birdcage coils simplify to the gapped multi-birdcage MRI RF coil of FIGS. 1A-1D.

It has been appreciated that by separating the first and second birdcage coils 104a, 104b by a large gap and by having short lengths for the first and second birdcage coils 104a, 104b, a low SNR and a high transmit efficiency may be achieved. To understand why, attention is directed to FIG. 3 in which a first long-length birdcage coil 302a and a second long-length birdcage coil 302b overlap and simplify to the first and second birdcage coils 104a, 104b.

The first long-length birdcage coil 302a comprises a pair of first end rings 108a, and the second long-length birdcage coil 302b comprises a pair of second end rings 108b. The first and second end rings 108a, 108b are centered on the principal axis 112 with the same orientation and are circular with the same diameter. Further, the first end rings 108a are between and spaced from the second end rings 108b. The first and second long-length birdcage coils 302a, 302b share a plurality of first rungs 304, and the second long-length birdcage coil 302b further comprises a plurality of second rungs 110 extending respectively from the first rungs 304 respectively to the second end rings 108b. A total number of the first rungs 304 is half that of the second rungs 110.

For the first long-length birdcage coil 302a, current flows through sections of the first long-length birdcage coil 302a with phase A and magnitude B, where A is a set of phases covering all section currents and B is a set of magnitudes covering all section currents. A section may, for example, be a rung or a piece of end ring between two neighboring rungs. Further, for the second long-length birdcage coil 302b, current flows through sections of the second long-length birdcage coil 302b with phase A+180 degrees and the same magnitude B. In other words, current flows through the second long-length birdcage coil 302b with an opposite phase and the same magnitude. As a result, current in the first rungs 304 becomes zero and the first rungs 304 can be removed to arrive at the first and second birdcage coils 104a, 104b.

With the foregoing in mind, the first and second long-length birdcage coils 302a, 302b may be used to assess the $H_1/I_{ER}$ ratio for the first and second birdcage coils 104a, 104b. $H_1$ is the magnetic field at the iso-center of the first and second birdcage coils 104a, 104b and $I_{ER}$ is the current flowing in the end rings 108 of the first and second birdcage coils 104a, 104b. Based on Eq. 1 above, the $H_1/I_{ER}$ ratio may be written as follows:

$$\frac{H_1}{I_{ER}} = \frac{N}{\pi d}\sin\left(\frac{\pi}{N}\right)\left(\frac{l}{\sqrt{l^2+d^2}}\right)\left(1+\frac{d^2}{l^2+d^2}\right) - \frac{N}{\pi d}\sin\left(\frac{\pi}{N}\right)\left(\frac{L}{\sqrt{L^2+d^2}}\right)\left(1+\frac{d^2}{L^2+d^2}\right).$$  Eq. 2

L is the length of the second long-length birdcage coil 302b (e.g., the separation between the second end rings 108b), and l is the length of the first long-length birdcage coil 302a (e.g., the separation between the first end rings 108a). Note that l is the same as the non-zero distance $D_{large}$ in FIGS. 1A-1D. Further, N is the total number of the first rungs 304, and d is the diameter of the first and second end rings 108a, 108b. Assuming L−l=2Δl is <<l and d, where Δl is the length of the second rungs 110, the $H_1/I_{ER}$ ratio may be simplified as follows:

$$\frac{H_1}{I_{ER}} \approx \frac{N}{\pi d}\sin\left(\frac{\pi}{N}\right)\left(\frac{2\Delta l}{\sqrt{l^2+d^2}}\right)\left(1+\frac{d^2}{l^2+d^2}\right).$$  Eq. 3

Note that Δl is the same as the lengths $L_{short}$ in FIGS. 1A-1D.

The shielding factor of Eq. 1 is $$\left(1-\frac{d^2}{D^2}\right).$$

When d is very close to D, then the $H_1/I_{ER}$ ratio of Eq. 3 is comparable to Eq. 1. In other words, the $H_1/I_{ER}$ ratio of the first and second birdcage coils 104a, 104b is comparable to that of a single birdcage coil with an RF shield. Indeed, the ratio between the $H_1/I_{ER}$ ratio may be written as follows:

$$\frac{(H_1/I_{ER})_{no\ shield}}{(H_1/I_{ER})_{shielded}} \approx \frac{d^*\Delta l}{l*(D-d)}.$$  Eq. 4

If l is not too long (e.g., <d) and Δl is close to D-d, the first and second birdcage coils 104a, 104b may have similar power efficiency as a single birdcage coil with an RF shield. Therefore, the first and second birdcage coils 104a, 104b may be used in place of a single birdcage coil with an RF shield to achieve a high SNR and a high transmit efficiency.

Figure 4A:
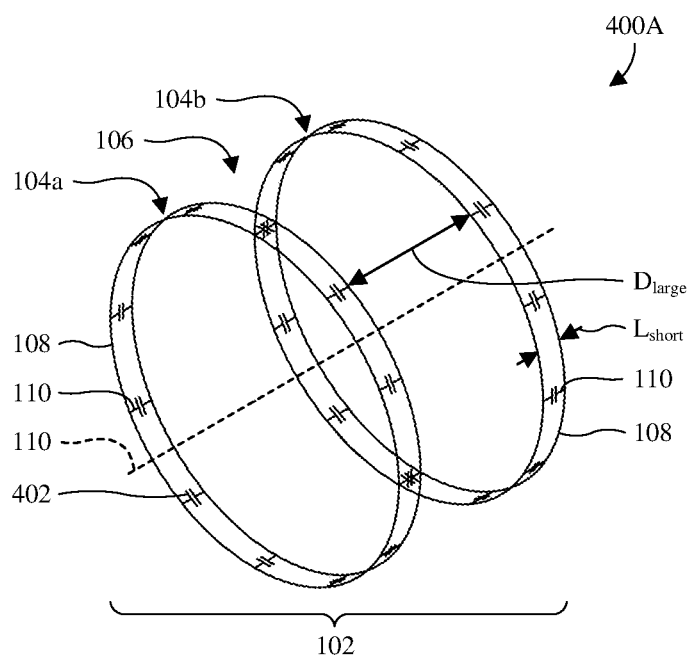
FIGS. 4A-4C illustrate perspective views of various more detailed embodiments of the gapped multi-birdcage MRI RF coil of FIGS. 1A-1D in which birdcage coils are respectively low pass, high pass, and bandpass.
Figure 4B:
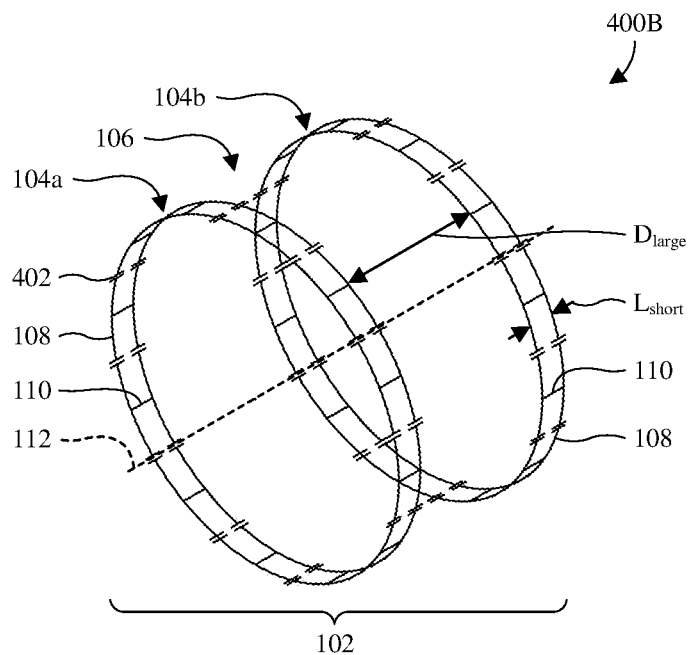
Figure 4C:
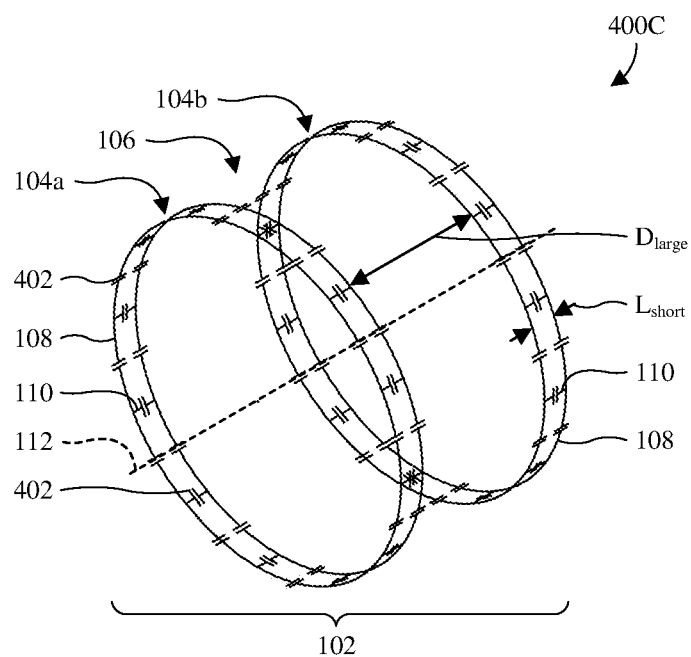

With reference to FIGS. 4A-4C, perspective views 400A-400C of various more detailed embodiments of the gapped multi-birdcage MRI RF coil 102 of FIGS. 1A-1D are provided in which the first and second birdcage coils 104a, 104b are respectively low pass, high pass, and bandpass. Note that the individual lengths $L_{short}$ of the first and second birdcage coils 104a, 104b have been increased for clarity and ease of illustration. Further, note that these more detailed embodiments of the first and second birdcage coils 104a, 104b are applicable to FIGS. 2 and 3 and any subsequently described figure having the first and second birdcage coils 104a, 104b.

In FIG. 4A, the first and second birdcage coils 104a, 104b are low pass birdcage coils and hence have capacitors 402 on the rungs 110. For example, there may be a capacitor 402 on each of the rungs 110. In FIG. 4B, the first and second birdcage coils 104a, 104b are high pass birdcage coils and hence have the capacitors 402 on the end rings 108. For example, there may be a capacitor 402 on each section of the end rings 108. In FIG. 4C, the first and second birdcage coils 104a, 104b are bandpass birdcage coils and hence have the capacitors 402 on both the end rings 108 and the rungs 110. For example, there may be a capacitor 402 on each of the rungs 110 and there may be a capacitor 402 on each section of the end rings 108.

Figure 5:
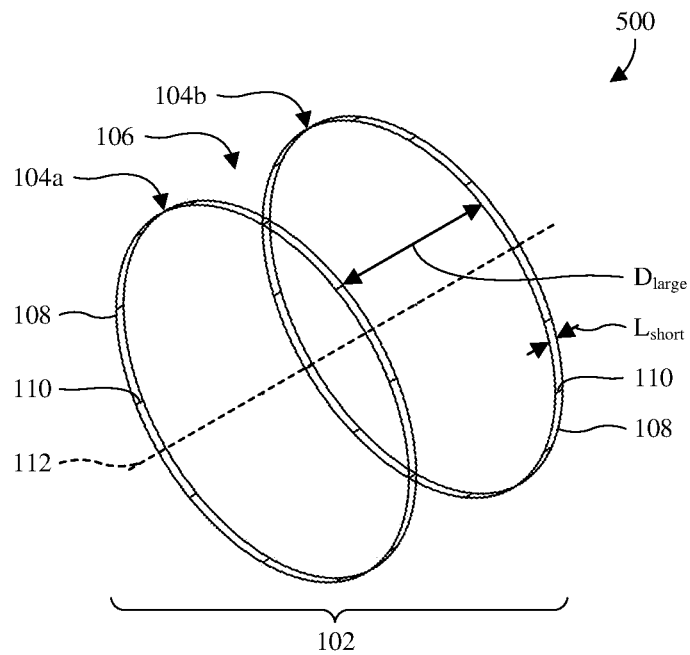
FIG. 5 illustrates a perspective view of some alternative embodiments of the gapped multi-birdcage MRI RF coil of FIGS. 1A-1D in which birdcage coils have different numbers of rungs.

With reference to FIG. 5, a perspective view 500 of some alternative embodiments of the gapped multi-birdcage MRI RF coil 102 of FIGS. 1A-1D is provided in which the first and second birdcage coils 104a, 104b have different numbers of rungs. For example, the first birdcage coil 104a may have 12 rungs, whereas the second birdcage coil 104b may have 16 rungs. Other suitable numbers of rungs are, however, amenable.

Figure 6:
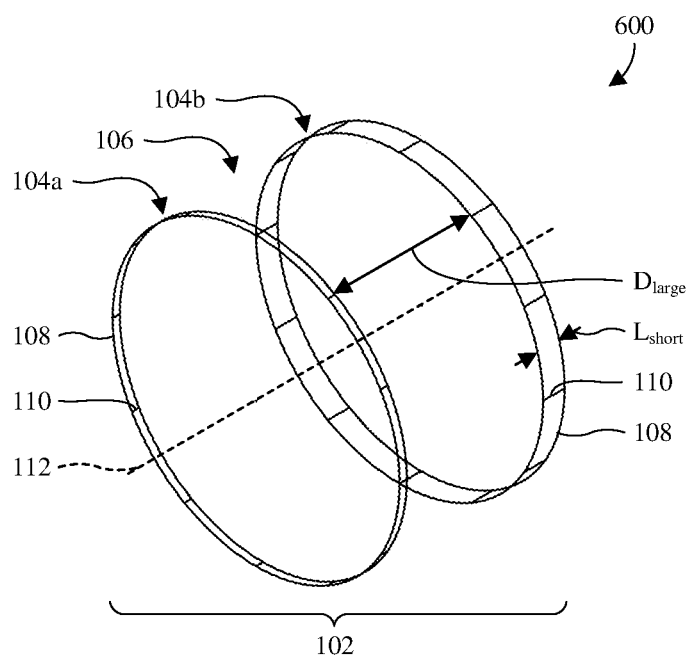
FIG. 6 illustrates a perspective view of some alternative embodiments of the gapped multi-birdcage MRI RF coil of FIGS. 1A-1D in which birdcage coils have different lengths.

With reference to FIG. 6, a perspective view 600 of some alternative embodiments of the gapped multi-birdcage MRI RF coil 102 of FIGS. 1A-1D is provided in which the first and second birdcage coils 104a, 104b have different lengths $L_{short}$. Particularly, the length $L_{short}$ of the first birdcage coil 104a is less than the length $L_{short}$ of the second birdcage coil 104b. In alternative embodiments, the length $L_{short}$ of the first birdcage coil 104a is greater than the length $L_{short}$ of the second birdcage coil 104b.

Figure 7:
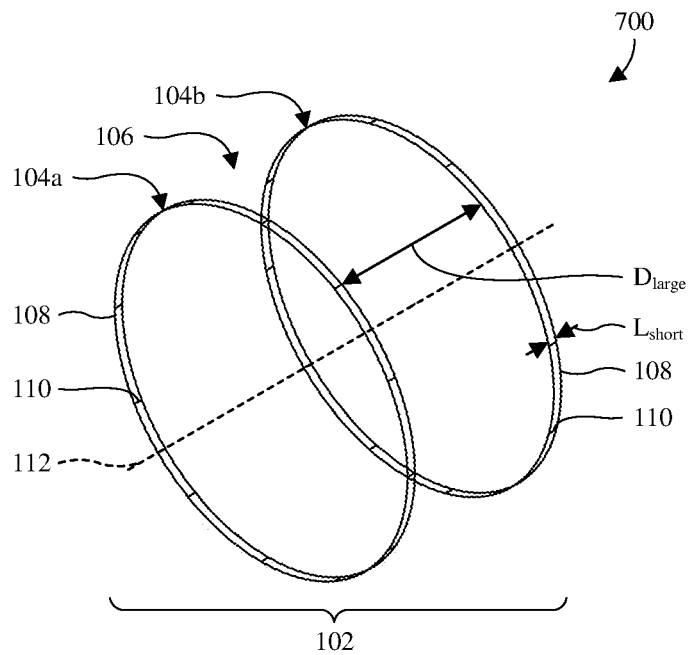
FIG. 7 illustrates a perspective view of some alternative embodiments of the gapped multi-birdcage MRI RF coil of FIGS. 1A-1D in which birdcage coils are angularly offset from each other.

With reference to FIG. 7, a perspective view 700 of some alternative embodiments of the gapped multi-birdcage MRI RF coil 102 of FIGS. 1A-1D is provided in which the second birdcage coil 104b is rotated about the principal axis 112 so as to have an angular offset relative to the first birdcage coil 104a. As a result, the rungs 110 of the second birdcage coil 104b are at different angles about the principal axis 112 than the rungs 110 of the first birdcage coil 104a.

Figure 8A:
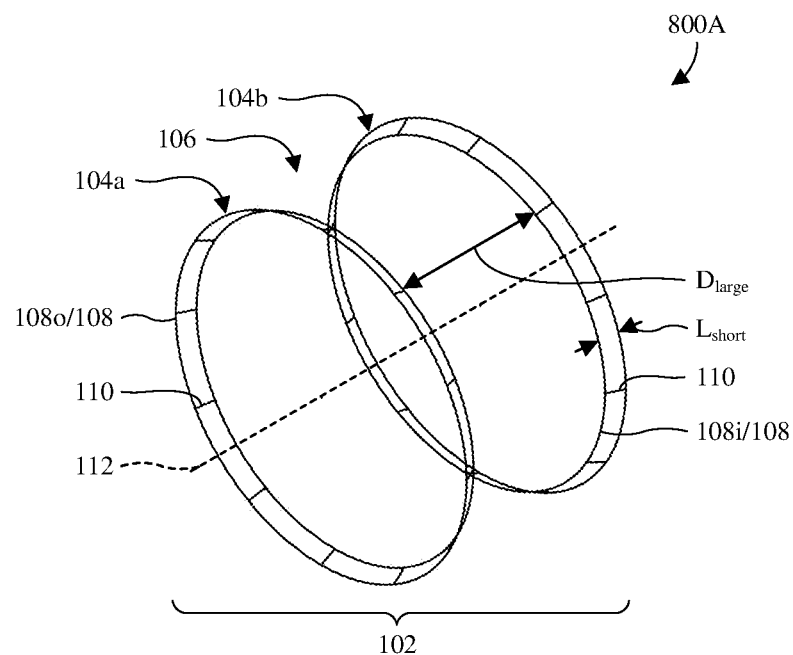
FIGS. 8A and 8B illustrate various views of some alternative embodiments of the gapped multi-birdcage MRI RF coil of FIGS. 1A-1D in which birdcage coils flare at ends.
Figure 8B:
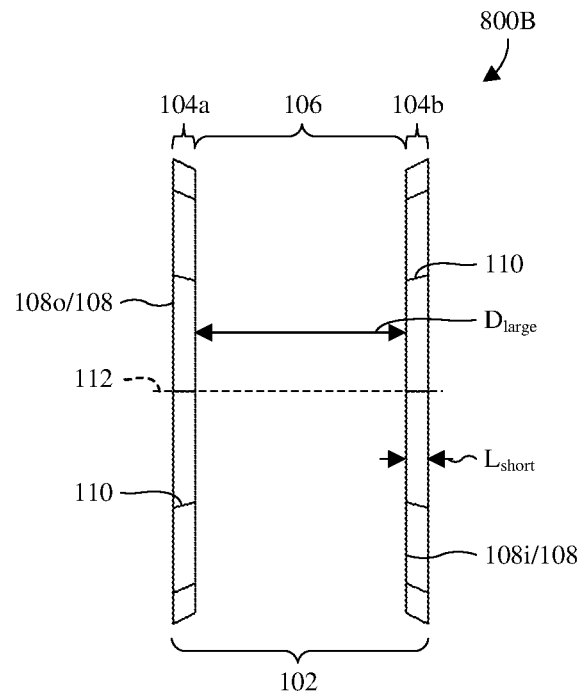

With reference to FIGS. 8A and 8B, various views 800A, 800B of some alternative embodiments of the gapped multi-birdcage MRI RF coil 102 of FIGS. 1A-1D are provided in which the first and second birdcage coils 104a, 104b flare at ends. FIG. 8A provides a perspective view 800A, whereas FIG. 8B provides a side view 800B. As a result of the flaring, outer end rings 108o of the first and second birdcage coils 104a, 104b have larger diameters than inner end rings 108i of the first and second birdcage coils 104a, 104b. The inner end rings 108i border the gap 106, and the outer end rings 108o are separated from the gap 106 by the rungs 110. In alternative embodiments, the outer end rings 108o have smaller diameters than the inner end rings 108i.

Figure 9A:
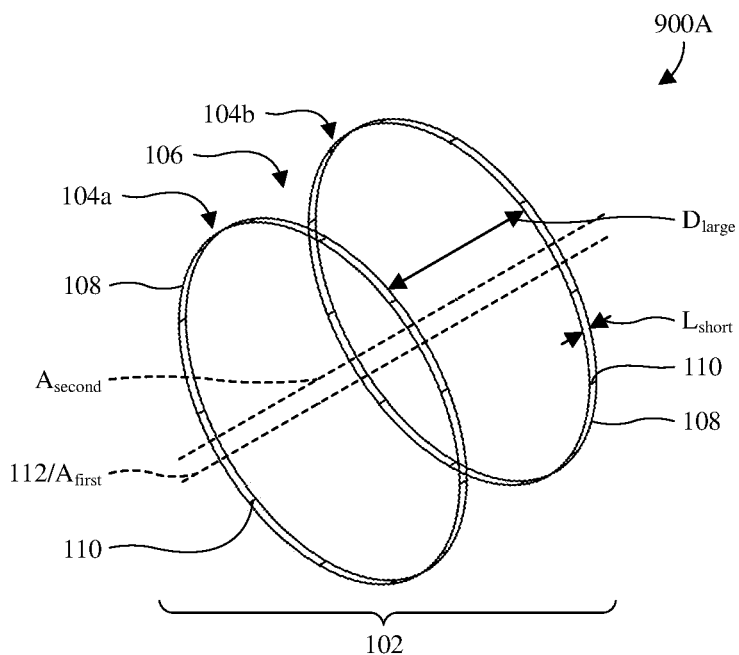
FIGS. 9A and 9B illustrate various views of some alternative embodiments of the gapped multi-birdcage MRI RF coil of FIGS. 1A-1D in which in which axes of birdcage coils are offset from each other.
Figure 9B:
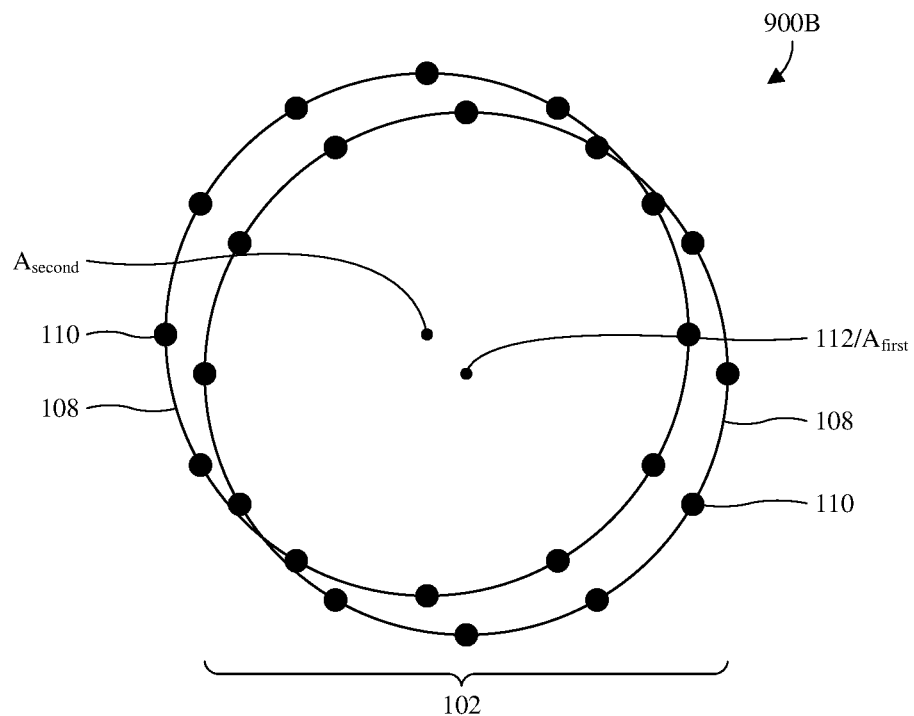

With reference to FIGS. 9A and 9B, various views 900A, 900B of some alternative embodiments of the gapped multi-birdcage MRI RF coil 102 of FIGS. 1A-1D are provided in which an axis $A_{second}$ of the second birdcage coil 104b is offset from the principal axis 112, which is the same as an axis $A_{first}$ of the first birdcage coils 104a. FIG. 9A provides perspective view 900A, whereas FIG. 9B provides an axial view 900B. In alternative embodiments, the axis $A_{first}$ of the first birdcage coil 104a is offset from the principal axis 112, which is the same as the axis $A_{second}$ of the second birdcage coils 104b.

Figure 10A:
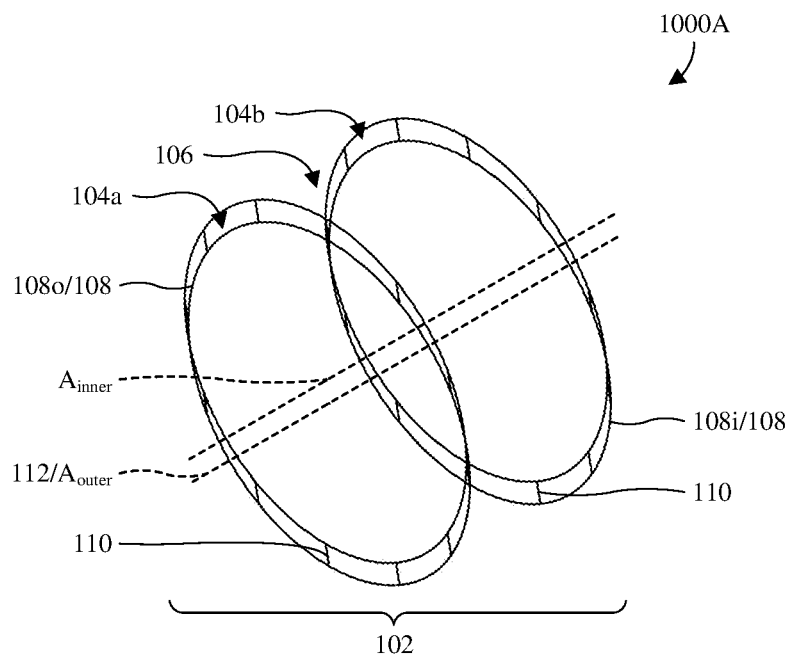
FIGS. 10A and 10B illustrate various views of some alternative embodiments of the gapped multi-birdcage MRI RF coil of FIGS. 1A-1D in which in which end rings of a birdcage coil have axes that are offset from each other.
Figure 10B:
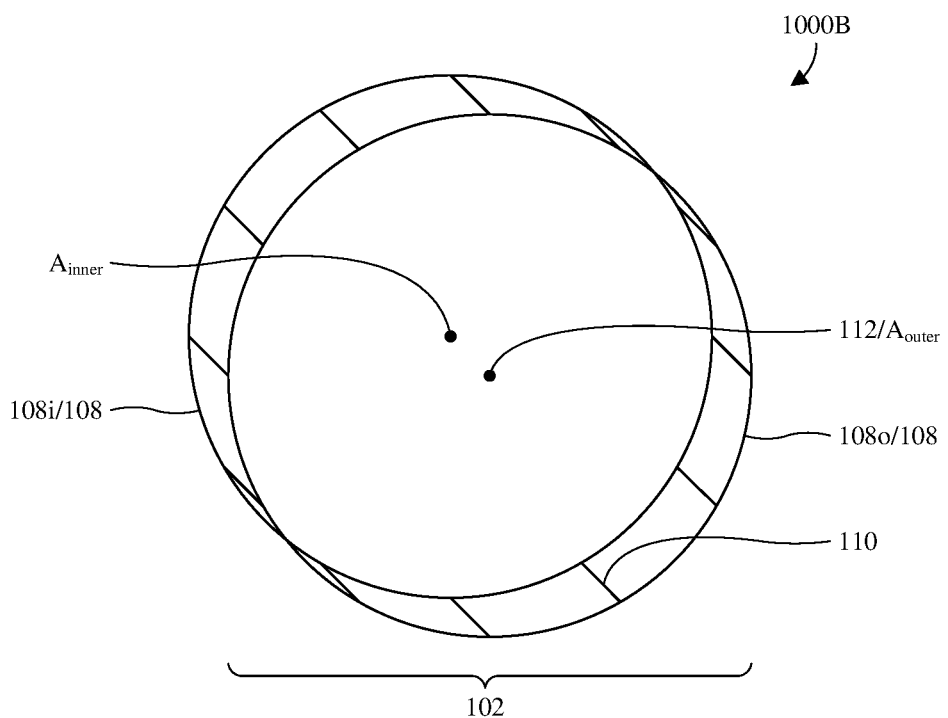

With reference to FIGS. 10A and 10B, various views 1000A, 1000B of some alternative embodiments of the gapped multi-birdcage MRI RF coil 102 of FIGS. 1A-1D are provided in which axes $A_{inner}$ of inner end rings 108i are offset from the principal axis 112, which is the same as axes $A_{outer}$ of outer end rings 108o. FIG. 10A provides a perspective view 1000A, whereas FIG. 10B provides an axial view 1000B. In alternative embodiments, only one of the inner end rings 108i has an axis $A_{inner}$ offset from the principal axis 112 and/or only one of the outer end rings 108o has an axis $A_{outer}$ that is the same as the principal axis 112. In alternative embodiments, the axes $A_{outer}$ of the outer end rings 108o are offset from the principal axis 112, which is the same as the axes $A_{inner}$ of the inner end rings 108i.

Figure 11A:
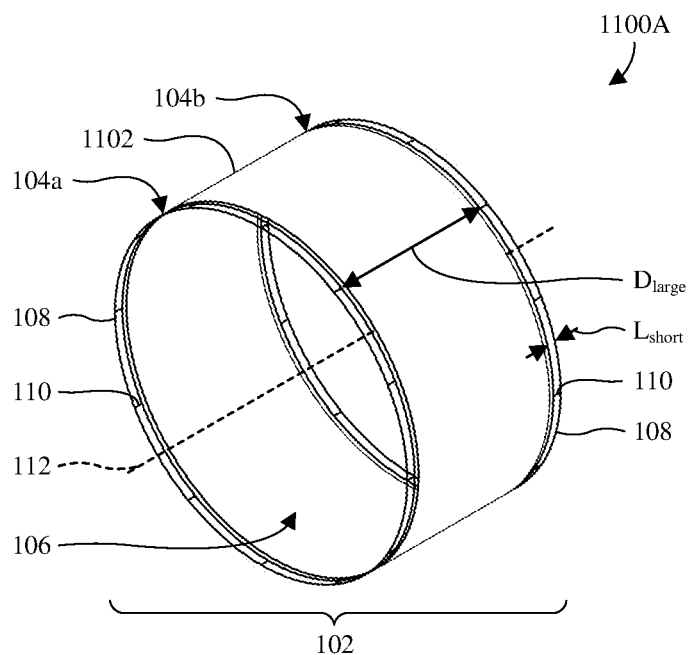
FIGS. 11A-11C illustrates various views of some alternative embodiments of the gapped multi-birdcage MRI RF coil of FIGS. 1A-1D further comprising an RF shield.
Figure 11B:
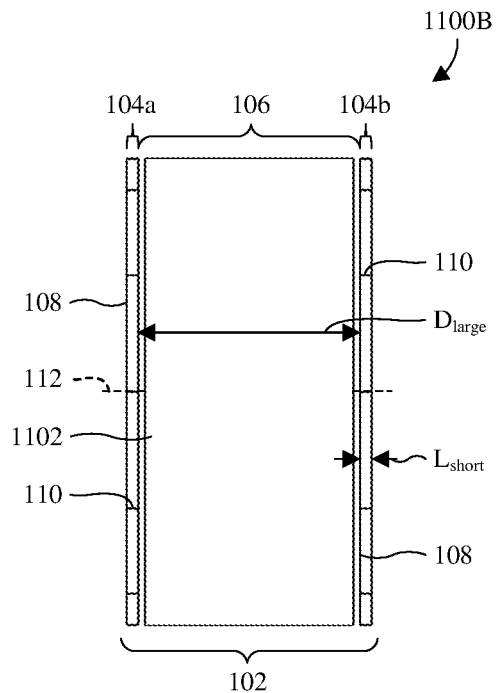
Figure 11C:
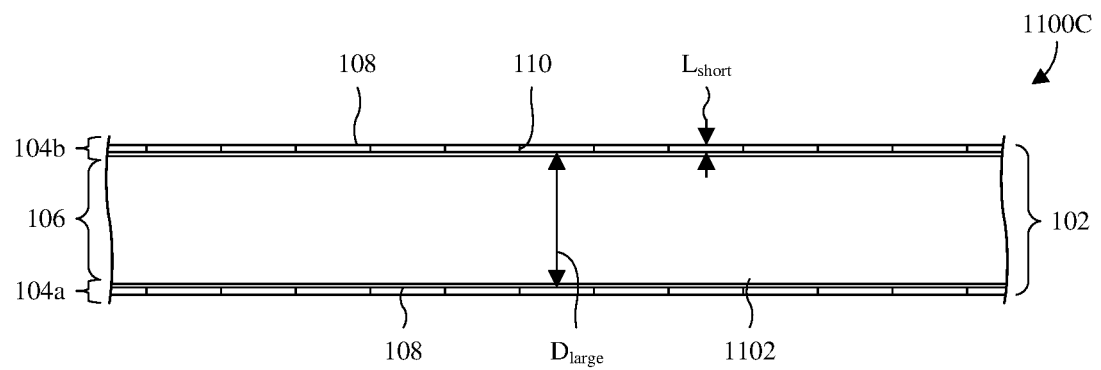

With reference to FIGS. 11A-11C, various views 1100A-1100C of some alternative embodiments of the gapped multi-birdcage MRI RF coil 102 of FIGS. 1A-1D are provided in which the gapped multi-birdcage MRI RF coil 102 further comprises an RF shield 1102. FIG. 11A provides a perspective view 1100A, FIG. 11B provides a side view 1100B, and FIG. 11C provides a flattened view 1100C. Note that the axial view 100C of FIG. 1C is the same for the alternative embodiments of the gapped multi-birdcage MRI RF coil 102 in FIGS. 11A-11C.

The RF shield 1102 surrounds the gap 106 between the first and second birdcage coils 104a, 104b and has a cylindrical shape extending from proximate the first birdcage coil 104a to proximate the second birdcage coil 104b. A diameter of the RF shield 1102 is the same as the end rings 108 and an axis of the RF shield 1102 is the same as the principal axis 112. In alternative embodiments, the axis of the RF shield 1102 is offset from the principal axis 112. Further, in alternative embodiments, the RF shield 1102 has a diameter that is different, but similar to, diameters of the end rings 108. The diameter of the RF shield 1102 may be similar to the diameters of the end rings 108 if within about 2 centimeters of the diameters of the end rings 108. The RF shield 1102 shields the gapped multi-birdcage MRI RF coil 102 from coupling by mutual inductance with surrounding coils. For example, the gapped multi-birdcage MRI RF coil 102 may be used as a whole-body coil (WBC) and the RF shield 1102 may shield the gapped multi-birdcage MRI RF coil 102 from coupling by mutual inductance to gradient coils. However, note that the RF shield 1102 may generally be omitted (see, e.g., FIGS. 1A-1D) when the gapped multi-birdcage MRI RF coil 102 is not being used as a WBC because the coupling is generally low.

As described above, the RF shield 1102 has the same diameter as the end rings 108. As a result, there is no radial gap between the RF shield 1102 and the end rings 108. This is possible because there is nothing between the first and second birdcage coils 104a, 104b at the space occupied by the RF shield 1102. It would not be possible for an MRI RF coil in which an RF shield surrounds a single birdcage coil. Rungs of the single birdcage coil would lead to a radial gap between end rings of the single birdcage coil and the RF shield to maintain spacing between the rungs of the single birdcage coil and the RF shield.

Because there is no radial gap in the gapped multi-birdcage MRI RF coil 102, the gapped multi-birdcage MRI RF coil 102 is more space efficient compared to an MRI RF coil in which an RF shield surrounds a single birdcage coil. Therefore, when the gapped multi-birdcage MRI RF coil 102 is employed as an WBC, the improved space efficiency may be employed to increase a patient bore diameter for a better patient experience or to reduce a diameter of gradient coils and a diameter of a main magnet for cost savings and/or performance boosting.

To illustrate, suppose a WBC of a large bore MRI system is defined by an MRI RF coil in which an RF shield surrounds a single birdcage coil. Further, suppose a bore diameter is about 70 cm, a whole bore length is about 1 meter (m), an RF shield diameter is about 75 cm, an RF shield length is about 1 m, a birdcage coil length is about 0.5 m, and a total number of rungs is equal to 16. Per Eq. 1, the $H_1/I_{ER}$ ratio of the MRI RF coil may be around 0.176. On the other hand, suppose the gapped multi-birdcage MRI RF coil 102 replaces the MRI RF coil. Further, suppose a coil length is about 0.5 m, a coil diameter is about 70 cm, the first and second birdcage coils 104a, 104b each have a length of about 15 cm, and the first and second birdcage coils each have a total number of rungs equal to 16. Per Eq. 2, the $H_1/I_{ER}$ ratio of the gapped multi-birdcage MRI RF coil 102 is around 0.16. This may allow a gradient coil diameter and a main magnet diameter to be reduced by about 5 cm. This may lead to a substantial cost reduction or performance improvement for both the gradient coil and the main magnet. Note that the specific dimensions and numbers presented above are presented merely as an example and other suitable dimensions and numbers are amenable in alternative embodiments.

Figure 12A:
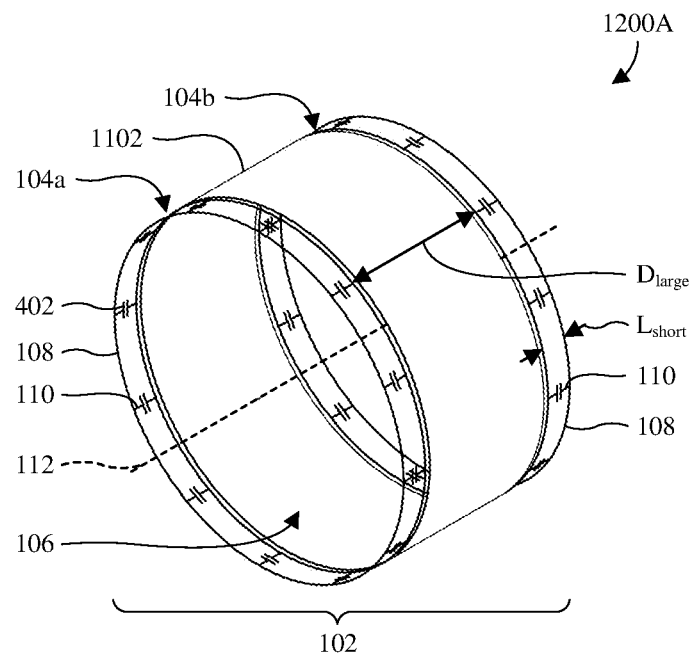
FIGS. 12A-12C illustrate various more detailed embodiments of the gapped multi-birdcage MRI RF coil of FIGS. 11A-11C in which birdcage coils are respectively low pass, high pass, and bandpass.
Figure 12B:
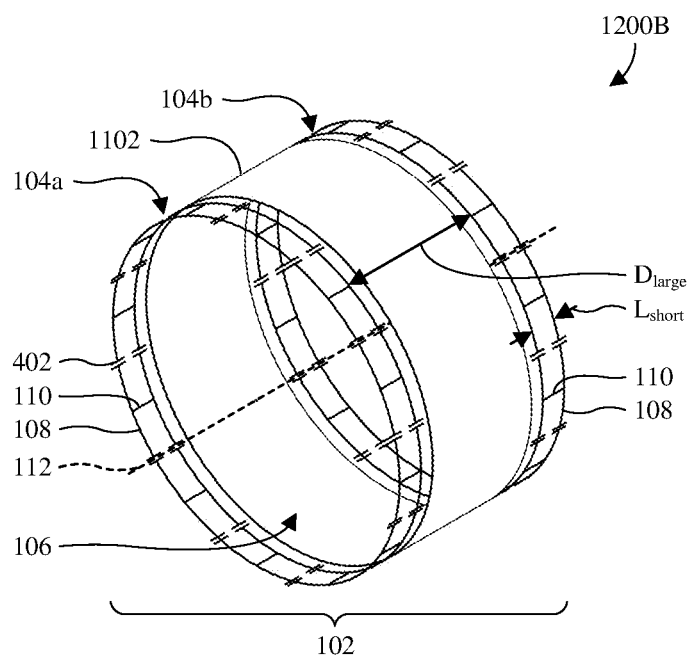
Figure 12C:
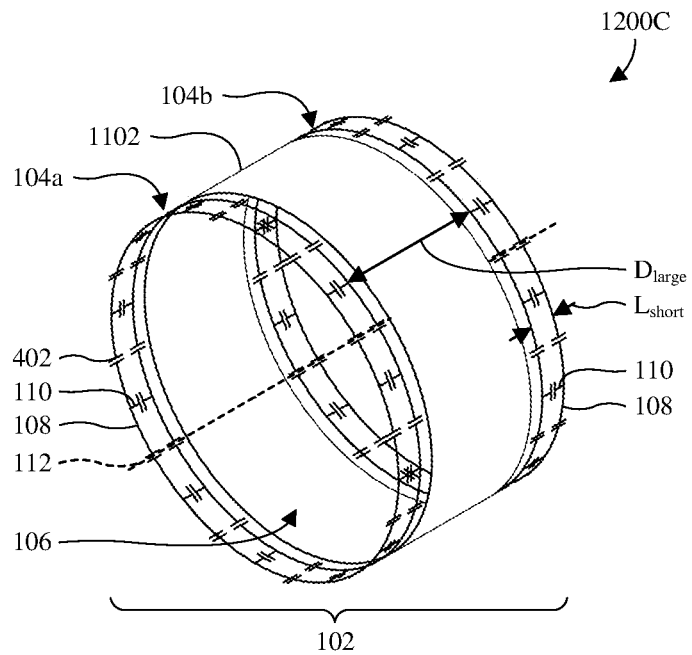

With reference to FIGS. 12A-12C, perspective views 1200A-1200C of various more detailed embodiments of the gapped multi-birdcage MRI RF coil 102 of FIGS. 11A-11C are provided in which the first and second birdcage coils 104a, 104b are respectively low pass, high pass, and bandpass. Note that the individual lengths $L_{short}$ of the first and second birdcage coils 104a, 104b have been increased for clarity and ease of illustration. In FIG. 12A, the first and second birdcage coils 104a, 104b are as in FIG. 4A. In FIG. 12B, the first and second birdcage coils 104a, 104b are as in FIG. 4B. In FIG. 12C, the first and second birdcage coils 104a, 104b are as in FIG. 4C.

Figure 13A:
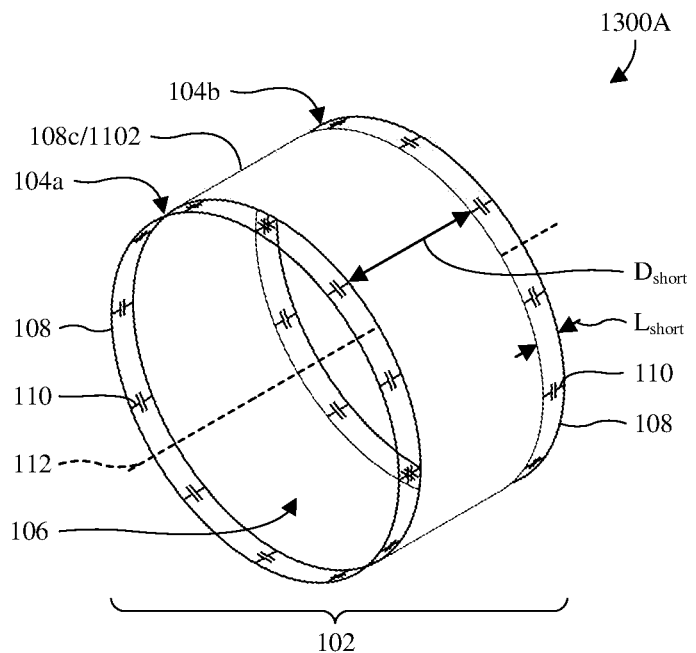
FIGS. 13A and 13B illustrate various views of some alternative embodiments of the gapped multi-birdcage MRI RF coil of FIG. 12A in which the RF shield defines end rings.
Figure 13B:
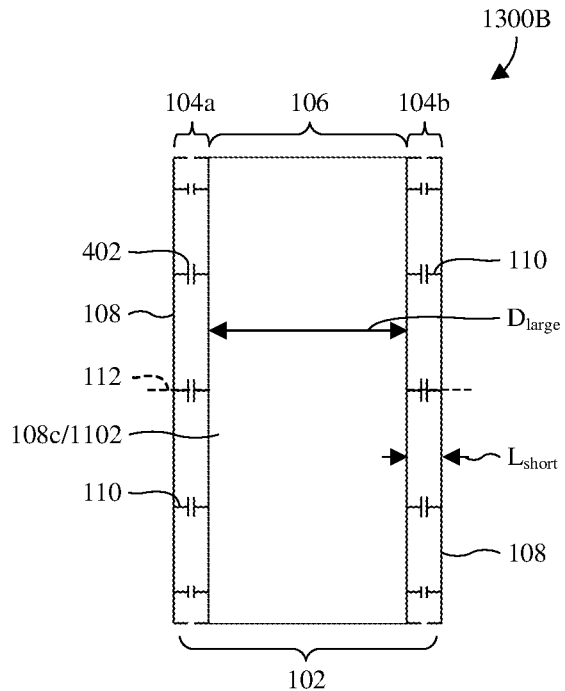

With reference to FIGS. 13A and 13B, various views 1300A, 1300B of some alternative embodiments of the gapped multi-birdcage MRI RF coil 102 of FIG. 12A are provided in which gaps separating the RF shield 1102 from the first and second birdcage coils 104a, 104b are removed. As a result, the RF shield 1102 defines an end ring 108c common to the first and second birdcage coils 104a, 104b. Further, mirror current from the end rings 108 to the RF shield 1102 is cancelled, thereby further improving power efficiency of the gapped multi-birdcage MRI RF coil 102. Note that it is not practical to remove the gaps when the first and second birdcage coils 104a, 104b are high pass or bandpass because of the capacitors 402 on the end rings 108.

Note that when the RF shield 1102 defines end rings, the RF shield 1102 provides more than just RF shielding. Because the first and second birdcage coils 104*a*, 104*b* are resonant coils, the first and second birdcage coils 104*a*, 104*b* create ring currents flowing respectively along adjoining edges of the RF shield 1102. As a result, the first and second birdcage coils 104*a*, 104*b* create RF potential distributions respectively along the edges of the RF shield 1102. The RF potential distributions along the edges are different and/or off-phase, and the RF shield 1102 is conductive, such that RF currents flow between the edges on the inner surface of the RF shield 1102. The pattern of the inner surface RF currents is similar to a birdcage current pattern, such that the RF shield 1102 may boost $B_1$ magnetic field uniformity compared to the first and second birdcage coils 104*a*, 104*b* without the RF shield 1102. This is a case of creating an RF current pattern on a piece of the RF shield 1102 by controlling RF potential at the boundary of the RF shield 1102. If the RF shield 1102 is made of material with a low conductivity (e.g., stainless steel mesh for gradient coil eddy current reduction) the high RF current area (rungs) of the RF shield 1102 may be replaced with a material having a high conductivity (e.g., copper).

Figure 14A:
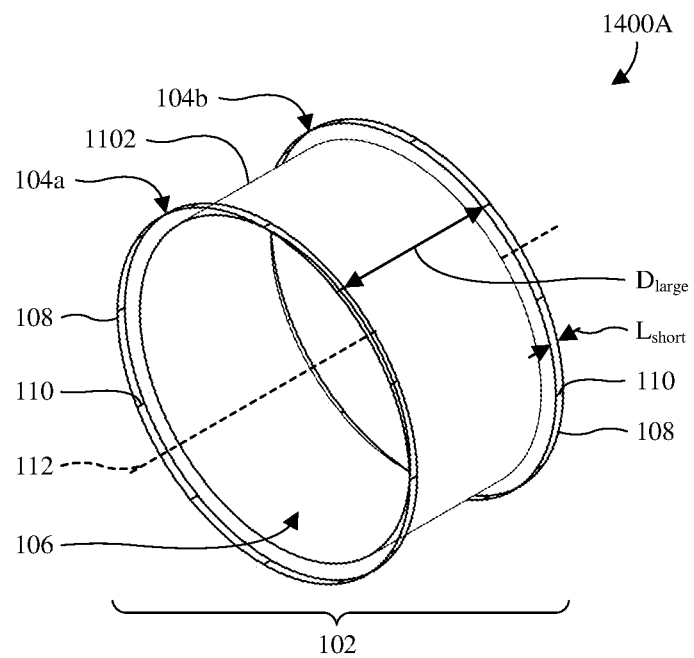
FIGS. 14A, 14B, 15A, and 15B illustrate various views of some alternative embodiments of the gapped multi-birdcage MRI RF coil of FIGS. 11A-11C in which the RF shield has a different diameter than birdcage coils.
Figure 14B:
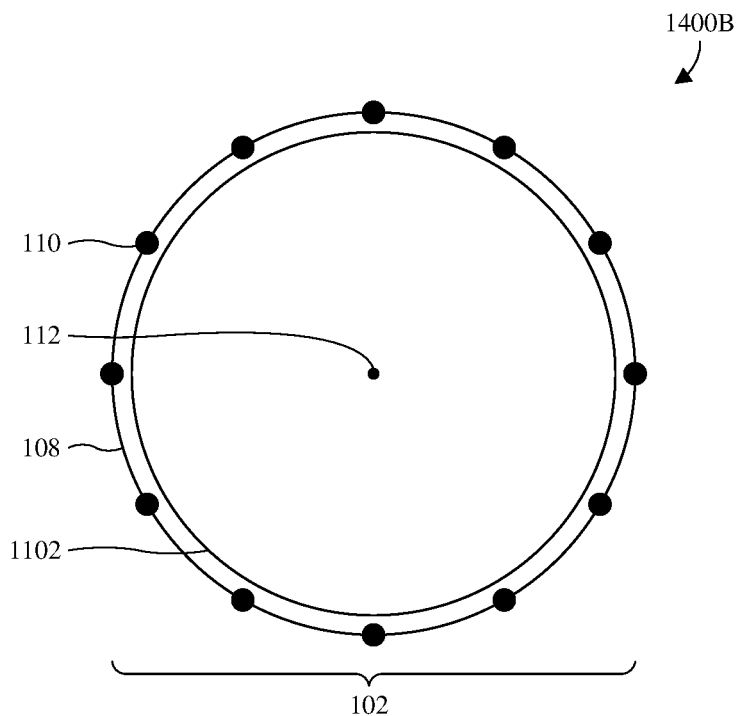
Figure 15A:
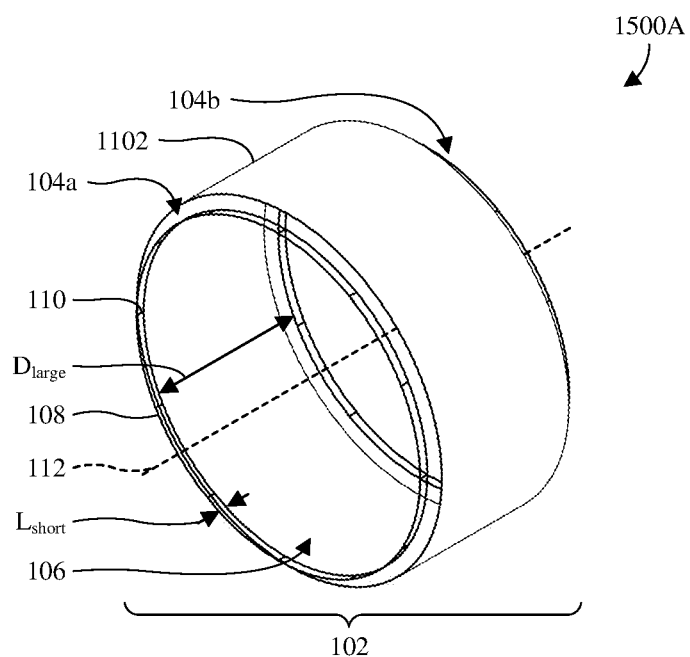
Figure 15B:
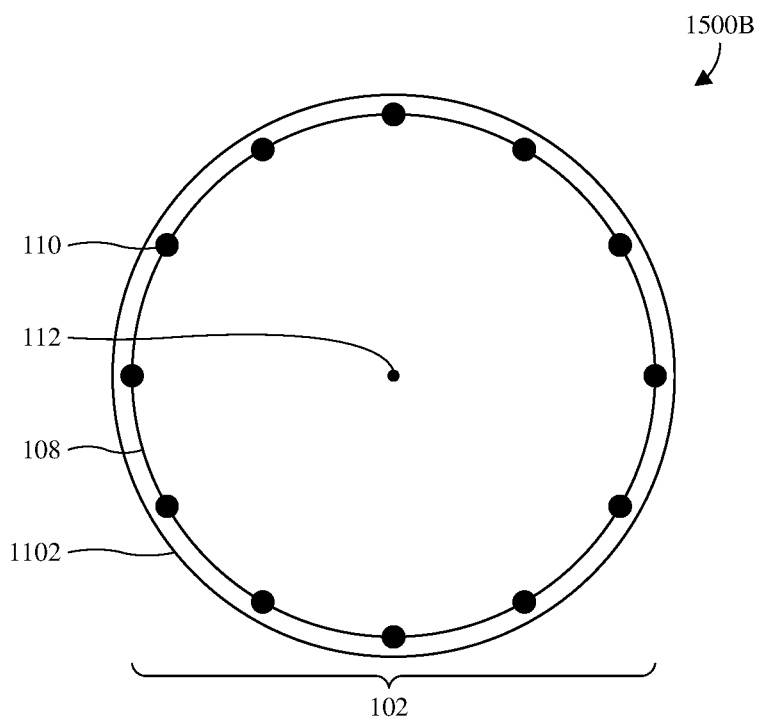

With reference to FIGS. 14A and 14B and FIGS. 15A and 15B, various views 1400A, 1400B, 1500A, 1500B of some alternative embodiments of the gapped multi-birdcage MRI RF coil 102 of FIGS. 11A-11C is provided in which the RF shield 1002 has a different diameter than the first and second birdcage coils 104*a*, 104*b*. FIGS. 14A and 15A illustrate perspective views 1400A, 1500A, and FIGS. 14B and 15B illustrate axial views 1400B, 1500B. In FIGS. 14A and 14B, the RF shield 1102 has a smaller diameter than the first and second birdcage coils 104*a*, 104*b*. In FIGS. 15A and 15B, the RF shield 1102 has a lager diameter than the first and second birdcage coils 104*a*, 104*b*. So long as the diameter of the RF shield 1102 is similar to diameters of the first and second birdcage coils 104*a*, 104*b*, power efficiency will be minimally impacted by the mismatch. By "similar" diameters, it is meant diameters that are within about 2 cm of each other.

Figure 16A:
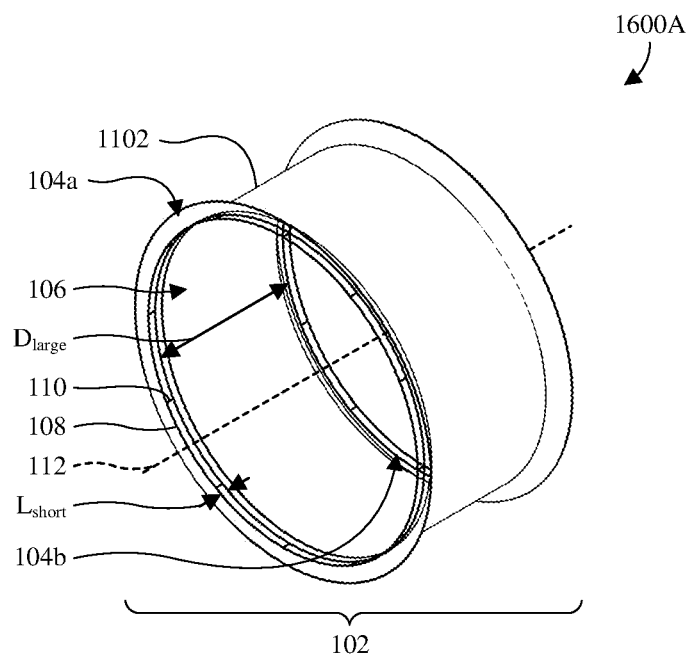
FIGS. 16A and 16B illustrate various views of some alternative embodiments of the gapped multi-birdcage MRI RF coil of FIGS. 11A-11C in which the RF shield flares at ends.
Figure 16B:
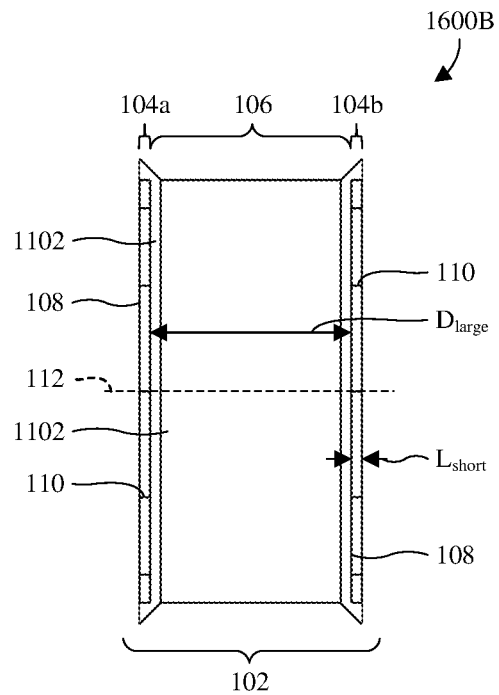

With reference to FIGS. 16A and 16B, various views 1600A, 1600B of some alternative embodiments of the gapped multi-birdcage MRI RF coil 102 of FIGS. 11A-11C are provided in which the RF shield 1102 flares at, and surrounds, the first and second birdcage coils 104*a*, 104*b* so as to provide enhanced RF shielding. FIG. 16A provides a perspective view 1600A, whereas FIG. 16B provides a cross-sectional view 1600B along the principal axis 112.

Figure 17A:
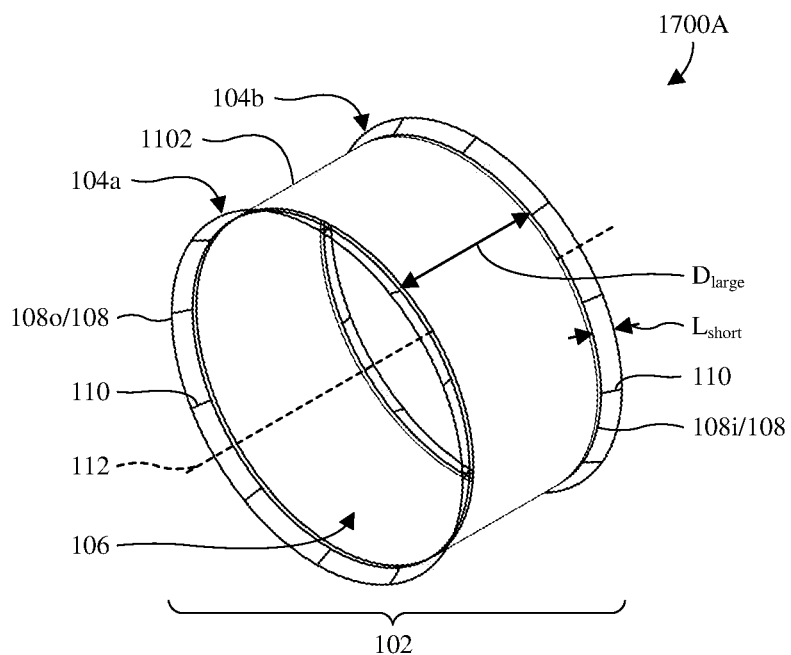
FIGS. 17A and 17B illustrate various views of some alternative embodiments of the gapped multi-birdcage MRI RF coil of FIGS. 11A-11C in which birdcage coils flare at ends.
Figure 17B:
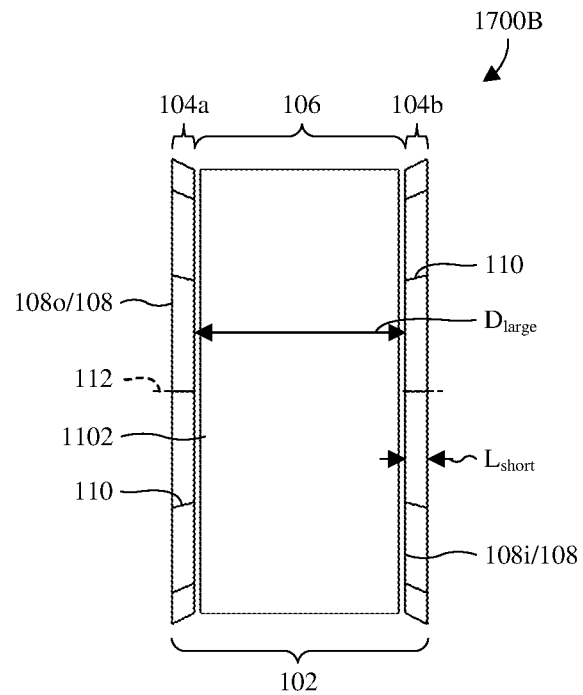

With reference to FIGS. 17A and 17B, various views 1700A, 1700B of some alternative embodiments of the gapped multi-birdcage MRI RF coil 102 of FIGS. 11A-11C are provided in which the first and second birdcage coils 104*a*, 104*b* flare at ends. FIG. 17A provides a perspective view 1700A, whereas FIG. 17B provides a side view 1700B. As a result of the flaring, outer end rings 108*o* of the first and second birdcage coils 104*a*, 104*b* have larger diameters than inner end rings 108*i* of the first and second birdcage coils 104*a*, 104*b*. Further, at least when the gapped multi-birdcage MRI RF coil 102 is employed as an WBC, a bore of the MR scanner may be larger at ends. This may, for example, enhance patient comfort. In alternative embodiments, the outer end rings 108*o* have smaller diameters than the inner end rings 108*i*.

Figure 18A:
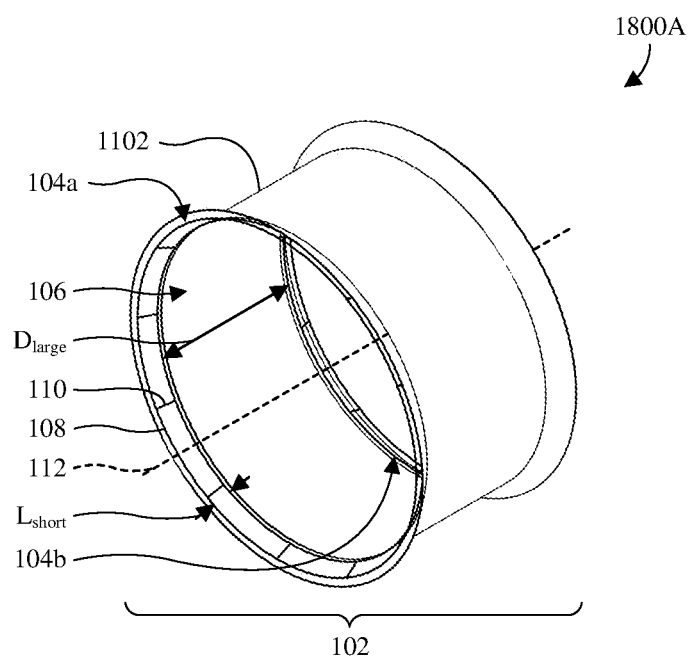
FIGS. 18A and 18B illustrate various views of some alternative embodiments of the gapped multi-birdcage MRI RF coil of FIGS. 11A-11C in which birdcage coils and the RF shield flare at ends.
Figure 18B:
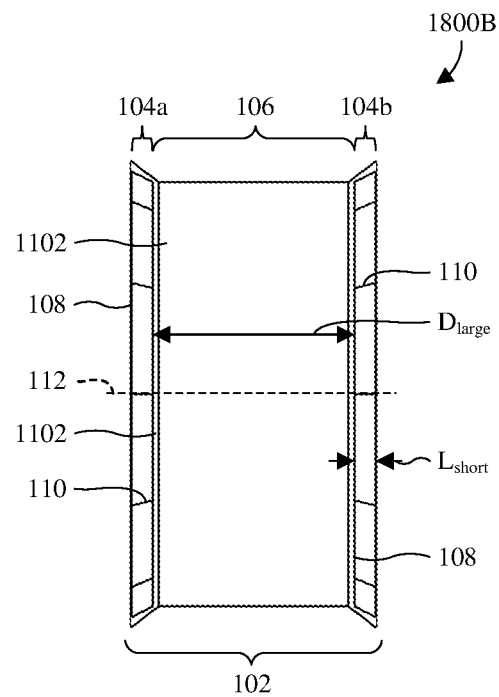

With reference to FIGS. 18A and 18B, various views 1800A, 1800B of some alternative embodiments of the gapped multi-birdcage MRI RF coil 102 of FIGS. 11A-11C are provided in which the RF shield 1102 and the first and second birdcage coils 104*a*, 104*b* flare at ends. Further, the RF shield 1102 surrounds the first and second birdcage coils 104*a*, 104*b* where it flares. FIG. 18A provides a perspective view 1800A, and FIG. 18B provides a cross-sectional view 1800B along the principal axis 112.

Figure 19A:
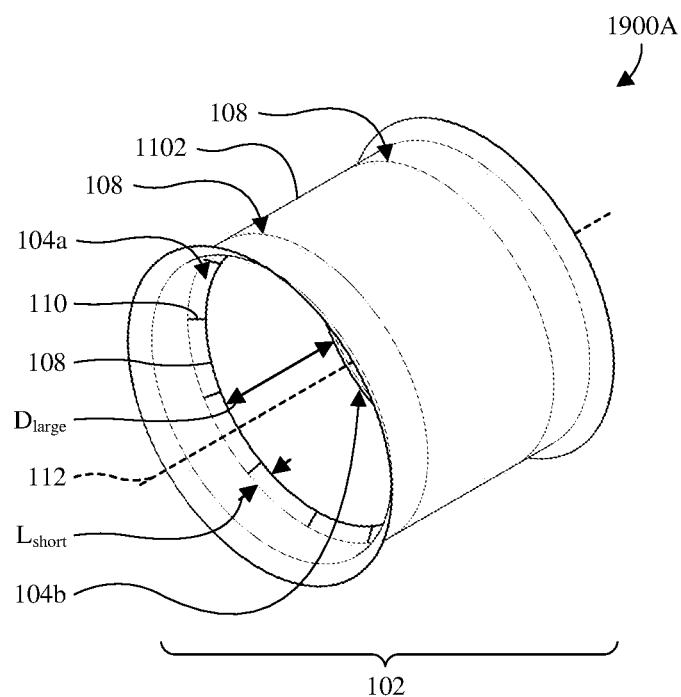
FIGS. 19A and 19B illustrate various views of some alternative embodiments of the gapped multi-birdcage MRI RF coil of FIGS. 11A-11C in which the RF shield flares at ends, extends beyond birdcage coils, and defines end rings of the birdcage coils.
Figure 19B:
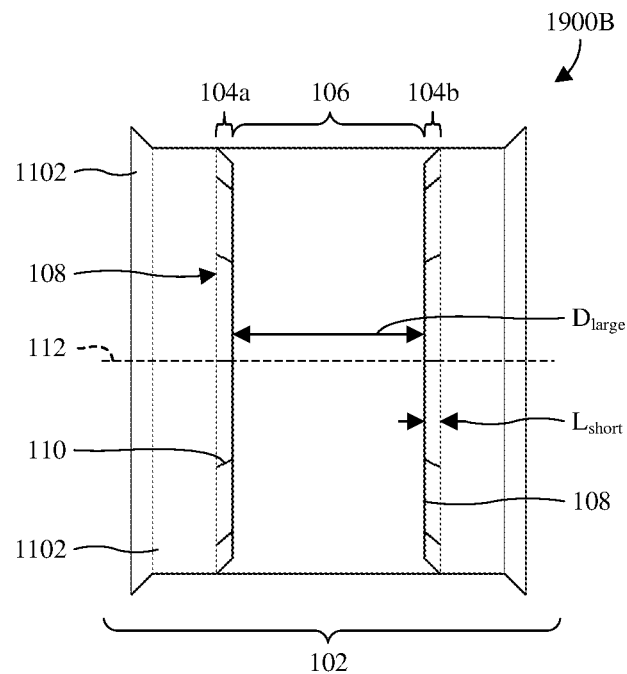

With reference to FIGS. 19A and 19B, various views 1900A, 1900B of some alternative embodiments of the gapped multi-birdcage MRI RF coil 102 of FIGS. 11A-11C are provided in which the RF shield 1102 flares at ends and extends beyond the first and second birdcage coils 104*a*, 104*b* along the principal axis 112. Further, the RF shield 1102 defines one end ring 108 of the first birdcage coil 104*a* and one end ring of the second birdcage coil 104*b*. Note that outlines of these end rings are shown on the RF shield 1102 for clarity but practically are not visible. Further, note that because the RF shield 1102 defines end rings of the first and second birdcage coils 104*a*, 104*b*, the first and second birdcage coils 104*a*, 104*b* are low pass (not shown in detail; see, for example, FIG. 4A). As described with regard to FIGS. 13A and 13B, because the RF shield 1102 defines end rings of the first and second birdcage coils 104*a*, 104*b*, $B_1$ magnetic field uniformity may be improved. FIG. 19A provides a perspective view 1900A, whereas FIG. 19B provides a cross-sectional view 1900B along the principal axis 112.

Figure 20A:
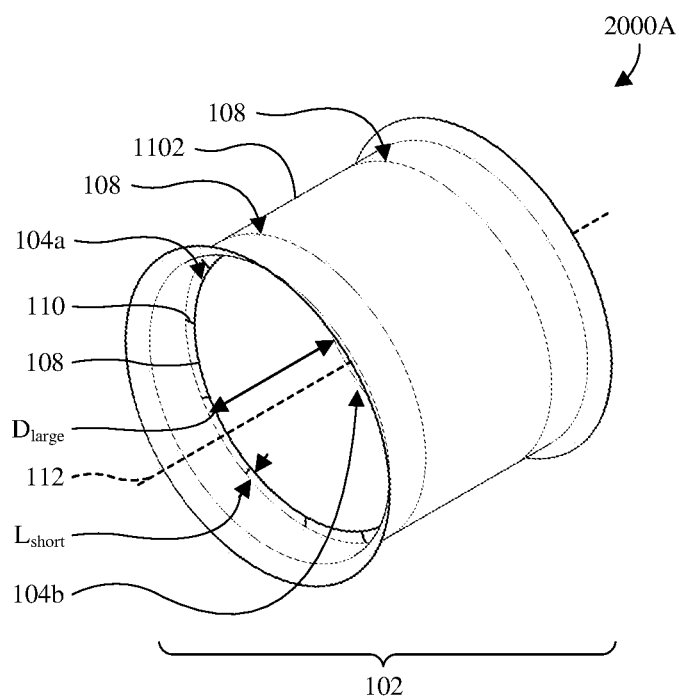
FIGS. 20A and 20B illustrate various views of some alternative embodiments of the gapped multi-birdcage MRI RF coil of FIGS. 19A and 19B in which end rings of a birdcage coil are at a common location along an axis.
Figure 20B:
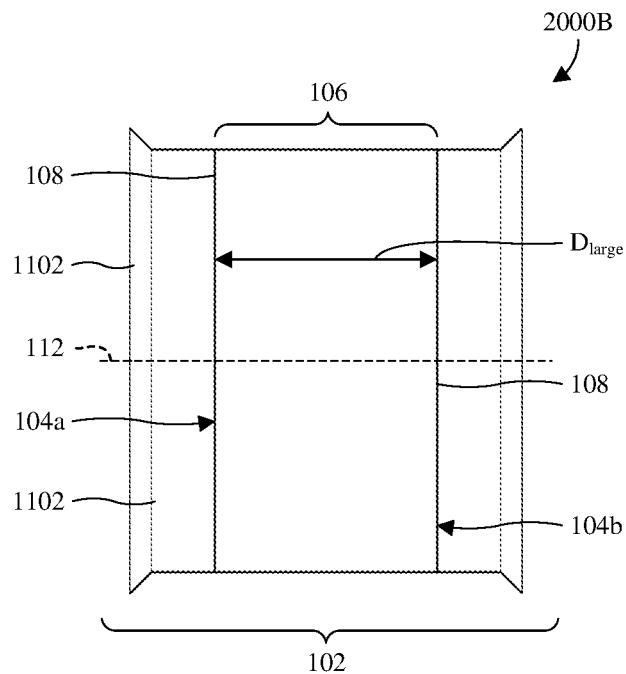

With reference to FIGS. 20A and 20B, various views 2000A, 2000B of some alternative embodiments of the gapped multi-birdcage MRI RF coil 102 of FIGS. 19A and 19B are provided in which the end rings 108 of the first birdcage coil 104*a* are at a common location along the principal axis 112. Further, the end rings 1098 of the second birdcage coil 104*b* are at a common location along the principal axis 112.

Figure 21A:
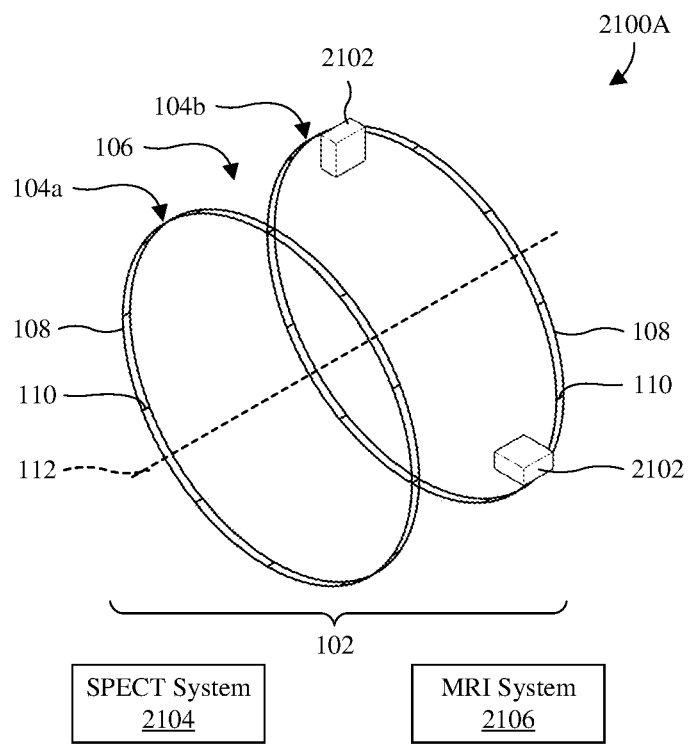
FIGS. 21A, 21B, 22A, 22B, 23A, and 23B, illustrate some alternative embodiments of the gapped multi-birdcage MRI RF coil of FIGS. 1A-1D in which the gapped multi-birdcage MRI RF coil is accompanied by detectors for another imaging modality.
Figure 21B:
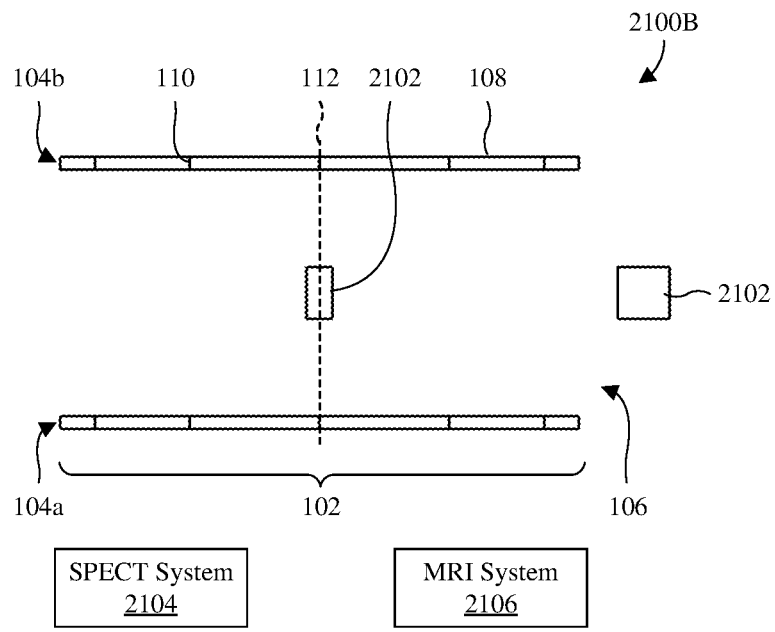

With reference to FIGS. 21A and 21B, various views 2100A, 2100B of some alternative embodiments of the gapped multi-birdcage MRI RF coil 102 of FIGS. 1A-1D are provided in which the gapped multi-birdcage MRI RF coil 102 is accompanied by a pair of gamma detectors 2102. FIG. 21A provides a perspective view 2100A, and FIG. 21B provides a top view 2100B. The gamma detectors 2102 are in the gap 106 and are angularly separated by 90 degrees about the principal axis 112. In alternative embodiments, the gamma detectors 2102 face each other respectively on opposite sides of the principal axis 112. The gamma detectors 2102 are employed by a single-photon emission computed tomography (SPECT) system 2104 for SPECT, and the gapped multi-birdcage MRI RF coil 102 is employed by an MRI system 2106 for MRI. Note that the SPECT system 2104 and the MRI system 2106 are not shown electrically coupled respectively to the gamma detectors 2102 and the gapped multi-birdcage MRI RF coil 102 for ease of illustration.

Figure 22A:
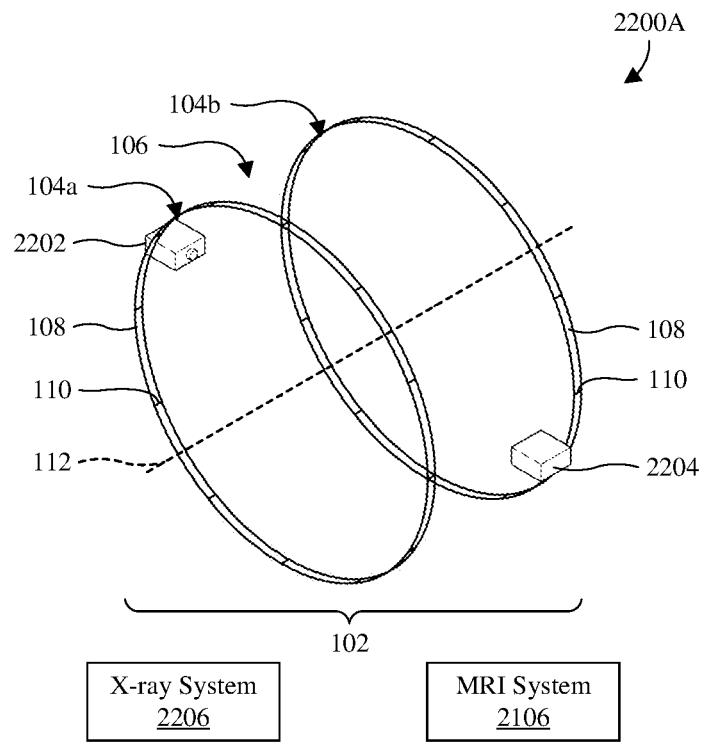
Figure 22B:
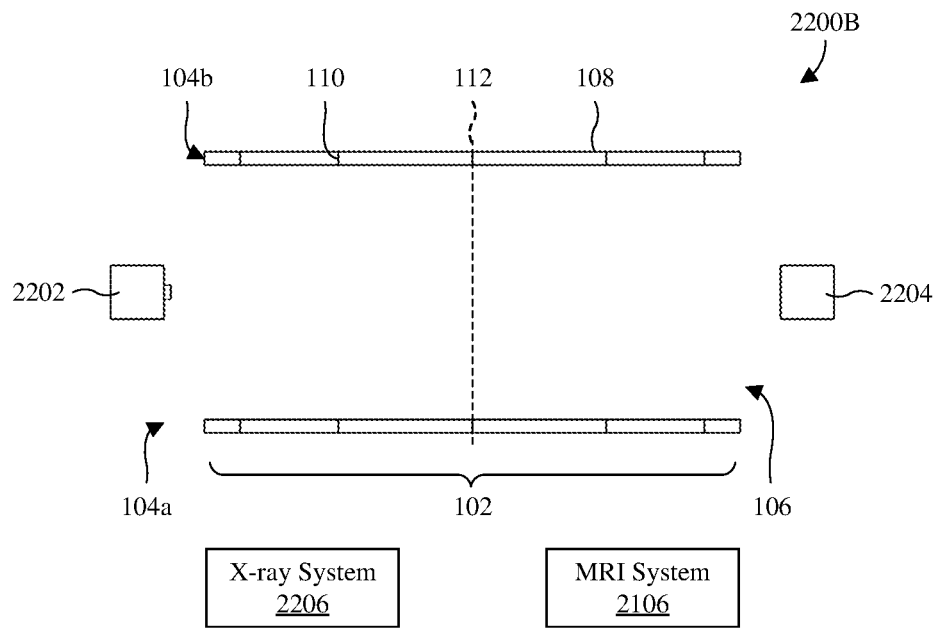

With reference to FIGS. 22A and 22B, various views 2200A, 2200B of some alternative embodiments of the gapped multi-birdcage MRI RF coil 102 of FIGS. 1A-1D are provided in which the gapped multi-birdcage MRI RF coil 102 is accompanied by an x-ray source 2202 and an x-ray detector 2204. FIG. 22A provides a perspective view 2200A, and FIG. 22B provides a top view 2200B. The x-ray source 2202 and the x-ray detector 2204 are in the gap 106 and face each other respectively on opposite sides of the principal axis 112. The x-ray source 2202 and the x-ray detector 2204 are employed by an x-ray system 2206 for X-ray imaging, and the gapped multi-birdcage MRI RF coil 102 is employed by an MRI system 2106 for MRI. Note that the x-ray system 2206 and the MRI system 2106 are not shown electrically coupled respectively to the x-ray source 2202, the x-ray detector 2204, and the gapped multi-birdcage MRI RF coil 102 for ease of illustration.

Figure 23A:
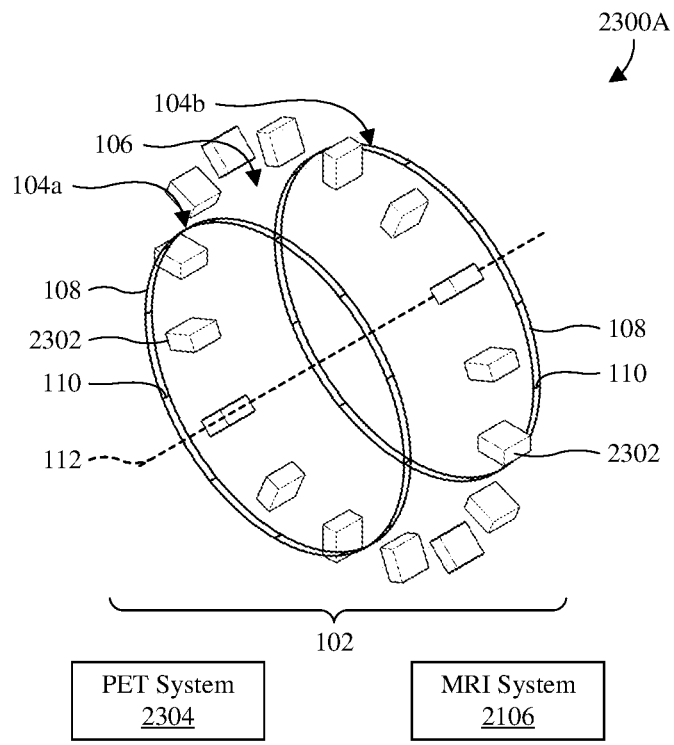
Figure 23B:
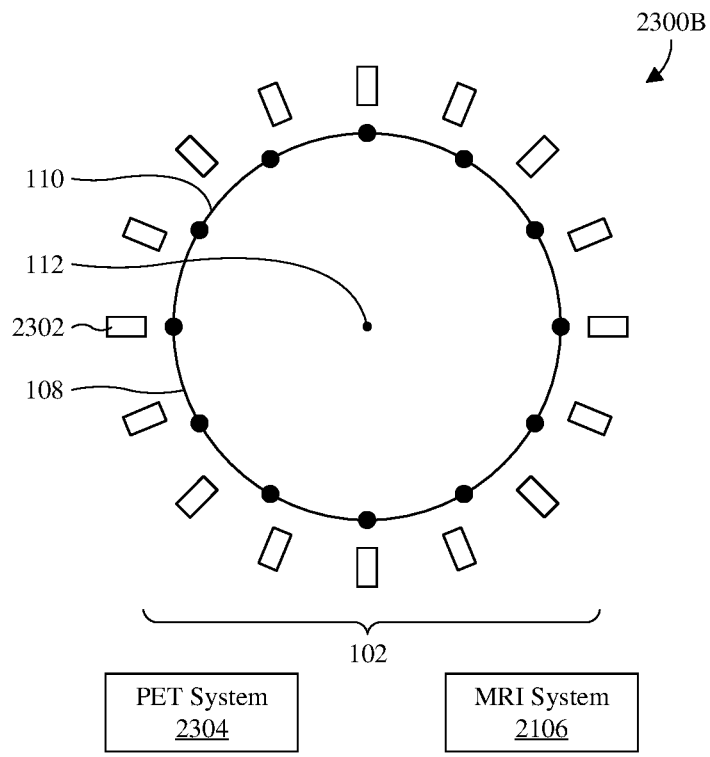

With reference to FIGS. 23A and 23B, various views 2300A, 2300B of some alternative embodiments of the gapped multi-birdcage MRI RF coil 102 of FIGS. 1A-1D are provided in which the gapped multi-birdcage MRI RF coil 102 is accompanied by a plurality of positron emission tomography (PET) detectors 2302. FIG. 23A provides a perspective view 2300A, and FIG. 23B provides an axial view 2300B. The PET detectors 2302 are in the gap 106 and are circumferentially arranged around the principal axis 112. The PET detectors 2302 are employed by a PET system 2304 for PET, and the gapped multi-birdcage MRI RF coil 102 is employed by an MRI system 2106 for MRI. Note that the PET system 2304 and the MRI system 2106 are not shown electrically coupled respectively to the PET detectors 2302 and the gapped multi-birdcage MRI RF coil 102 for ease of illustration.

As illustrated in FIGS. 21A and 21B to FIGS. 23A and 23B, the gapped multi-birdcage MRI RF coil 102 has multi-modality applicability, such that other imaging modalities may be used with MRI. At least imaging modalities using gamma detectors (see, e.g., FIGS. 21A and 21B), x-ray detectors (see, e.g., FIGS. 22A and 22B), and PET detectors (see, e.g., FIGS. 23A and 23B) depend upon a center imaging area having high uniformity with little to no attenuation. Hence, at least these imaging modalities depend upon the center imaging area being free of electronics (e.g., capacitors) and/or metal traces (e.g., copper traces). Because the gapped multi-birdcage MRI RF coil 102 has the gap 106 separating the first and second birdcage coils 104a, 104b, there are no electronics and/or metal traces at the center imaging area and the center imaging area is uniform with little to no attenuation. Hence, the gapped multi-birdcage MRI RF coil 102 is intrinsically good for the multi-modality applications. Further, to the extent that the gapped multi-birdcage MRI RF coil 102 comprises the RF shield 1102 (see, e.g., FIGS. 11A-11C) (e.g., for an improved $B_1$ magnetic field uniformity and/or RF shielding), the RF shield 1102 may use a uniform and low attenuation material. For example, the RF shield 1102 may be or comprise a stainless-steel mesh, 0.5 ounce slit copper sheeting, or some other suitable material.

While FIGS. 21A and 21B to FIGS. 23A and 23B illustrate MRI with SPECT, PET, and x-ray imaging, it is to be appreciated that other suitable types of imaging modalities may be used in place of SPECT, PET, and x-ray imaging in alternative embodiments. Further, while FIGS. 21A and 21B to FIGS. 23A and 23B focus on combining MRI with other types of imaging modalities (e.g., SPECT, PET, etc.), these other types of imaging modalities may be replaced with other types of treatment and/or diagnostic tools in alternative embodiments.

Figure 24A:
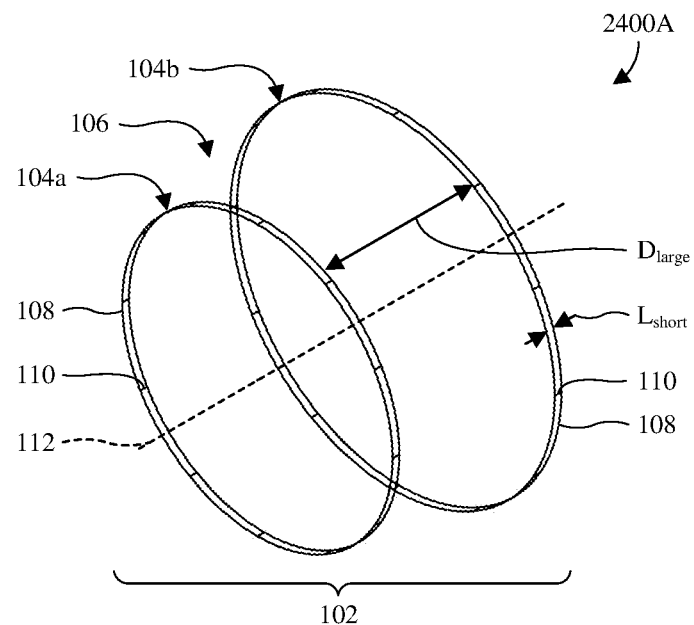
FIGS. 24A-24C illustrate some alternative embodiments of the gapped multi-birdcage MRI RF coil of FIGS. 1A-1D having a cone shape.
Figure 24B:
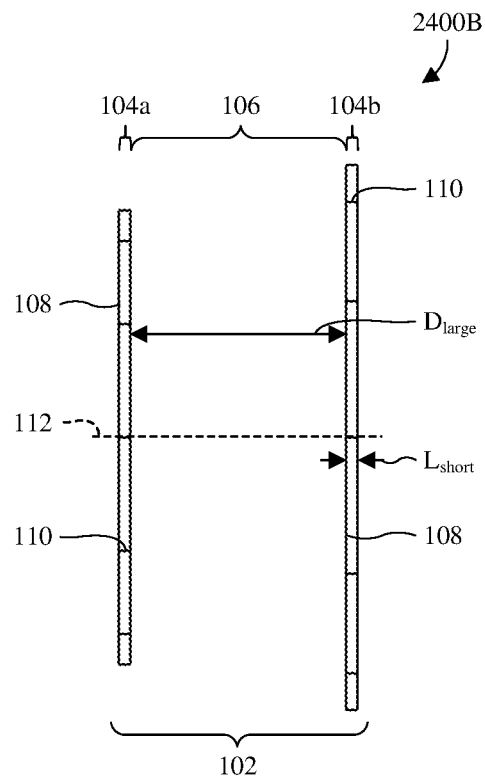
Figure 24C:
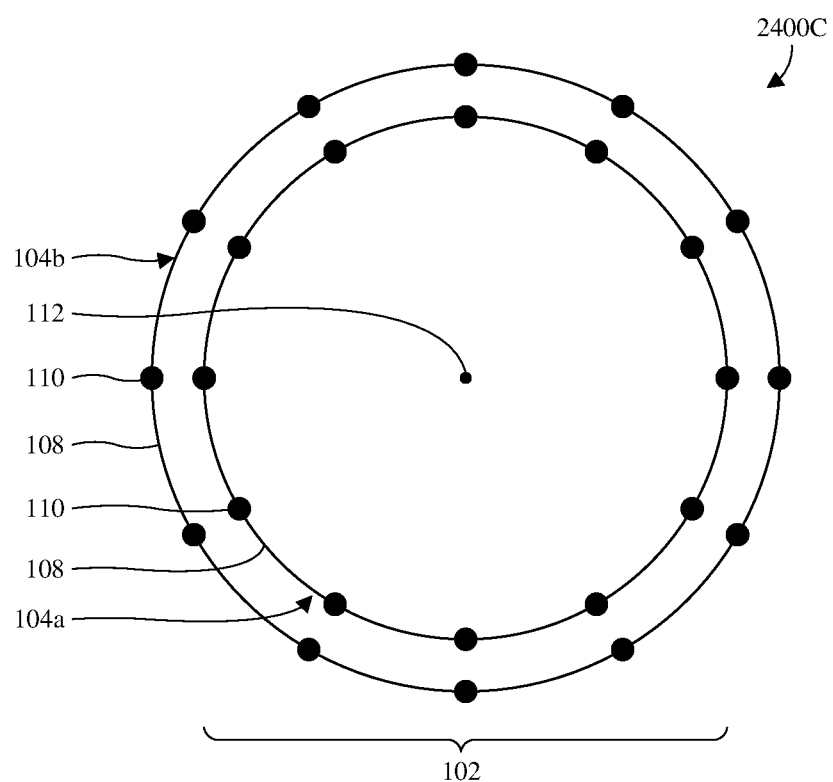

With reference to FIGS. 24A-24C, various views 2400A-2400C of some alternative embodiments of the gapped multi-birdcage MRI RF coil 102 of FIGS. 1A-1D is provided in which the gapped multi-birdcage MRI RF coil 102 has a cone shape. FIG. 24A provides a perspective view 2400A, FIG. 24B provides a side view 2400B, and FIG. 24C provides an axial view 2400C. Because of the cone shape, the end rings 108 of the first birdcage coil 104a have a smaller diameter than the end rings 108 of the second birdcage coil 104b. In alternative embodiments, the opposite is true. Namely, the end rings 108 of the first birdcage coil 104a have a larger diameter than the end rings 108 of the second birdcage coil 104b. Further, in alternative embodiments, the gapped multi-birdcage MRI RF coil 102 has a dome shape.

Because a diameter of the first birdcage coil 104a is smaller than the second birdcage coil 104b, the $B_1$ magnetic field from the first birdcage coil 104a is stronger than the second birdcage coil 104b along the principal axis 112 if the first and second birdcage coils 104a, 104b both have the same current flow. Therefore, to optimize the $B_1$ sensitivity along the principal axis 112, the current ratio between the first and second birdcage coils 104a, 104b may be adjusted.

Figure 25:
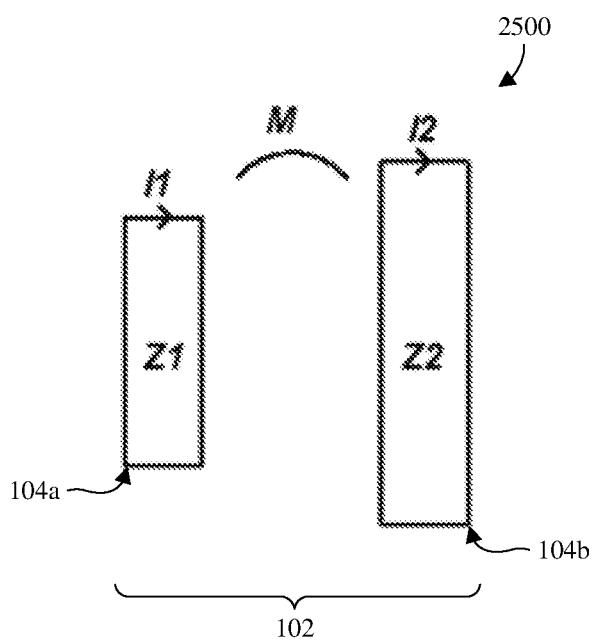
FIG. 25 illustrate a circuit diagram of some embodiments of the gapped multi-birdcage MRI RF coil of FIGS. 24A-24C.

Referring to FIG. 25, a circuit diagram 2500 of some embodiments of the gapped multi-birdcage MRI RF coil 102 of FIGS. 24A-24C is provided. Z1 is defined as the equivalent impedance of the first birdcage coil 104a, Z2 is defined as the equivalent impedance of the second birdcage coil 104b, I1 is current in the first birdcage coil 104a, I2 is the current in the second birdcage coil 104b, and M is the mutual inductance between the first and second birdcage coils 104a, 104b. For a simple loop coil, Z can be considered as $j\omega L - j(1/\omega c) + R$, where L is coil inductance, c is coil capacitance, and R is coil loss. For birdcage coils, Z is more complicated but is generally the same as the simple loop coil. Therefore, the first and second birdcage coils 104a, 104b are hereafter analyzed as simple loop coils for simplicity.

Analyzing the first and second birdcage coils 104a, 104b using Kirchhoff's law and the Z equation for simple loop coils yields the following.

$$\begin{cases} I_1 Z_1 + j\omega M I_2 = 0 \\ I_2 Z_2 + j\omega M I_1 = 0 \end{cases} \qquad \text{Eq. 5}$$

Eq. 5 may be then simplified as follows:

$$\left(\frac{I_1}{I_2}\right)^2 = \frac{Z_2}{Z_1}. \qquad \text{Eq. 6}$$

Eq. 6 indicates that the current ratio between the first and second birdcage coils 104a, 104b may be adjusted by adjusting impedances of the first and second birdcage coils at the system working frequency (e.g., the Larmor frequency). In other words, the current ratio may be adjusted by adjusting the tuning the tuning frequencies of the first and second birdcage coils 104a, 104b. As a result, the first and second birdcage coils 104a, 104b may have different tuning frequencies. Different tuning frequencies are amenable because, as described above, the first and second birdcage coils 104a, 104b are coupled together, which creates a new uniform mode frequency that is used for driving the gapped multi-birdcage MRI RF coil 102.

While FIGS. 24A-24C illustrate the end rings 108 of the first birdcage coil 104a as having the same diameter, the end rings 108 of the first birdcage coil 104a may have different diameters. See, for example, FIGS. 8A and 8B. Similarly, while FIGS. 24A-24C illustrate the end rings 108 of the second birdcage coil 104b as having the same diameter, the end rings 108 of the second birdcage coil 104b may have different diameters. See, for example, FIGS. 8A and 8B. While FIGS. 24A-24C illustrate the end rings 108 as being centered on the principal axis 112 (e.g., concentric), one or both of the end rings 108 of the first birdcage coil 104a may be offset from the principal axis 112 and/or one or both of the end rings 108 of the second birdcage coil 104*b* may be offset from the principal axis 112. See, for example, FIGS. 9A and 9B and FIGS. 10A and 10B.

MRI encompasses imaging using not only hydrogen nuclei (e.g., proton signals), but also signals from other nuclei. These other nuclei may also be known as x-nuclei and may include, for example, sodium, phosphorus, chlorine, sodium, fluorine, and so on. Therefore, the gapped multi-birdcage MRI RF coil 102 may be multi-tuned in alternative embodiments. For example, the gapped multi-birdcage MRI RF coil 102 may be double or triple tuned.

Figure 26:
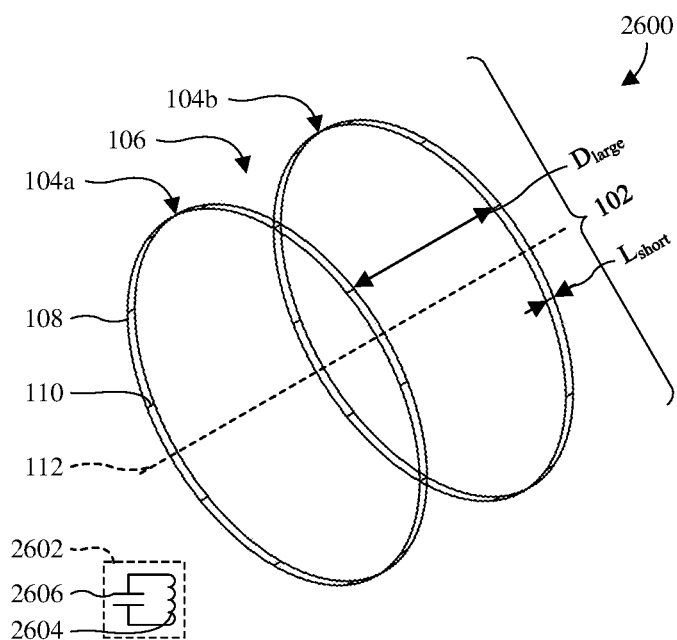
FIGS. 26, 27A, 27B, 28A, and 28B illustrate various views of some alternative embodiments of the gapped multi-birdcage MRI RF coil of FIGS. 1A-1D having double tuning.

With reference to FIG. 26, a perspective view 2600 of some alternative embodiments of the gapped multi-birdcage MRI RF coil 102 of FIGS. 1A-1D is provided in which the gapped multi-birdcage MRI RF coil 102 comprises a tank circuit 2602 for double tuning. The tank circuit 2602 is electrically coupled in series with a corresponding capacitor (not shown; see, e.g., 402 in FIGS. 4A-4C) of the first and second birdcage coils 104*a*, 104*b*. Because capacitor locations of the first and second birdcage coils 104*a*, 104*b* vary depending upon whether the first and second birdcage coils 104*a*, 104*b* are low pass, high pass, or bandpass, and because capacitors of the first and second birdcage coils 104*a*, 104*b* are not shown, the tank circuit 2602 is not shown electrically coupled to the gapped multi-birdcage MRI RF coil 102. The tank circuit 2602 comprises an inductor 2604 and a capacitor 2606 electrically coupled in parallel.

To understand operation of the tank circuit 2602, assume an equivalent circuit of the first birdcage coil 104*a* comprises a capacitor C1 and an inductor L1. L1 is fixed. If the value of capacitor C1 is changed, the resonant frequency of the first birdcage coil 104*a* changes. Assume the capacitor 2606 of the tank circuit 2602 is C2 and the inductor 2604 of the tank circuit 2602 is L2. Also assume L2 and C2 resonate at the same frequency as the first birdcage coil 104*a*. This last assumption is just for ease of explanation but is not necessary. So now C1 is in series with C2//L2 (e.g., the tank circuit 2602). At the original resonant frequency, C2//L2 creates a high impedance. As such, C1+C2//L2 is high impedance and there is no resonance. Considering a lower frequency than the original resonant frequency, C2//L2 is inductive. As such, C1+C2//L2 is a larger capacitor at the lower frequency and there will be a new resonant frequency lower than the original resonant frequency. Considering a higher frequency than the original resonant frequency, C2//L2 is capacitive. As such C1+C2//L2 is a smaller capacitor at the higher frequency and there will be a new resonant frequency higher than the original resonant frequency. In summary, the tank circuit 2602 will split the original resonant frequency into two new resonant frequencies.

Because the original resonant frequency is split into two new resonant frequencies, the two new resonant frequencies may be used for different nuclei (e.g., hydrogen nuclei and x-nuclei) by appropriately selecting capacitors of the first and second birdcage coils 104*a*, 104*b*, the capacitor 2606 of the tank circuit 2602, and the inductor 2604 of the tank circuit 2602. Further, because a birdcage coil has many capacitors, the tank circuit 2602 may be repeated in series with one or more additional capacitors of the first and second birdcage coils 104*a*, 104*b*.

Figure 27A:
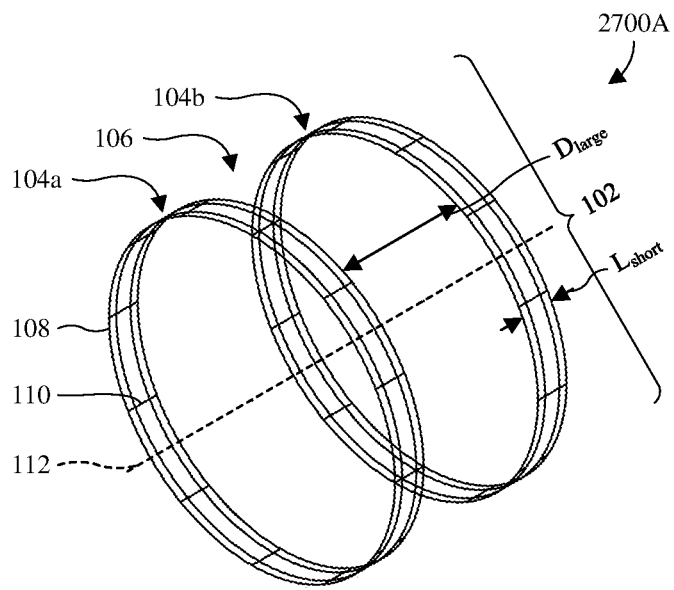
Figure 27B:
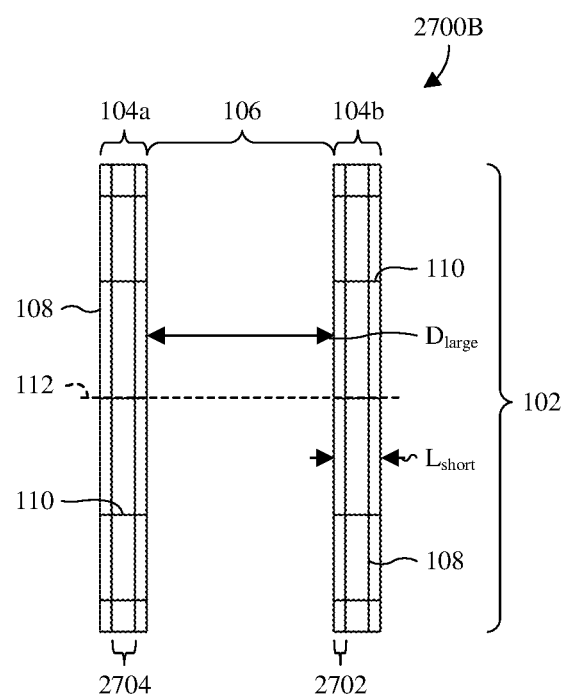

With reference to FIGS. 27A and 27B, various views 2700A, 2700B of some alternative embodiments of the gapped multi-birdcage MRI RF coil 102 of FIGS. 1A-1D is provided in which the first and second birdcage coils 104*a*, 104*b* are four-rung birdcage coils for double tuning. FIG. 27A provides a perspective view 2700A, whereas FIG. 27B provides a side view 2700B. Because the first and second birdcage coils 104*a*, 104*b* are four-rung birdcage coils, the first and second birdcage coils 104*a*, 104*b* each comprise four end rings 108 interconnected by the rungs 110. As a result, the first and second birdcage coils 104*a*, 104*b* may each be thought of as three separate birdcage coils: two outer birdcage coils 2702; and an inner birdcage coil 2704. Note that the outer and inner birdcage coils 2702, 2704 are only labeled in FIG. 27B for ease and clarity. The outer and inner birdcage coils 2702, 2704 are tuned so the inner birdcage coils 2704 have a resonant frequency corresponding to first nuclei (e.g., x-nuclei) and the outer birdcage coils 2702 have resonant frequencies corresponding second nuclei (e.g., hydrogen nuclei).

Figure 28A:
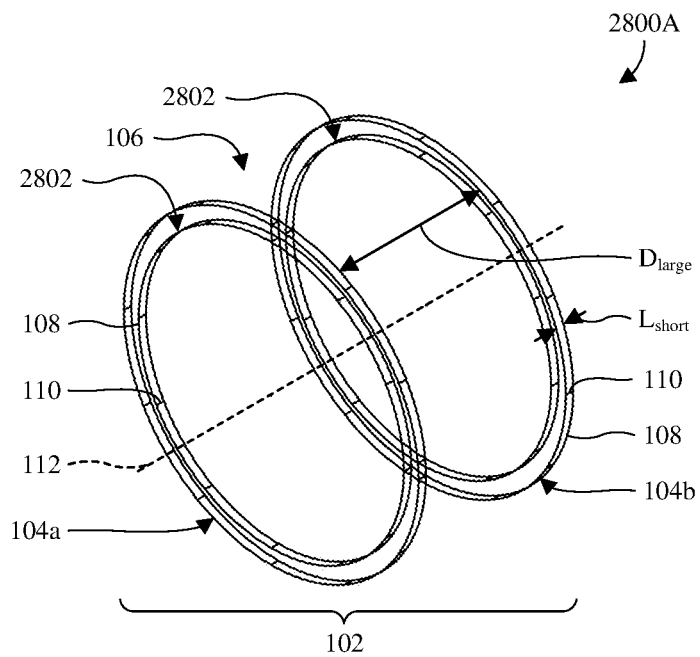
Figure 28B:
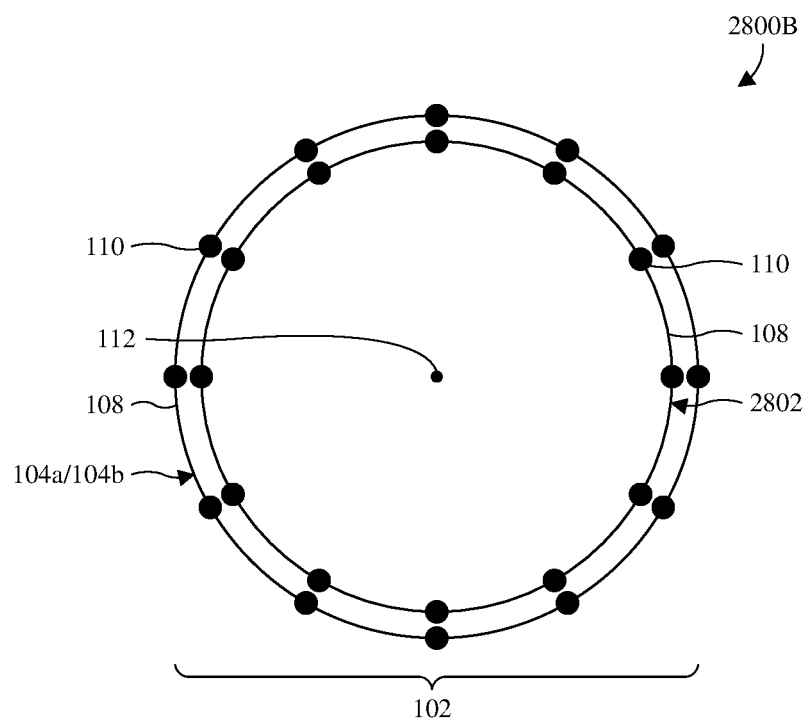

With reference to FIGS. 28A and 28B, various views 2800A, 2800B of some alternative embodiments of the gapped multi-birdcage MRI RF coil 102 of FIGS. 1A-1D is provided in which the gapped multi-birdcage MRI RF coil 102 further comprises nested birdcage coils 2802. FIG. 28A provides a perspective view 2800A, whereas FIG. 28B provides an axial view 2800B. The nested birdcage coils 2802 are individual to and respectively nested in the first and second birdcage coils 104*a*, 104*b*. The nested birdcage coils 2802 are nested in that they are concentric with and respectively surrounded by the first and second birdcage coils 104*a*, 104*b*. Further, like the first and second birdcage coils 104*a*, 104*b*, the nested birdcage coils 2802 are short-length birdcage coils (e.g., have individual lengths along the principal axis 112 that are less than a separation along the principal axis 112). In some embodiments, the nested birdcage coils 2802 are respectively as the first and second birdcage coils 104*a*, 104*b* are described. The first and second birdcage coils 104*a*, 104*b* together with the nested birdcage coils 2802 are tuned so the nested birdcage coils 2802 have a resonant frequency corresponding to first nuclei (e.g., hydrogen nuclei) and the first and second birdcage coils 104*a*, 104*b* have a resonant frequency corresponding to second nuclei (e.g., x-nuclei).

While FIGS. 26, 27A, 27B, 28A, and 28B are focused on the gapped multi-birdcage MRI RF coil 102 being double tuned, it is to be appreciated that the gapped multi-birdcage MRI RF coil 102 may be triple tuned. For example, the gapped multi-birdcage MRI RF coil 102 of FIG. 26 may have another trap circuit with a different resonant frequency than the tank circuit 2602. As another example, the first and second birdcage coils 104*a*, 104*b* of FIGS. 27A and 27B may instead be six-ring birdcage coils. As another example, the gapped multi-birdcage MRI RF coil 102 of FIGS. 28A and 28B may have another level of nested birdcage coils. As another example, the gapped multi-birdcage MRI RF coil 102 of FIGS. 27A and 27B or FIGS. 28A and 28B may be combined with the tank circuit 2602 of FIG. 26.

While FIGS. 2, 5-7, 8A and 8B to 10A and 10B, 24A-24C, 26, 27A, 27B, 28A, and 28B describe numerous variations to the gapped multi-birdcage MRI RF coil 102 of FIGS. 1A-1D, any one or combination of these variations are applicable to the gapped multi-birdcage MRI RF coil 102 in any of FIGS. 11A-11C, 12A-12C, and 14A and 14B to 23A and 23B. While FIGS. 11A-11C describe the gapped multi-birdcage MRI RF coil 102 of FIGS. 1A-1D with the RF shield 1102, the RF shield 1102 is applicable to the gapped multi-birdcage MRI RF coil 102 in any of FIGS. 2, 5-7, 8A and 8B to 10A and 10B, 21A and 21B to 23A and 23B, 24A-24C, 26, 27A, 27B, 28A, and 28B.

Thus far, the present disclosure has focused on embodiments of the gapped multi-birdcage MRI RF coil 102 having two birdcage coils. However, it is to be appreciated that the gapped multi-birdcage MRI RF coil 102 may have more than two birdcage coils in alternative embodiments. For example, the gapped multi-birdcage MRI RF coil 102 may have three birdcage coils, four birdcage coils, or more birdcage coils. In embodiments in which the gapped multi-birdcage MRI RF coil 102 has more than two birdcage coils, the birdcage coils are spaced along the principal axis 112. Further, the birdcage coils in each neighboring pair of birdcage coils are as the first and second birdcage coils 104a, 104b are described above (e.g., in FIGS. 1A-1D).

Figure 29A:
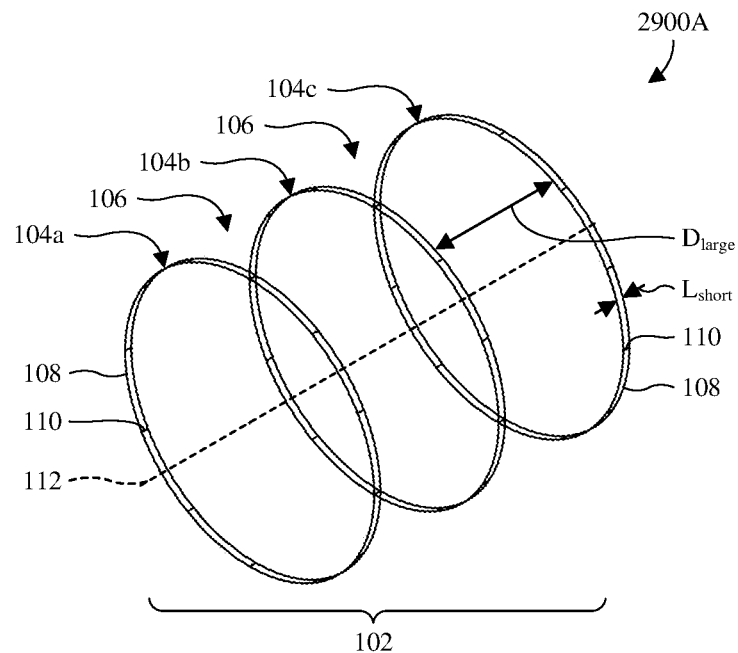
FIGS. 29A, 29B, 30A, and 30B illustrate various views of some alternative embodiments of the gapped multi-birdcage MRI RF coil of FIGS. 1A-1D comprising an additional birdcage coil.
Figure 29B:
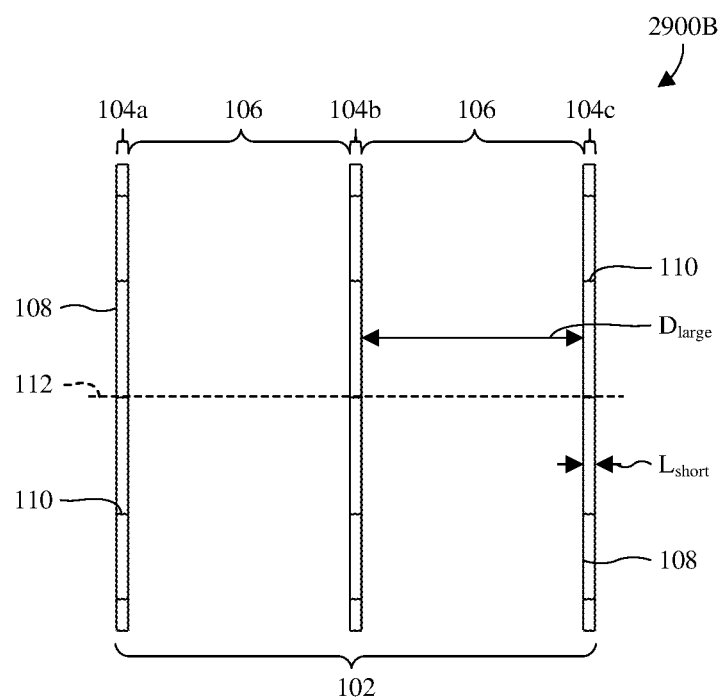
Figure 30A:
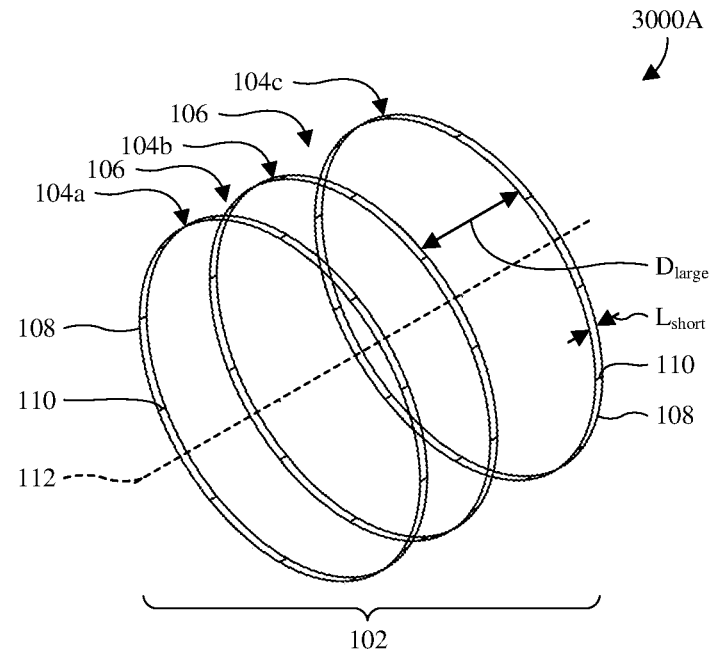
Figure 30B:
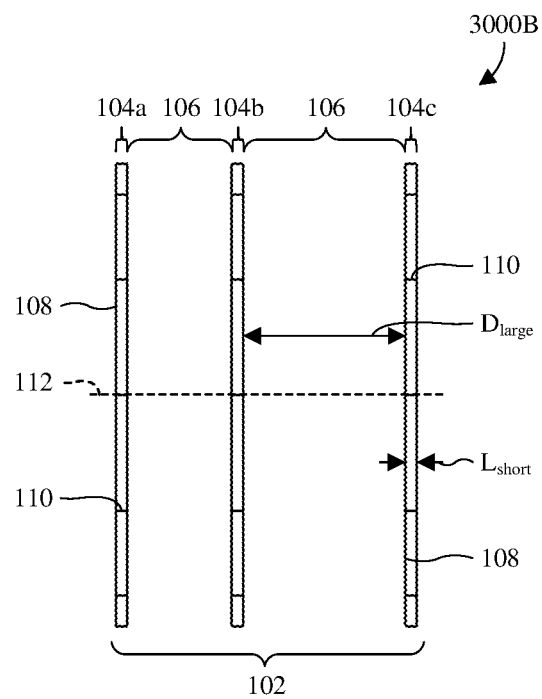

With reference to FIGS. 29A and 29B and FIGS. 30A and 30B, various views 2900A, 2900B, 3000A, 3000B of some alternative embodiments of the gapped multi-birdcage MRI RF coil 102 of FIGS. 1A-1D are provided in which the gapped multi-birdcage MRI RF coil 102 further comprises a third birdcage coil 104c. FIGS. 29A and 30A provide perspective views 2900A, 3000A, whereas FIGS. 29B and 30B provide side views 2900B, 3000B. The first and second birdcage coils 104a, 104b are as described with regard to FIGS. 1A-1D, and the second and third birdcage coils 104b, 104c are respectively as the first and second birdcage coils 104a, 104b are described with regard to FIGS. 1A-1D. In FIGS. 29A and 29B, the first, second, and third birdcage coils 104a-104c are evenly spaced along the principal axis 112. In FIGS. 30A and 30B, the first, second, and third birdcage coils 104a-104c are unevenly spaced along the principal axis 112.

Figure 31A:
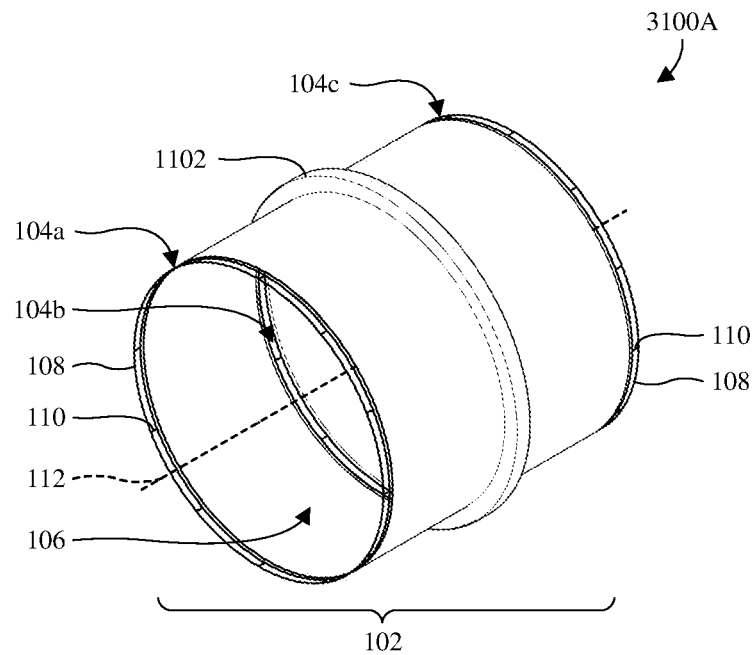
FIGS. 31A and 31B illustrate various views of some alternative embodiments of the gapped multi-birdcage MRI RF coil of FIGS. 29A and 29B comprising an RF shield.
Figure 31B:
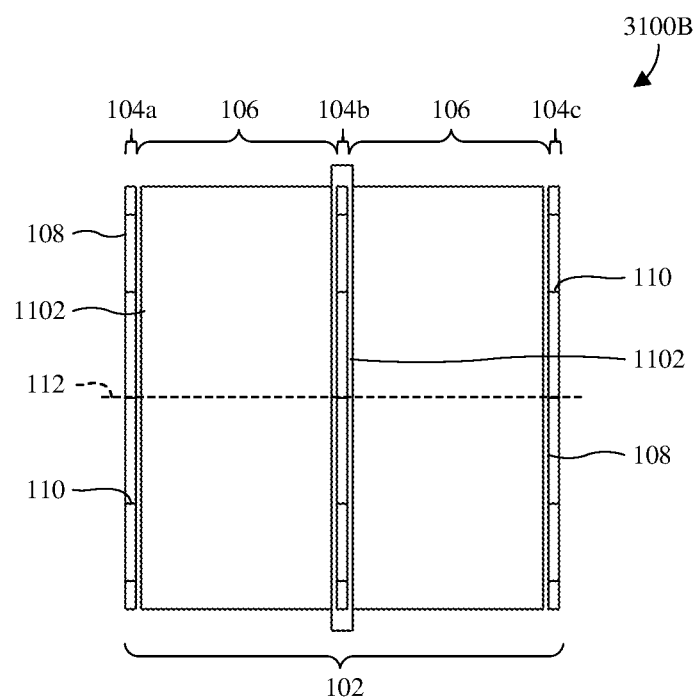

With reference to FIGS. 31A and 31B, various views 3100A, 3100B of some alternative embodiments of the gapped multi-birdcage MRI RF coil 102 of FIGS. 31A and 31B are provided in which the gapped multi-birdcage MRI RF coil 102 further comprises the RF shield 1102. FIG. 31A provides a perspective view 3100A, whereas FIG. 31B provides a cross-sectional view 3100B. The RF shield 1102 is continuous from the proximate the first birdcage coils 104a to proximate the third birdcage coil 104. The RF shield 1102 has the same diameter as the first, second, and third birdcage coils 104a-104c between the first and second birdcage coils 104a, 104b and between the second and third birdcage coils 104b, 104b. Further, the RF shield 1102 has an increased diameter at the second birdcage coil 104b to extend across the second birdcage coil 104b. Because the RF shield 1102 spans multiple gaps 106, the RF shield 1102 may, for example, be regarded as two separate RF shields: a first RF shield between the first and second birdcage coils 104a, 104b; and a second RF shield between the second and third birdcage coils 104b, 104c.

Also, note that in some embodiments, the first, second, and third birdcage coils 104a-104c may each be low pass birdcages (see, e.g., FIGS. 12A, 13A, and 13B). In some of such embodiments, one end ring of each birdcage coil (e.g., 104a-104c) may be defined by or otherwise connected to the RF shield 1102 for a $B_1$ magnetic field uniformity improvement as discussed with regard to FIGS. 13A and 13B. The other ring of each birdcage coil may have a different diameter and a same or different position along the principal axis 112. Further, the RF shield 1102 near the second birdcage coil 104b may change diameter around the other ring of the second birdcage coil 104b to accommodate a diameter change of the other ring (e.g., the ring not independent of and/or not contacting the RF shield 1102).

When the gapped multi-birdcage MRI RF coil 102 is employed as an WBC, the portion of the RF shield 1102 at the second birdcage coil 104b (e.g., the portion of the RF shield 1102 with the increased diameter) may be fitted between gradient coils for improved space efficiency. The improved space efficiency may be employed to increase a patient bore diameter for a better patient experience or to reduce a diameter of the gradient coils and a diameter of a main magnet for cost savings and/or performance boosting.

Figure 32A:
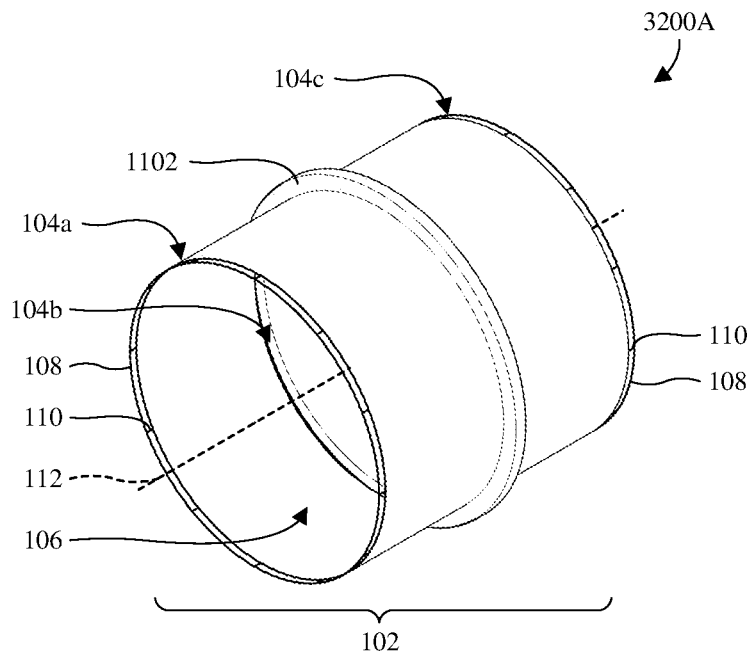
FIGS. 32A and 32B illustrate various views of some alternative embodiments of the gapped multi-birdcage MRI RF coil of FIGS. 31A and 31B in which the RF shield defines end rings of birdcage coils.
Figure 32B:
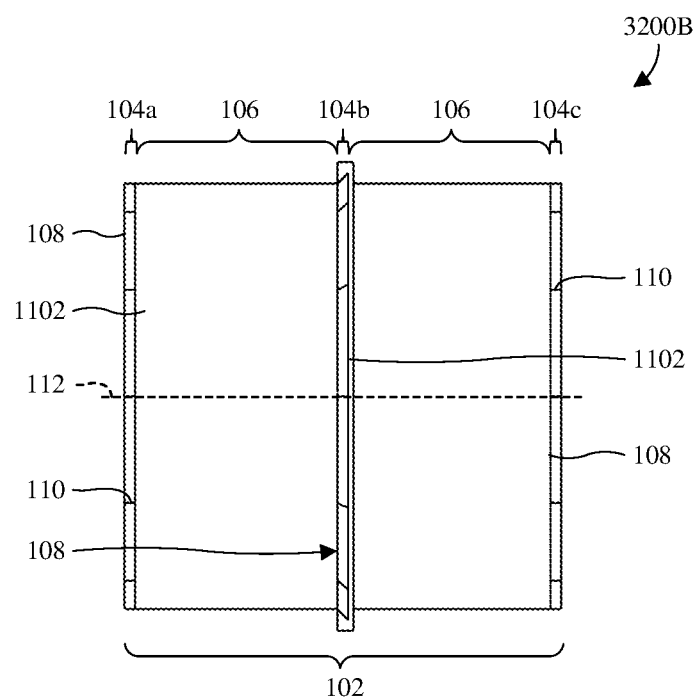

With reference to FIGS. 32A and 32B, various views 3200A, 3200B of some alternative embodiments of the gapped multi-birdcage MRI RF coil 102 of FIGS. 31A and 31B are provided in which the RF shield 1102 defines one end ring from each of the first, second, and third birdcage coils 104a-104c. FIG. 32A provides a perspective view 3200A, and FIG. 32B provides a cross-sectional view 3200B along the principal axis 112. As described with regard to FIGS. 13A and 13B, this may enhance $B_1$ magnetic field uniformity.

Figure 33A:
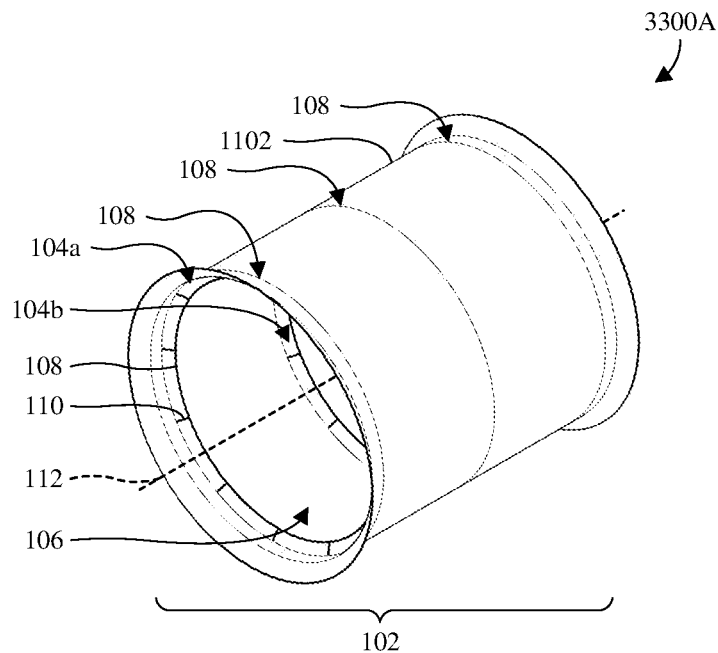
FIGS. 33A and 33B illustrate various views of some alternative embodiments of the gapped multi-birdcage MRI RF coil of FIGS. 31A and 31B in which the RF shield flares at ends, extends beyond birdcage coils, and defines end rings of the birdcage coils.
Figure 33B:
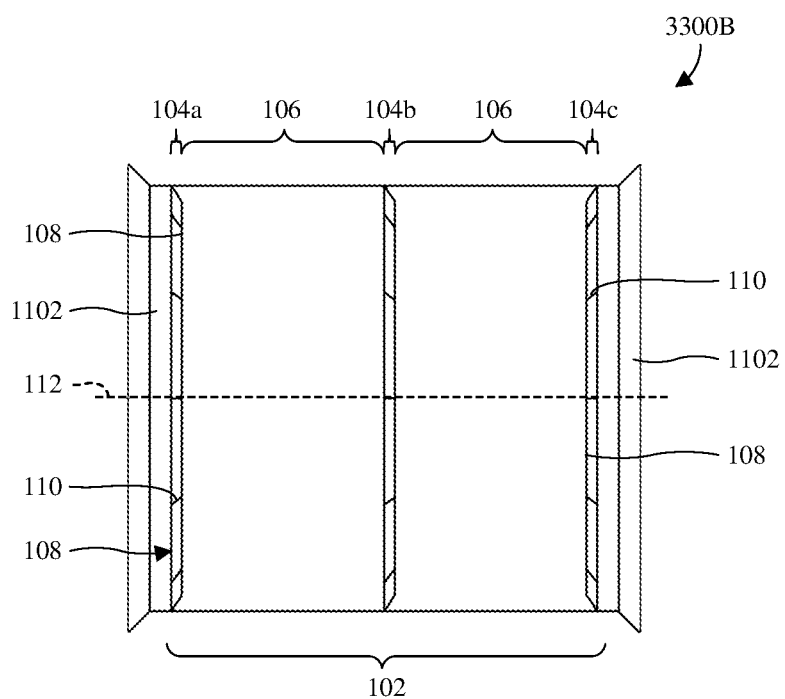

With reference to FIGS. 33A and 33B, various views of some alternative embodiments of the gapped multi-birdcage MRI RF coil 102 of FIGS. 31A and 31B are provided in which the RF shield 1102 flares at ends and extends beyond the first and third birdcage coils 104a, 104c along the principal axis 112. Further, the RF shield 1102 defines one end ring of each birdcage coils (e.g., 104a-104c) to enhance $B_1$ magnetic field uniformity. FIG. 33A provides a perspective view 3300A, and FIG. 33B provides a cross-sectional view 3300B along the principal axis 112. Note that outlines of end rings defined by the RF shield 1102 are shown on the RF shield 1102 for clarity but practically are not visible.

Figure 34A:
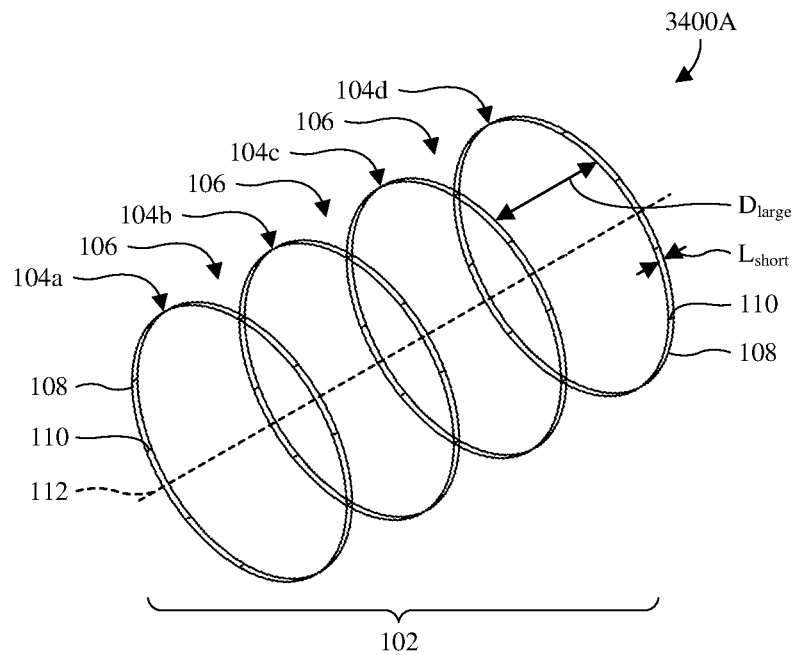
FIGS. 34A and 34B illustrate various views of some alternative embodiments of the gapped multi-birdcage MRI RF coil of FIGS. 29A and 29B comprising an additional birdcage coil.
Figure 34B:
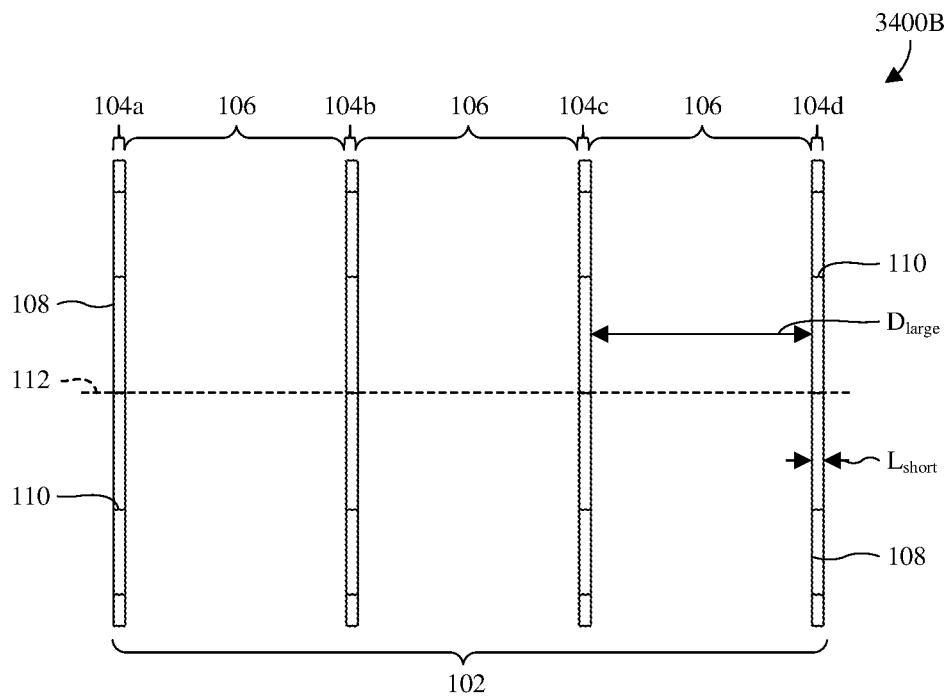

With reference to FIGS. 34A and 34B, various views 3400A, 3400B of some alternative embodiments of the gapped multi-birdcage MRI RF coil 102 of FIGS. 29A and 29B is provided in which the gapped multi-birdcage MRI RF coil 102 further comprises a fourth birdcage coil 104d. FIG. 34A is a perspective view 3400A, and FIG. 34B is a side view 3400B. The first, second, third, and fourth birdcage coils 104a-104d are evenly spaced along the principal axis 112 with a common diameter. In alternative embodiments, the first, second, third, and fourth birdcage coils 104a-104d are unevenly spaced and/or have different diameters. Further, the third and fourth birdcage coils 104c, 104d are respectively as the first and second birdcage coils 104a, 104b are described with regard to FIGS. 1A-1D. Note that in alternative embodiments, diameters and/or other parameters of each birdcage coil (e.g., 104a-104d) can be different.

Figure 35:
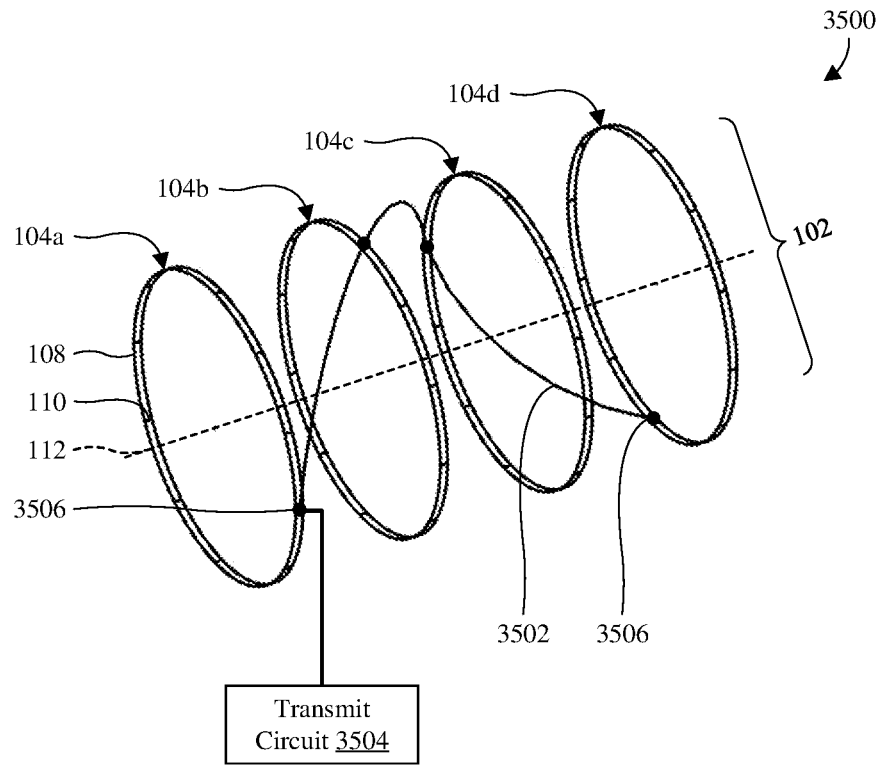
FIG. 35 illustrates a perspective view of some alternative embodiments of the gapped multi-birdcage MRI RF coil of FIGS. 34A and 34B in which birdcage coils have different azimuthal phase shifts along an axis.

With reference to FIG. 35, a perspective view 3500 of some alternative embodiments of the gapped multi-birdcage MRI RF coil 102 of FIGS. 34A and 34B is provided in which a cable 3502 connects the gapped multi-birdcage MRI RF coil 102 to a transmit circuit 3504 of an MRI system. Further, the cable 3502 winds around the gapped multi-birdcage MRI RF coil 102 along the principal axis 112 and connects to individual ports 3506 (schematically illustrated by black circles) of the first, second, third, and fourth birdcage coils 104a-104b at different azimuthal angles around the principal axis 112. For example, the ports 3506 may have azimuthal angles of 0 degrees, 90 degrees, 180 degrees, and 270 degrees from the first birdcage coil 104a to the fourth birdcage coil 104d.

By winding the cable 3502, the cable 3502 serves as a phase shifter so individual $B_1$ magnetic fields of the first, second, third, and fourth birdcage coils 104a-104b undergo azimuthal phase shifts along the principal axis 112. As a result, the individual $B_1$ magnetic fields change direction along the principal axis 112. Because each birdcage coil contributes to the combined $B_1$ magnetic field, and the closest birdcage coil along the principal axis 112 contributes the largest portion, the azimuthal phase shifts may be employed for manipulation of the combined $B_1$ magnetic field along the principal axis 112 to achieve higher uniformity. Notwithstanding that FIG. 35 employs the cable 3502 for azimuthal phase shifting, other types of phase shifters may be employed to achieve the azimuthal phase shifting.

Azimuthal phase shifting along the principal axis 112 is particularly useful at high magnetic fields (e.g., 7 T and above). At high magnetic fields, the RF wavelength is very short. For example, at 7 T, the RF wavelength in the human brain may be around 10 cm. Because the RF wavelength is very short, the $B_1$ magnetic field may be mid or far field. By mid field, it is meant that a distance between the imaging area and the gapped multi-birdcage MRI RF coil 102 is between ⅛ of the RF wavelength and the RF wavelength. By far field, it is meant that the imaging area is farther from the gapped multi-birdcage MRI RF coil 102 than the RF wavelength.

When the $B_1$ magnetic field is far field, the $B_1$ magnetic field may be described by the wave equation. Part of the wave equation is the wave vector k. The wave vector k defines the wave propagation direction in space. Normally, the $B_1$ magnetic field on the plane perpendicular to the wave vector is more uniform than another plane. Azimuthal phase shifting along the principal axis 112 may be used to change the wave vector k to optimize the $B_1$ magnetic field uniformity. When the $B_1$ magnetic field is mid field, the $B_1$ magnetic field is described by Maxwell's equation and analysis yields a similar conclusion as above: azimuthal phase shifting may be used to optimize the $B_1$ magnetic field uniformity.

Thus far, the present disclosure has generally focused on the gapped multi-birdcage MRI RF coil 102 by itself. However, the gapped multi-birdcage MRI RF coil 102 may be paired with an array receive coil to define a local Tx/Rx MRI RF coil. Using the gapped multi-birdcage MRI RF coil 102 as a transmit coil in a local Tx/Rx MRI RF coil can improve patient specific absorption rate (SAR) control compared to using the gapped multi-birdcage MRI RF coil 102 as a WBC. One application for which the local Tx/Rx MRI RF coil finds application is a head coil. Other suitable applications are, however, amenable.

Because head coils are arranged around heads of patients, it is important for head coil to accommodate patients that are claustrophobic. As a result, head coils have openings for at least eyes and a mouth. For head coils that are receive only array coils, the openings may be readily created because each receive coil is generally a loop. However, head coils used for receive and transmit pose a challenge due to the closed nature of many transmit coils. For example, head coils using birdcage coils as transmit coils generally have rungs circumferentially and evenly arranged around a head. Spacing between the rungs limits the size of the openings, such that the head coils have many small openings instead of fewer large openings. Head coils with many small openings have poor clinical utility because claustrophobic patients may refuse to use them.

Using the gapped multi-birdcage MRI RF coil 102 as the transmit coil in a head coil alleviates issues regarding opening size. The one or more gaps 106 separating neighboring birdcage coils overlap with openings for the eyes and the mouth. Further, the birdcage coils (e.g., 104a-104d) are radially aligned with the edges and/or overlapping areas between neighboring rows of the array receive coil so as not to impede the openings. Therefore, the open nature of the gapped multi-birdcage MRI RF coil 102 allows the openings to be large. This, in turn, allows increased patient comfort and hence increased clinical utility.

Figure 36A:
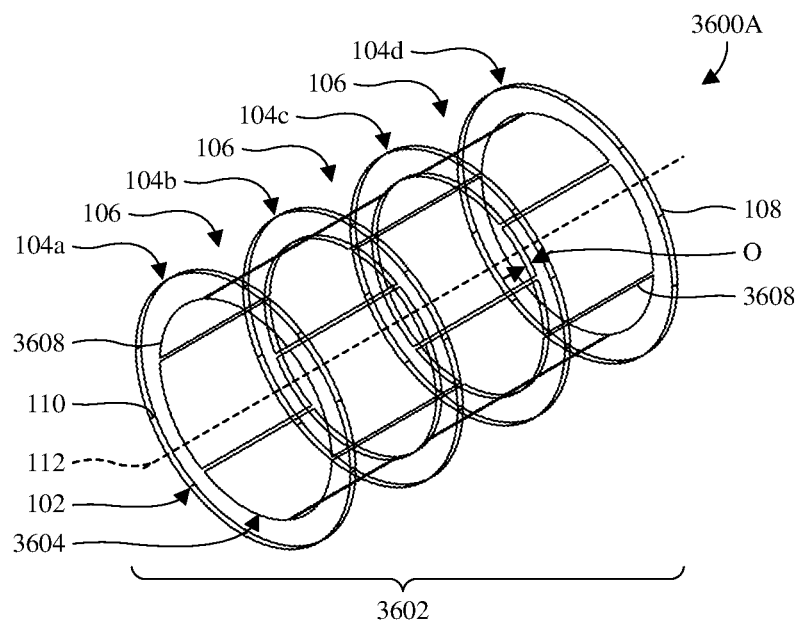
FIGS. 36A-36E illustrate various views of some embodiments of a head coil comprising the gapped multi-birdcage MRI RF coil of FIGS. 34A and 34B and an array receive coil.
Figure 36B:
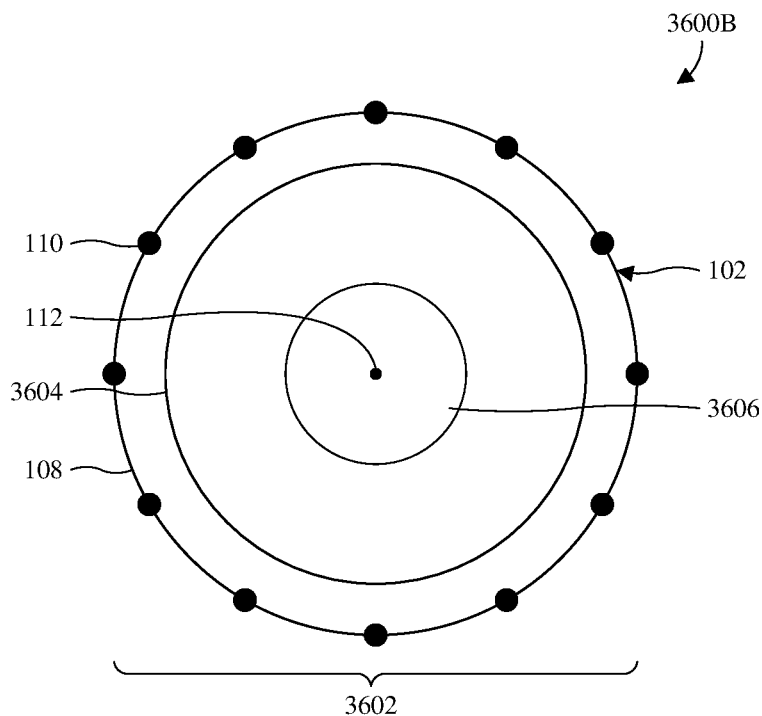
Figure 36C:
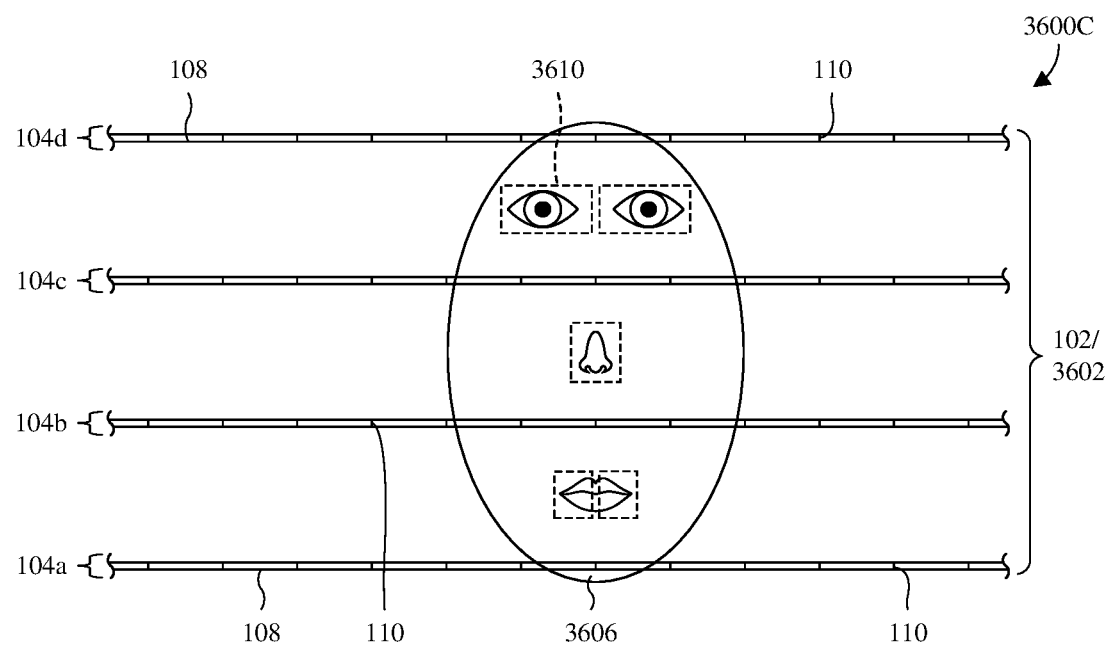
Figure 36D:
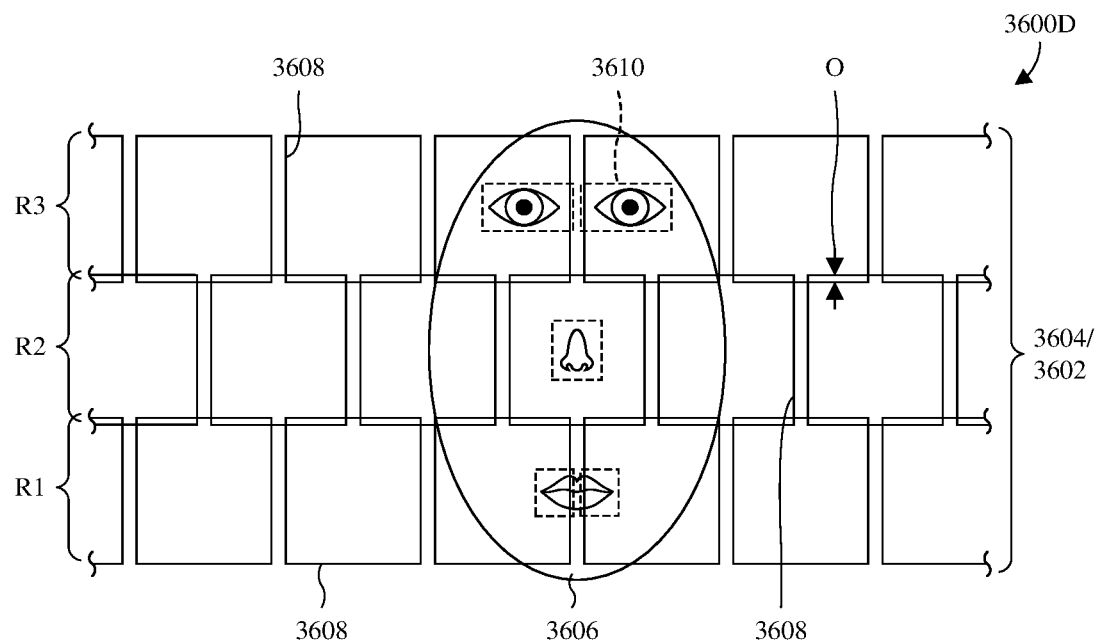
Figure 36E:
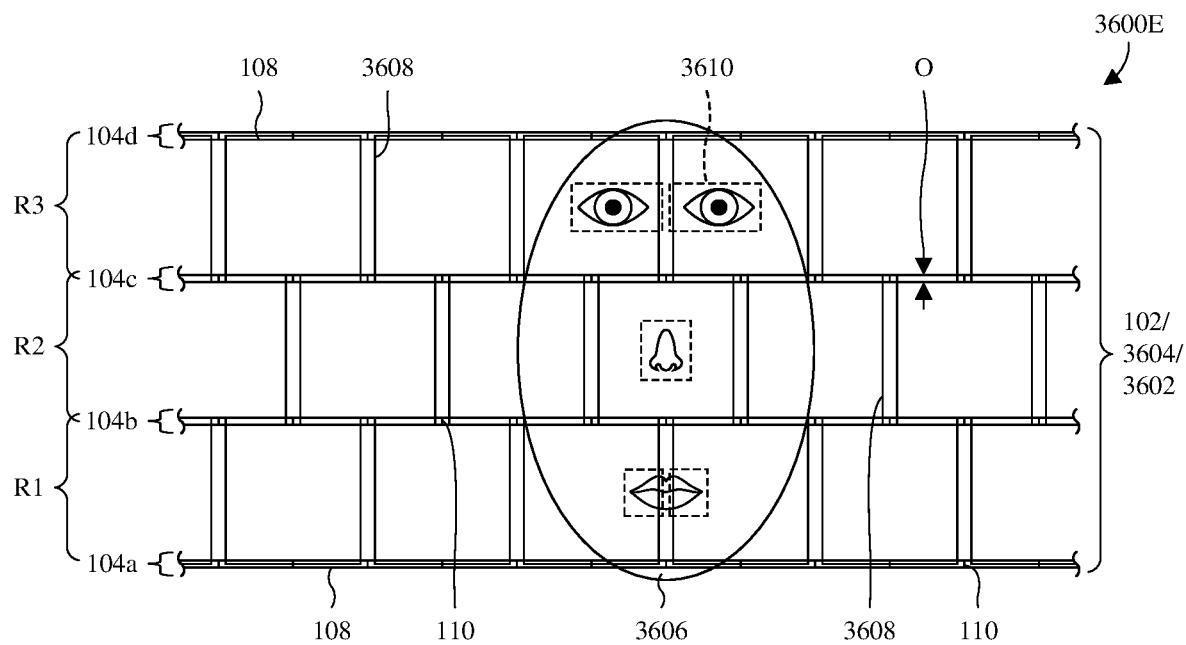

With reference to FIGS. 36A-36E, various views 3600A-3600E of some embodiments of a head coil 3602 comprising the gapped multi-birdcage MRI RF coil 102 of FIGS. 30A and 30B and an array receive coil 3604 is provided. FIG. 36A provides a perspective view 3600A, and FIG. 36B provides an axial view 3600B. Further, FIG. 36C provides a flattened view 3600C of the gapped multi-birdcage MRI RF coil 102 without the array receive coil 3604, FIG. 36D provides a flattened view 3600D of the array receive coil 3604 without the gapped multi-birdcage MRI RF coil 102, and FIG. 36E provides a flattened view 3600E of both the array receive coil 3604 and the gapped multi-birdcage MRI RF coil 102. Also, note that a head 3606 is shown in FIGS. 36B-36E, but is not shown in FIG. 36A for ease and clarity of illustration.

The array receive coil 3604 comprises a plurality of receive coils 3608 in a plurality of rows R1-R3. Particularly, the array receive coil 3604 comprises three rows of 6 receive coils for a total of 18 receive coils. In alternative embodiments, the array receive coil 3604 has a different number of rows and/or receive coils. The rows R1-R3 each have the same number of receive coils 3608 and are longitudinally spaced along the principal axis 112. Further, the rows R1-R3 in each neighboring pair of rows overlap along the principal axis 112 to reduce coupling and achieve good image quality. Because the overlap is between rows, the overlap may be regarded as an inter-row overlap. In some embodiments, the overlap O is about 2-3 cm, but other suitable amounts are amenable. In alternative embodiments, the rows R1-R3 have different numbers of receive coils 3608 and/or are non-overlapping. The receive coils 3608 define a plurality of receive channels and each of the receive coils 3608 is made up of one or more loops. Further, the receive coils 3608 of each row R1-R3 are circumferentially arranged around the principal axis 112. Because the array receive coil 3604 has 18 receive coils and hence at least 16 receive channels, the head coil 3602 is suitable for use at 1.5 T, 3 T, and other suitable magnetic fields.

A plurality of openings 3610 extend radially through the head coil 3602 to expose anatomical features of the head 3606. For example, the openings 3610 may expose eyes, a mouth, and a nose of the head 3606. Other anatomical features are, however, amenable. Note that the openings 3610 are not shown in FIGS. 36A and 36B for ease and clarity. The openings 3610 may, for example, be defined wholly or partially by a former (not shown) to which the gapped multi-birdcage MRI RF coil 102 and the phased array receive coil 3604 are formed. The former may, for example, define the cylindrical shape of the head coil 3602. In some embodiments, the former is or is otherwise part of a housing enclosing the head coil 3602.

The array receive coil 3604 is configured so the receive coils 3608 surround the openings 3610. Because the receive coils 3608 are loops, this may be readily achieved without limiting the size of the openings 3610. The gapped multi-birdcage MRI RF coil 102 is configured so the gaps 106 separating the first, second, third, and fourth birdcage coils 104a-104d respectively and radially overlap with the openings 3610. Further, the first, second, third, and fourth birdcage coils 104a-104d respectively and radially overlap with edges of the rows R1-R3 and overlapping regions between the rows R1-R3. Because of flexibility choosing the size of the gaps 106, this may be readily achieved without limiting the size of the openings 3610. Because the gapped multi-birdcage MRI RF coil 102 and the array receive coil 3604 may be configured so as not to limit the size of the openings 3610, the openings 3610 may be large. This, in turn, may allow increased patient comfort and hence increased clinical utility.

Note that a radial distance between the gapped multi-birdcage MRI RF coil 102 and the array receive coil 3604 is drawn larger for clarity. Practically, the radial distance is smaller. For example, the radial distance may be about 5 millimeters (mm) or less. Thus, the former and/or housing (not shown) for the head coil 3602 may be thin. Further, note that a length of the head coil 3602 along the principal axis 112 is drawn larger for clarity. Practically, the length will be smaller. Further yet, note that any one or combination of the variations discussed above for the first and second birdcage coils 104a, 104b are applicable to the first, second, third, and fourth birdcage coils 104a-104b. These variations include different diameters for different birdcage, different diameters for the same birdcage, different lengths for different birdcages, different gaps between neighboring birdcages, phase shifter driving, inductive coupling, and different tuning frequencies.

Notwithstanding that the gapped multi-birdcage MRI RF coil 102 was described above with regard to the head coil 3602, the gapped multi-birdcage MRI RF coil 102 finds application in other types of local Tx/Rx MRI RF coils. For example, the gapped multi-birdcage MRI RF coil 102 finds application with hand/wrist coils, knee coils, leg coils, and arm coils. Further, by configuring the gapped multi-birdcage MRI RF coil 102 as described above with regard to the head coil 3602, the gapped multi-birdcage MRI RF coil 102 may be used to convert any cylindrical like Rx-only MRI RF array coil into a Tx/Rx MRI RF coil without reducing receive coil openings.

Figure 37A:
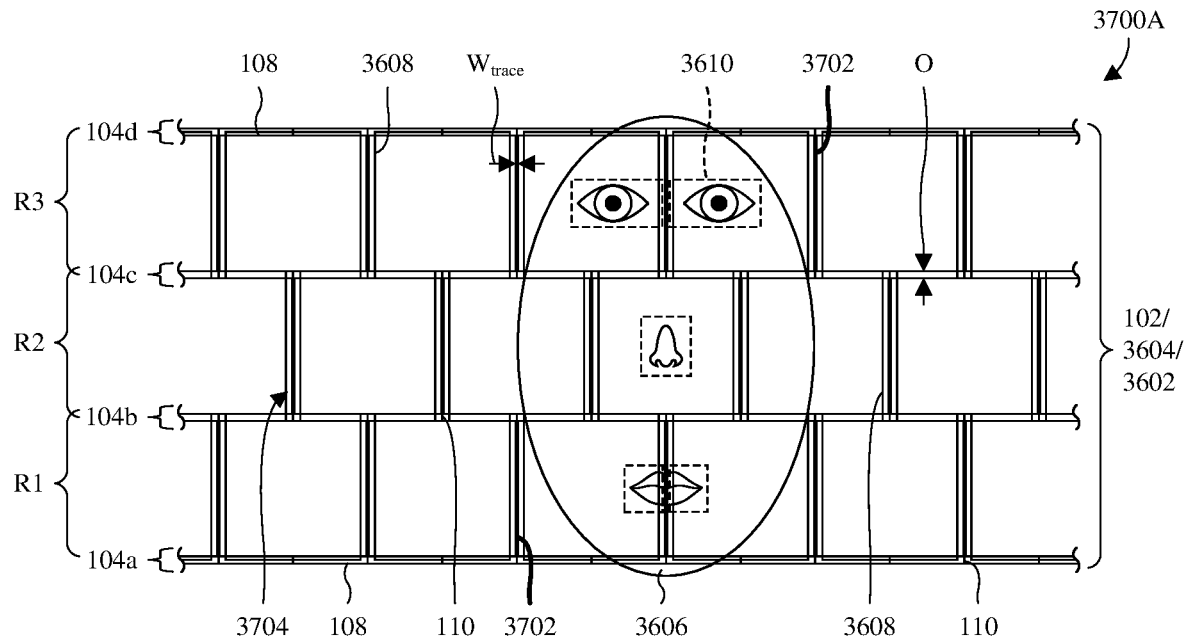
FIGS. 37A-37C illustrate flattened views of some alternative embodiments of the head coil of FIGS. 36A-36E.
Figure 37B:
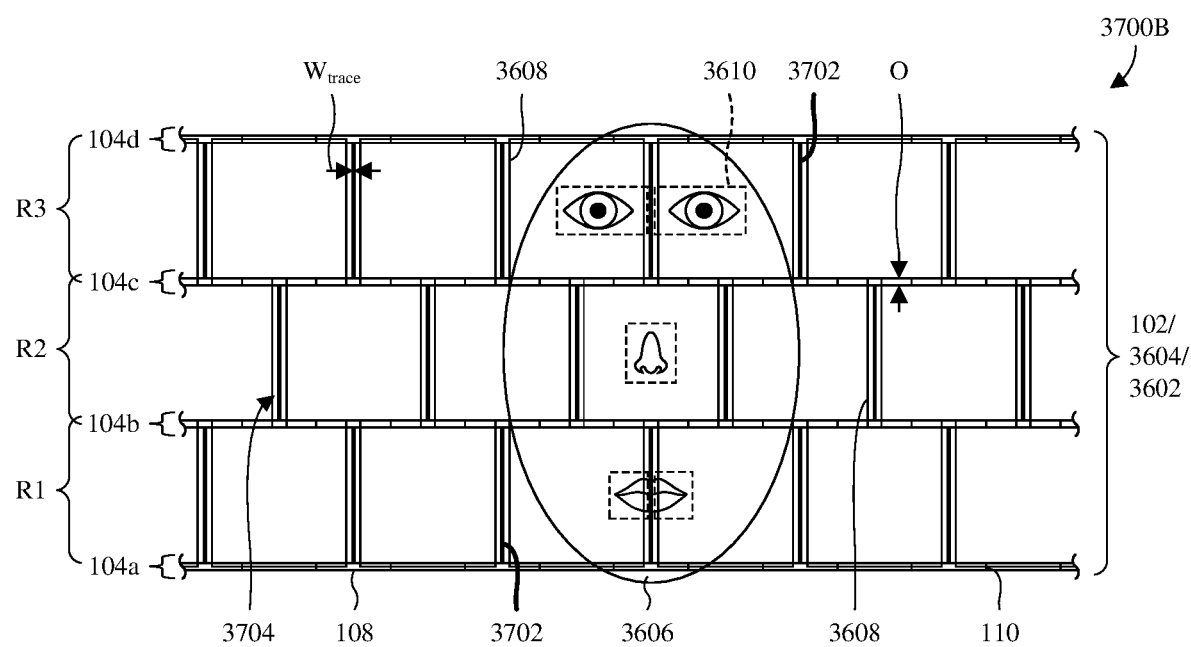
Figure 37C:
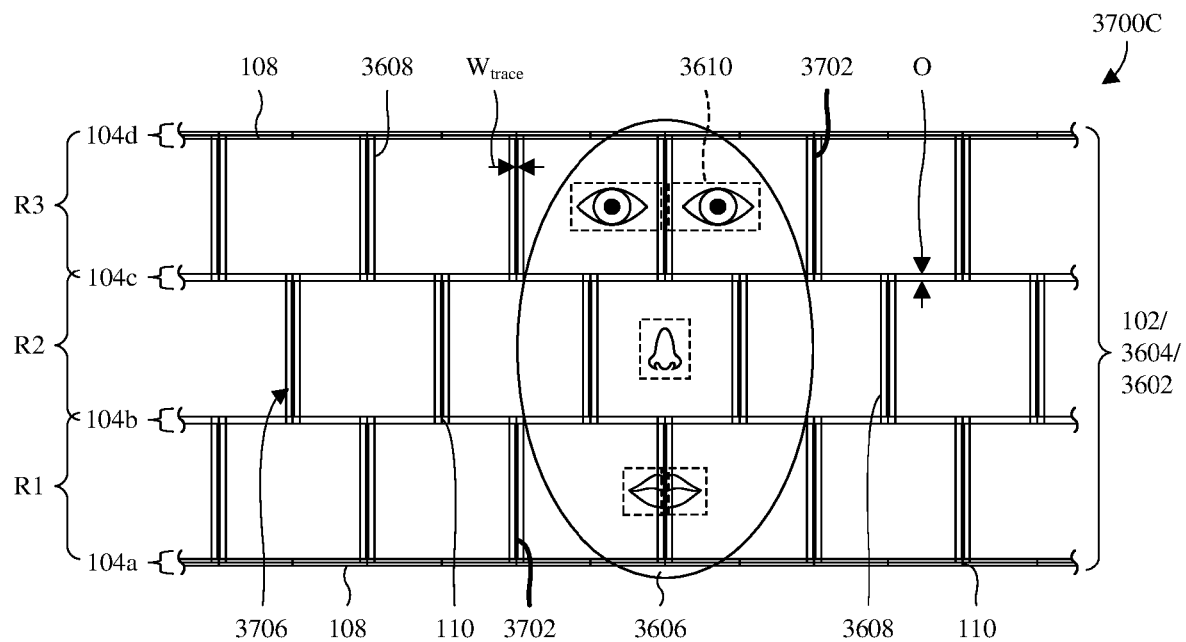

With reference to FIGS. 37A-37C, flattened views 3700A-3700C of some alternative embodiments of the head coil 3602 of FIGS. 36A-36E are provided in which conductive traces 3702 interconnect the first, second, third, and fourth birdcage coils 104a-104d. Note that while FIGS. 37A-37C are flattened, FIGS. 37A-37C are circumferentially arranged around the principal axis 112 (see, e.g., FIGS. 36A and 36B) in the same way FIGS. 36C-36E are.

In FIG. 37A, the conductive traces 3702 are elongated along the principal axis 112 to electrically interconnect corresponding birdcage coils. Further, the conductive traces 3702 are radially outside the array receive coil 3604 and are radially and respectively aligned to gaps 3704 circumferentially separating neighboring receive coils. The conductive traces 3702 have small widths $W_{trace}$ less than the gaps 3704 and/or less than about 2-3 cm or some other suitable amount. The conductive traces 3702 also have a high conductivity and may, for example, be or comprise copper or some other suitable amount.

In FIG. 37B, the conductive traces 3702 are offset from the rungs 110.

In FIG. 37C, the receive coils 3608 overlap within corresponding rows R1-R3 to reduce intra-row coupling. As a result, the conductive traces 3702 are radially and respectively aligned to overlapping regions 3706 circumferentially between neighboring receive coils 3608. Further, the conductive traces 3702 have small widths $W_{trace}$ less than the overlapping regions 3706 and/or less than about 2-3 cm or some other suitable amount.

Because the conductive traces 3702 are aligned to the gaps 3704 and/or the overlapping regions 3706, the conductive traces 3702 do not impede the openings 3610. As a result, the openings 3610 may remain large. Further, for similar reasons described with regard to FIGS. 13A and 13B, electrically connecting the birdcage coils (e.g., 104a-104d) with the conductive traces 3702 may improve the $B_1$ magnetic field uniformity. Particularly, because the birdcage coils are resonant coils, the birdcage coils create ring currents flowing at the end rings 108. As a result, the birdcage coils create RF potential distributions respectively at the end rings 108. For each gap (e.g., 106 in FIGS. 36A-36E) separating the birdcage coils, the RF potential distributions are different and/or off-phase, such that conductive traces 3702 allow RF currents to flow between the end rings in that gap. Because the conductive traces 3702 are in patterns similar to birdcage rungs, the RF currents are in patterns similar to birdcage current patterns. It has been appreciated that this similarity boost $B_1$ magnetic field uniformity compared to the gapped multi-birdcage MRI RF coil 102 without the conductive traces 3702.

Figure 38:
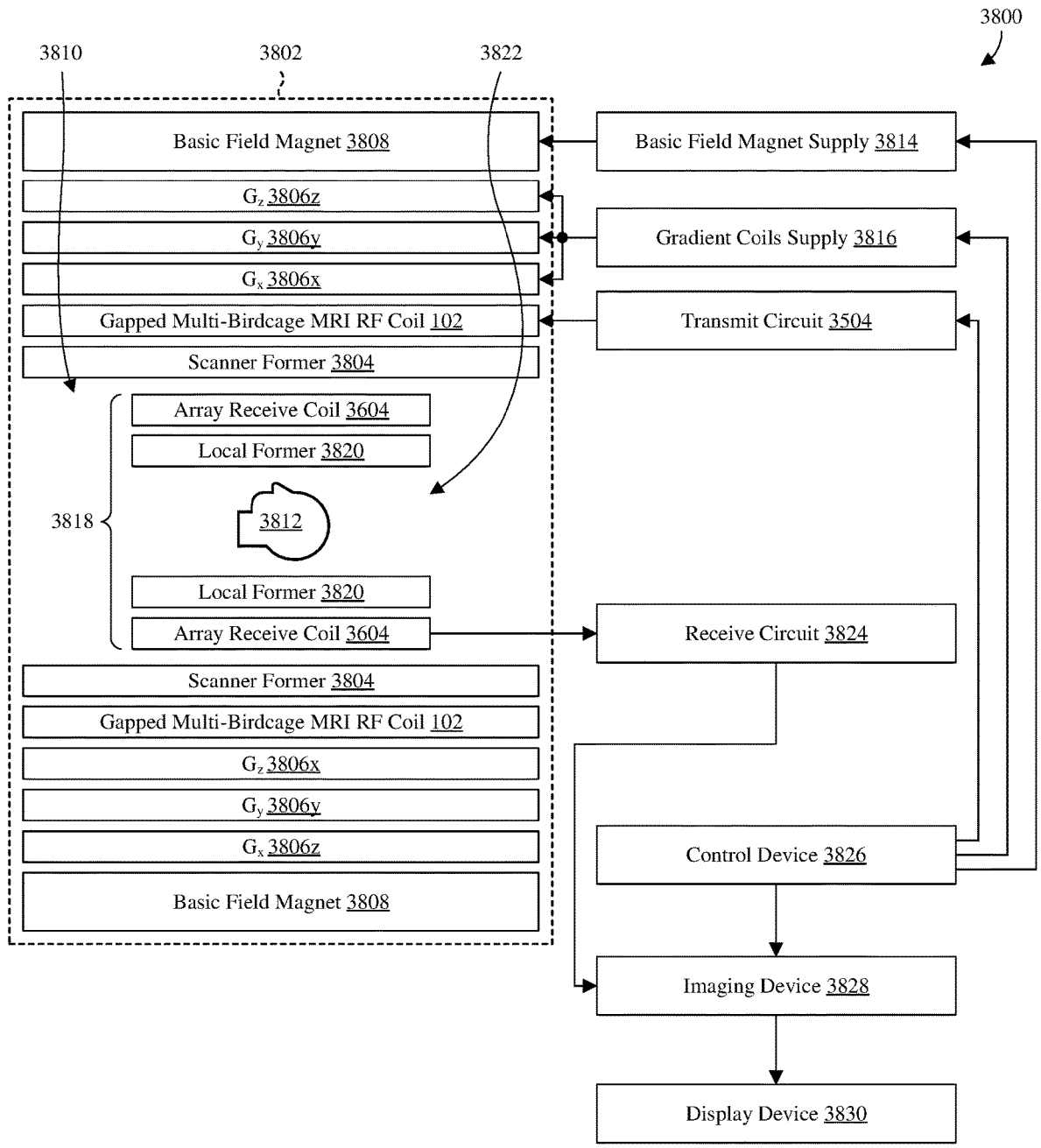
FIG. 38 illustrates a block diagram of some embodiments of an MRI system in which a gapped multi-birdcage MRI RF coil is employed as an WBC.

With reference to FIG. 38, a block diagram 3800 of some embodiments of an MRI system in which a gapped multi-birdcage MRI RF coil 102 is employed as an WBC is provided. The MRI system comprises a scanner 3802, and the scanner 3802 comprises a scanner former 3804, the gapped multi-birdcage MRI RF coil 102, a plurality of gradient coils 3806x-3806z, and a basic field magnet 3808.

The scanner former 3804 surrounds a scanner bore 3810, which is sized to receive a scan target 3812 for MRI (e.g., a patient). Further, the scanner former 3804 is surrounded by the gapped multi-birdcage MRI RF coil 102, the gradient coils 3806x-3806z, and the basic field magnet 3808. The scanner former 3804 provides rigidity to the surrounding structure (e.g., the gapped multi-birdcage MRI RF coil 102) and may, for example, be or be part of a housing of the scanner 3802. Further, the scanner former 3804 may, for example, have a shape that is cylindrical or the like.

The gradient coils 3806x-3806z surround the scanner former 3804, and the basic field magnet 3808 surrounds the gradient coils 3806x-3806z. The basic field magnet 3808 is electrically coupled to, and controlled in part by, a basic field magnet power supply 3814. The basic field magnet 3808 produces a $B_0$ magnetic field over the scan target 3812 in a Z direction. The Z direction may, for example, be left to right in FIG. 38 and/or along the principal axis 112 in FIGS. 1A-1D and other figures described above.

The gradient coils 3806x-3806z emit gradient magnetic fields to spatially encode MRI signals received from the scan target 3812. The gradient coils 3806x-3806z include an x-direction gradient coil 3806x, a y-direction gradient coil 3806y, and a z-direction gradient coil 3806z for spatially encoding the MRI signals respectively in the X, Y, and Z directions. The Z direction is parallel to the $B_0$ magnetic field produced by the basic field magnet 3808, whereas the X and Y directions are transverse to the $B_0$ magnetic field. In alternative embodiments, one or more of the gradient coils 3806x-3806z is/are omitted. The gradient coils 3806x-3806z are electrically coupled to, and controlled in part, by a gradient coil power supply 3816.

The gapped multi-birdcage MRI RF coil 102 surrounds the scanner former 3804 between then scanner former 3804 and the gradient coils 3806x-3806z. The gapped multi-birdcage MRI RF coil 102 is employed as a WBC for the MRI system. The gapped multi-birdcage MRI RF coil 102 may, for example, be as in any one or combination of FIGS. 1A-1D, 2, 4A-4C, 5-7, 8A and 8B to 10A and 10B, 11A-11C, 12A-12C, 13A and 13B to 23A and 23B, 24A-24C, 26, 27A and 27B to 34A and 34B, and 35. However, embodiments without the RF shield 1102 may suffer from interference from the gradient coils 3806x-3806z.

A transmit circuit 3504 is electrically coupled to the gapped multi-birdcage MRI RF coil 102. The transmit circuit 3504 may be electrically coupled to the gapped multi-birdcage MRI RF coil 102 by phase shifters, matching circuits, combiners, etc. The transmit circuit 3504 drives the gapped multi-birdcage MRI RF coil 102 to generate a $B_1$ magnetic field transverse to the $B_0$ magnetic field when the MRI system operates in transmit mode. For example, the transmit circuit 3504 may drive the gapped multi-birdcage MRI RF coil 102 to generate RF pulses at the Larmor frequency for hydrogen nuclei or some other suitable nuclei. The $B_1$ magnetic field excites nuclei in the scan target 3812, which causes the nuclei to emit MRI signals. When the MRI system operates in a receive mode, the gapped multi-birdcage MRI RF coil 102 is disabled.

In some embodiments, the transmit circuit 3504 drives the gapped multi-birdcage MRI RF coil 102 in a linear mode. In other embodiments, the transmit circuit 3504 drives the gapped multi-birdcage MRI RF coil 102 in a quadrature mode. In other embodiments, the transmit circuit 3504 drives the gapped multi-birdcage MRI RF coil 102 in a parallel transmission (pTx) mode.

As to driving the gapped multi-birdcage MRI RF coil 102 in a pTx mode, note that a birdcage coil has multiple resonant modes. For example, a 16 rung high pass birdcage coil has 9 resonant modes (e.g., =16/2+1), where the 8 resonant modes generate $B_1$ magnetic field in the XY plane and one mode is the not-useful ring mode. Also note that the 8 resonant modes may be tuned to the same frequency, which is the working frequency, with the right capacitors at end rings and rungs. This is called a degenerate birdcage coil. When a birdcage coil is in degeneracy, the birdcage coil can be driven in a pTx mode. For example, a 16 rung birdcage coil in degeneracy can be driven as an 8-pTx coil at the working frequency. Therefore, in embodiments in which the gapped multi-birdcage MRI RF coil 102 is driven in a pTx mode, at least one birdcage coil of the gapped multi-birdcage MRI RF coil 102 is tuned into degeneracy mode. As a result, the gapped multi-birdcage MRI RF coil 102 is also tuned to degeneracy mode and may be driven in the pTx mode.

A local MRI RF coil 3818 is in the scanner bore 3810 and comprises a local former 3820 and an array receive coil 3604. The local former 3820 surrounds a local bore 3822, which is sized to receive an anatomical feature of the scan target 3812 for MRI. The anatomical feature may, for example, be a head, a knee, a wrist, a leg, a body, an arm, or some other suitable type of anatomical feature. Further, the local former 3820 is surrounded by the array receive coil 3604. The local former 3820 provides rigidity to the surrounding structure (e.g., the array receive coil 3604) and may, for example, be or be part of a housing of the local MRI RF coil 3818. Further, the local former 3820 may, for example, have a shape that is cylindrical or the like.

The array receive coil 3604 is electrically coupled to a receive circuit 3824. The local array receive coil 3604 may, for example, be a phased array receive coil or some other suitable type of coil. In the receive mode of the MRI system, the receive circuit 3824 receives the MRI signals using the array receive coil 3604. As described above, these MRI signals are generated in response to excitation of nuclei by the gapped multi-birdcage MRI RF coil 102 when the MRI system is in the transmit mode. In the transmit mode of the MRI system, the array receive coil 3604 is decoupled from the $B_1$ magnetic field to prevent damage to the receive circuit 3824.

The basic field magnet power supply 3814, the gradient coil power supply 3816, the transmit circuit 3504, or any combination of the foregoing is/are controlled by a control device 3826. An imaging device 3828 receives MRI signals from the receive circuit 3824 and, in embodiments, receives control signals from the control device 3826. Based thereon, the imaging device 3828 generates an image of the scan target 3812 and outputs the image to a display device 3830. The imaging device 3828 generates the image by performing a transformation process on the MRI signals, such as, for example, a two-dimensional fast Fourier transform (FFT) or some other suitable transform. The control device 3826 may, for example, be a general-purpose device (e.g., a computer) executing instructions or an application-specific device. Similarly, the imaging device 3828 may, for example, be a general-purpose device (e.g., a computer) executing instructions or an application-specific device. While the control device 3826 and the imaging device 3828 are shown as being separate, the control device 3826 and the imaging device 3828 may be integrated together in alternative embodiments.

Figure 39A:
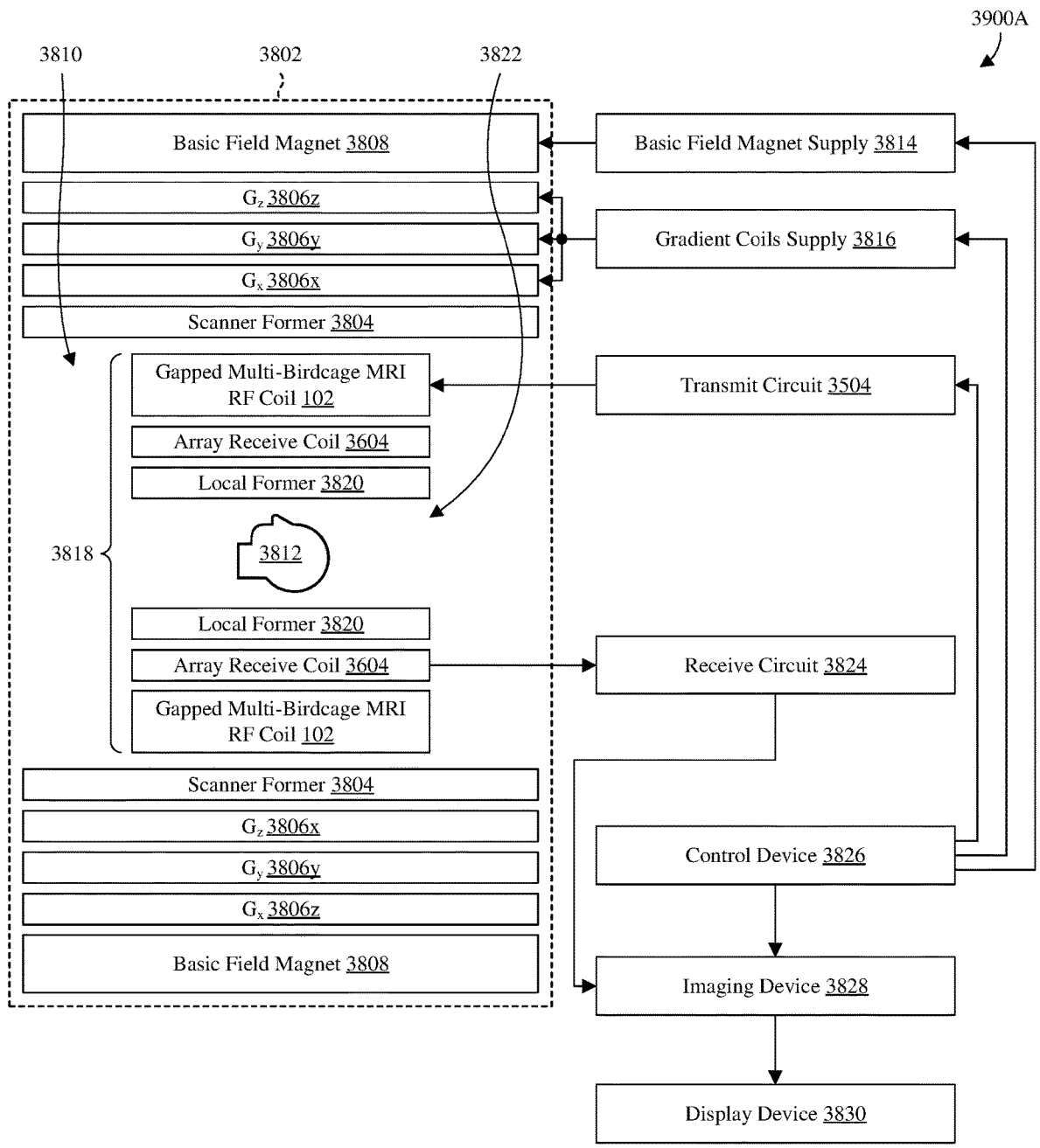
FIGS. 39A and 39B illustrate block diagrams of some alternative embodiments of the MRI system of FIG. 38.
Figure 39B:
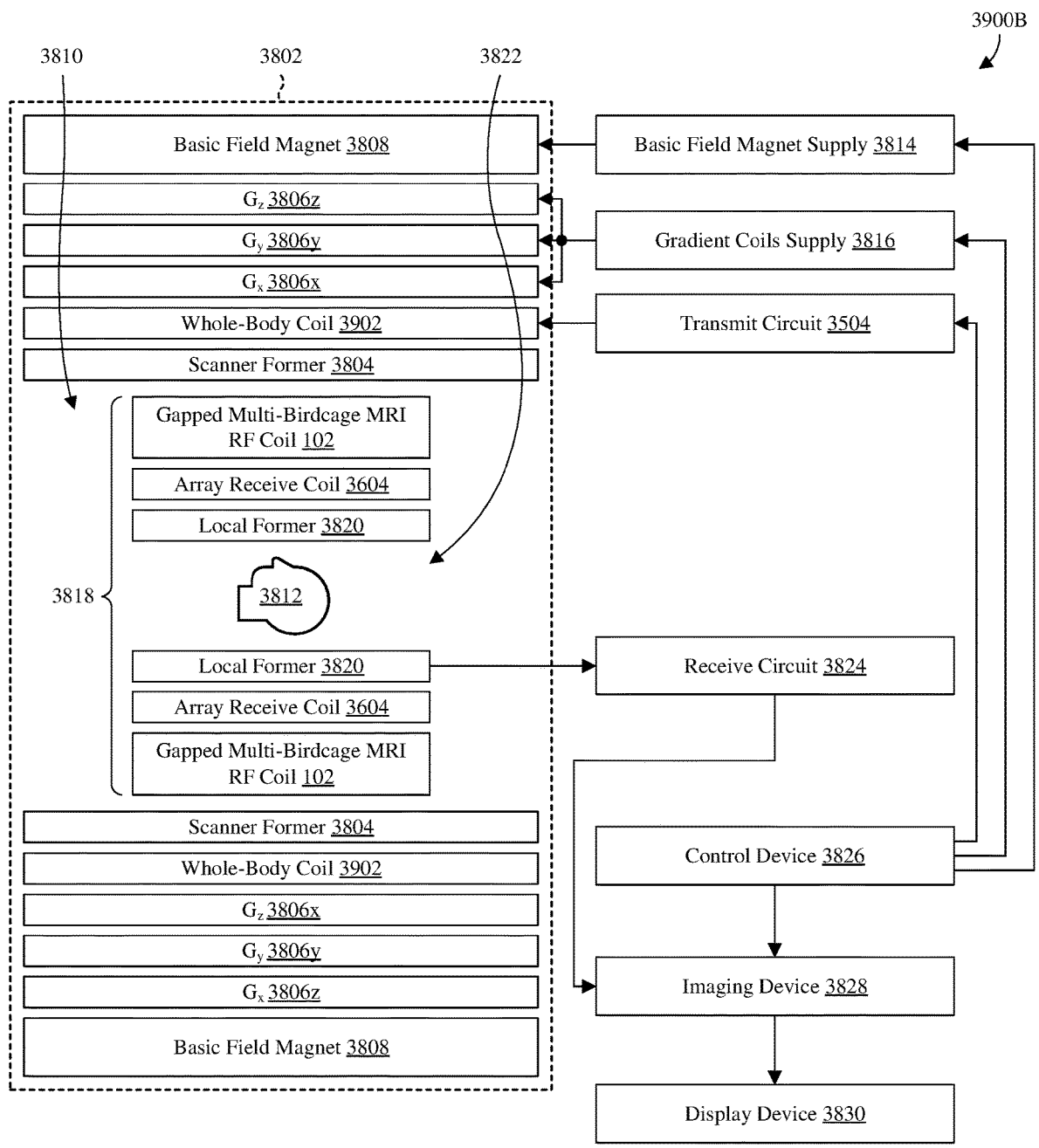

With reference to FIGS. 39A and 39B, block diagrams 3900A, 3900B of some alternative embodiments of the MRI system of FIG. 38 are provided.

In FIG. 39A, the gapped multi-birdcage MRI RF coil 102 is moved from the scanner 3802 to the local MRI RF coil 3818, such that the local MRI RF coil 3818 is a local Tx/Rx MRI RF coil. By moving the gapped multi-birdcage MRI RF coil 102 closer to the scan target 3812, SAR control can be improved. In some embodiments, the local MRI RF coil 3818 is the same as the head coil 3602 of FIGS. 36A-36F except for the further inclusion of the local former 3820. In some embodiments, the local MRI RF coil 3818 is a knee coil, wrist coil, a leg coil, a body coil, an arm coil, or a coil for some other suitable type of anatomical feature. Also, while a WBC is not illustrated, the scanner 3802 may have an WBC in alternative embodiments.

In FIG. 39B, the gapped multi-birdcage MRI RF coil 102 is moved from the scanner 3802 to the local MRI RF coil 3818 as in FIG. 39A. Further, the scanner 3802 has an WBC 3902. The WBC 3902 surrounds the scanner former 3804 between the scanner former 3804 and the gradient coils 3806x-3806z. Further, the transmit circuit 3504 is electrically coupled directly to the WBC 3902 rather than the gapped multi-birdcage MRI RF coil 102. When the MRI system operates in transmit mode, the transmit circuit 3504 drives the WBC 3902, which drives the gapped multi-birdcage MRI RF coil 102 by inductive coupling. Because of the inductive coupling, there are no wires directly connecting the gapped multi-birdcage MRI RF coil 102 to the transmit circuit 3504, which reduces complexity and cost of the gapped multi-birdcage MRI RF coil 102.

Figure 40:
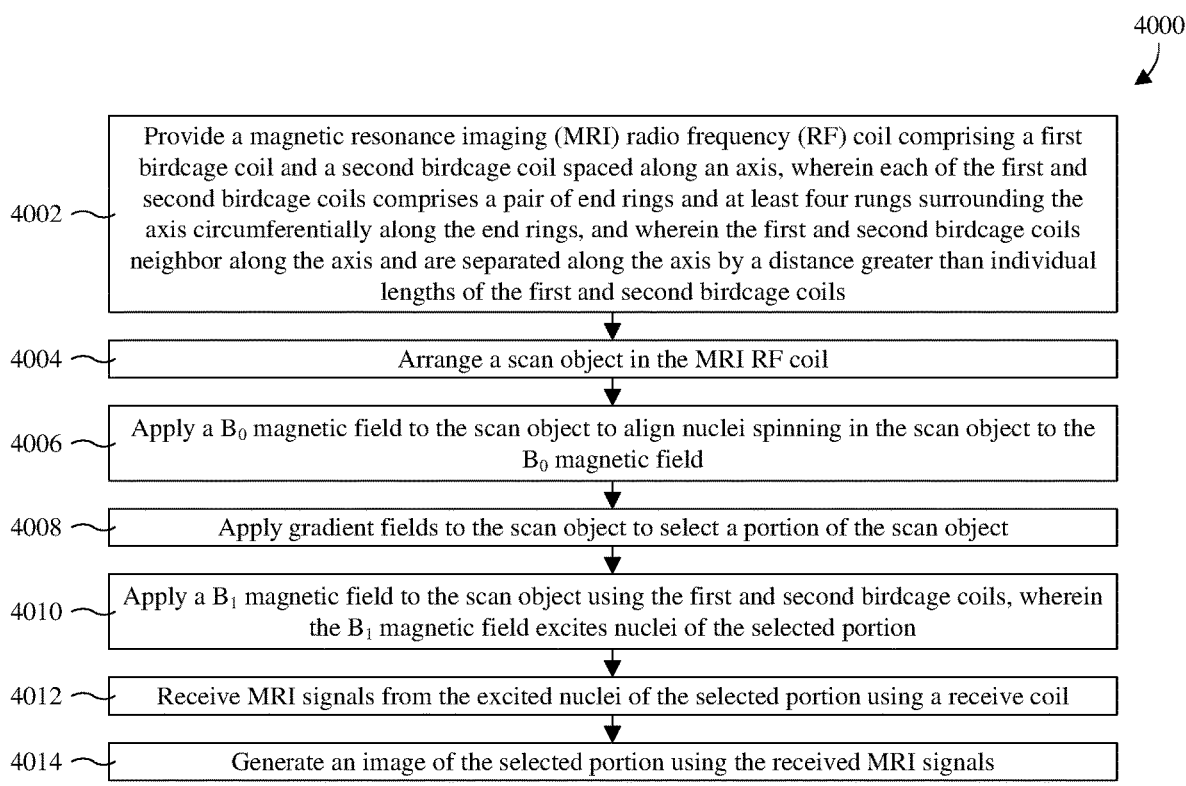
FIG. 40 illustrates a block diagram of some embodiments of a method for performing MRI using a gapped multi-birdcage MRI RF coil.

With reference to FIG. 40, a flow chart 4000 of some embodiments of a method for performing MRI using a gapped multi-birdcage MRI RF coil is provided. The gapped multi-birdcage MRI RF coil 102 may, for example, as in any of FIGS. 1A-1D, 2, 4A-4C, 5-7, 8A and 8B to 10A and 10B, 11A-11C, 12A-12C, 13A and 13B to 21A and 23B, 24A-24C, 26, 27A and 27B to 34A and 34B, 35, 36A-36E, 37A-37C, 38, 39A, and 39B. Further, the MRI process may, for example, be performed by the MRI system in any of FIGS. 38, 39A, and 39B or some other suitable MRI system.

At 4002, a MRI RF coil is provided. The MRI RF coil comprises a first birdcage coil and a second birdcage coil spaced along an axis, wherein each of the first and second birdcage coils comprises a pair of end rings and at least four rungs surrounding the axis circumferentially along the end rings, and wherein the first and second birdcage coils neighbor along the axis and are separated along the axis by a distance greater than individual lengths of the first and second birdcage coils. See, for example, 102 in FIGS. 38, 39A, and 39B.

At 4004, a scan object is arranged in the MRI RF coil. See, for example, 3812 in FIGS. 38, 39A, and 39B.

At 4006, a $B_0$ magnetic field is applied to the scan object to align nuclei spinning in the scan object to the $B_0$ magnetic field. See, for example, 3808 and 3814 in FIGS. 38, 39A, and 39B.

At 4008, gradient fields are applied to the scan object to select a portion (e.g., a slice) of the scan object. See, for example, 3806x-3806z and 3816 in FIGS. 38, 39A, and 39B.

At 4010, a $B_1$ magnetic field is applied to the scan object using the first and second birdcage coils, wherein the $B_1$ magnetic field excites nuclei of the selected portion at a work frequency. The working frequency may, for example, correspond to the Larmor frequency for the nuclei. The nuclei may, for example, be hydrogen nuclei or some other suitable nuclei. See, for example, 102 and 3504 in FIGS. 38, 39A, and 39B.

At 4012, MRI signals from the excited nuclei of the selected portion are received using a receive coil. See, for example, 3604 and 3824 in FIGS. 38, 39A, and 39B.

At 4014, an image of the selected portion is generated using the received MRI signals. See, for example, 3828 of FIGS. 38, 39A, and 39B.

While not shown, in some embodiments, the acts at 4010-4014 are repeated for different nuclei and hence a different working frequency. For example, hydrogen nuclei may initially be excited using the corresponding working frequency and then phosphorus nuclei or some other suitable nuclei may subsequently be excited using the corresponding working frequency. This may, for example, be achieved because the gapped multi-birdcage MRI RF coil may be double or triple tuned. See, for example, FIGS. 26, 27A, 27B, 28A, and 28B.

As described above, the gapped multi-birdcage MRI RF coil that is provided at 4002 may be as in any of the figures described above. While describing these figures, numerous functional features for use of the gapped multi-birdcage MRI RF coil were described. For example, the description of FIG. 38 includes tuning the gapped multi-birdcage MRI RF coil to degeneracy and driving birdcage coils of the gapped multi-birdcage MRI RF coil in a pTx mode to excite nuclei. As another example, the description of FIG. 39B includes driving the gapped multi-birdcage MRI RF coil inductively using a WBC. As yet another example, the description of FIGS. 1A-1D includes driving the gapped multi-birdcage MRI RF coil at a combined uniform mode frequency when birdcage coils of the gapped multi-birdcage MRI RF coil are coupled directly by phase shifters or indirectly by mutual inductance. Any of these functional features may be performed by the method (e.g., while generating and applying the $B_1$ magnetic field to exciting the nuclei).

While the flow chart 4000 of FIG. 40 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In view of the foregoing, the present disclosure provides a MRI RF coil configured to operate in at least one of a transmit mode or a receive mode, wherein the MRI RF coil comprises: a first birdcage coil comprising a pair of first-birdcage end rings and at least four first-birdcage rungs circumferentially arranged along the first-birdcage end rings; and a second birdcage coil comprising a pair of second-birdcage end rings and at least four second-birdcage rungs circumferentially arranged along the second-birdcage end rings; wherein the first and second birdcage coils neighbor and are spaced by a first non-zero distance along an axis, wherein the axis is surrounded by the first-birdcage end rings and the second-birdcage end rings, and wherein the first non-zero distance is greater than individual lengths of the first and second birdcage coils along the axis. In some embodiments, the MRI RF coil further comprises an RF shield surrounding a gap between the first and second birdcage coils, wherein the RF shield is cylindrical with a diameter that is within about 2 centimeters of individual diameters of the first and second birdcage coil. In some embodiments, the RF shield is spaced from and between the first and second birdcage coils and has a length along the axis that is less than the first non-zero distance. In some embodiments, the MRI RF coil further comprises an RF shield surrounding a gap between the first and second birdcage coils, wherein the first and second birdcage coils are low pass birdcage coils, and wherein the RF shield defines one of the first-birdcage end rings and one of the second-birdcage end rings. In some embodiments, the first birdcage coil has a different diameter than the second birdcage coil. In some embodiments, the MRI RF coil further comprises a phase shifter coupling the first birdcage coil to the second birdcage coil, wherein the phase shifter is configured to provide a phase shift that is an integer multiple of 180 degrees. In some embodiments, the first-birdcage end rings have different diameters. In some embodiments, individual centers of the first-birdcage end rings are offset from each other in a direction transverse to the axis. In some embodiments, the MRI RF coil further comprises a third birdcage coil comprising a pair of third-birdcage end rings and at least four third-birdcage rungs circumferentially arranged along the third-birdcage end rings, wherein the second and third birdcage coils neighbor and are spaced by a second non-zero distance along the axis, wherein the second birdcage coil is between the first and third birdcage coils along the axis, wherein the axis is surrounded by the third-birdcage end rings, and wherein the second non-zero distance is greater than individual lengths of the second and third birdcage coils along the axis. In some embodiments, the MRI RF coil further comprises an RF shield surrounding the second birdcage coil and further surrounding individual gaps separating the second birdcage coil from the first and third birdcage coils, wherein the RF shield is cylindrical and has a diameter bulging at the second birdcage coil. In some embodiments, the MRI RF coil further comprises an array receive coil surrounded by the first and second birdcage coils, wherein the array receive coil comprises a first row of receive coils circumferentially arranged around the axis and further comprises a second row of receive coils circumferentially arranged around the axis, wherein the first and second rows overlap along the axis, and wherein the second birdcage coil surrounds an inter-row overlapping region between the first and second rows. In some embodiments, a conductive trace extends along the axis from one of the first-birdcage end rings to one of the second-birdcage end rings, wherein the conductive trace is radially aligned with an intra-row overlapping region between neighboring receive coils in the first row.

In view of the foregoing, the present disclosure provides an MRI system comprising a MRI RF coil, wherein the MRI RF coil comprises: a plurality of birdcage coils, including a first birdcage coil and a second birdcage coil, wherein the birdcage coils are spaced along an axis, wherein each of the birdcage coils comprises a pair of end rings and at least four rungs surrounding the axis circumferentially along the end rings; wherein the first and second birdcage coils neighbor along the axis and are separated along the axis by a distance greater than individual lengths of the at least four rungs of the first and second birdcage coils. In some embodiments, the plurality of birdcage coils further comprises a third birdcage coil and a fourth birdcage coil, wherein the MRI system further comprises: a cable winding around the axis and electrically coupling individually to each of the birdcage coils at different angles around the axis; and a transmit circuit electrically coupled to the birdcage coils by the cable. In some embodiments, the MRI system further comprises a scanner comprising a main magnet, a plurality of gradient coils, and the MRI RF coil as a whole-body coil, wherein the MRI RF coil further comprises an RF shield separating a gap between the first and second birdcage coils from the gradient coils.

In view of the foregoing, the present disclosure provides a method for MRI comprising: providing an MRI RF coil comprising: a first birdcage coil and a second birdcage coil spaced along an axis, wherein each of the first and second birdcage coils comprises a pair of end rings and at least four rungs surrounding the axis circumferentially along the end rings, and wherein the first and second birdcage coils neighbor along the axis and are separated along the axis by a distance greater than individual lengths of the first and second birdcage coils; arranging a scan target within the MRI RF coil; and performing MRI on the scan target to generate an image of the scan target, wherein the performing comprises exciting first nuclei in the scan target at a first working frequency using the first and second birdcage coils. In some embodiments, the first and second birdcage coils are coupled indirectly by mutual inductance or directly through a phase shifter, wherein the first and second birdcage coils have individual resonant frequencies different than the first working frequency, and wherein the individual resonant frequencies are such that coupling leads to the first and second birdcage coils resonating together at the first working frequency. In some embodiments, the first and second birdcage coils are decoupled and have individual resonant frequencies that are the same as the first working frequency. In some embodiments, the first birdcage coil is tuned to a degenerate mode, wherein the exciting is performed by pTx. In some embodiments, the exciting comprises driving the MRI RF coil indirectly by inductive coupling with a whole-body coil. In some embodiments, the MRI RF coil is double tuned for different nuclei, including the first nuclei and second nuclei, wherein the performing comprises exciting the second nuclei in the scan target at a second working frequency using the first and second birdcage coils.

The following includes definitions of selected terms employed herein. The definitions include various examples or forms of components that fall within the scope of a term and that may be used for implementation. The examples are not intended to be limiting. Both singular and plural forms of terms may be within the definitions.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which embodiments belong. It will be further understood that terms (e.g., those defined in commonly used dictionaries) should be interpreted as having a meaning that is consistent with their meaning in the context of the relevant art and will not be interpreted in an idealized or overly formal sense unless expressly so defined herein.

In the above description, some components may be displayed in multiple figures carrying the same reference signs but may not be described multiple times in detail. A detailed description of a component may then apply to that component for all its occurrences.

The detailed descriptions presented herein may be presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, calculating, determining, and so on refer to actions and processes of a computer system, logic, processor, or similar electronic device that manipulates and transforms data represented as physical and/or electronic quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

What is claimed is:

1. A magnetic resonance imaging (MRI) radio frequency (RF) coil configured to operate in at least one of a transmit mode or a receive mode, wherein the MRI RF coil comprises:
   a first birdcage coil comprising a pair of first-birdcage end rings and at least four first-birdcage rungs circumferentially arranged along the first-birdcage end rings;
   a second birdcage coil comprising a pair of second-birdcage end rings and at least four second-birdcage rungs circumferentially arranged along the second-birdcage end rings; and an RF shield surrounding a gap between the first and second birdcage coils, wherein the RF shield is cylindrical with a diameter less than or equal to individual diameters of the first and second birdcage coils;

wherein the first and second birdcage coils neighbor and are spaced by a first non-zero distance along an axis, wherein the axis is surrounded by the first-birdcage end rings and the second-birdcage end rings, and wherein the first non-zero distance is greater than individual lengths of the first and second birdcage coils along the axis.

2. The MRI RF coil according to claim 1, wherein the RF shield is spaced from and between the first and second birdcage coils and has a length along the axis that is less than the first non-zero distance.

3. The MRI RF coil according to claim 1, wherein the first and second birdcage coils are low pass birdcage coils, and wherein the RF shield defines one of the first-birdcage end rings and one of the second-birdcage end rings.

4. The MRI RF coil according to claim 1, further comprising:
a third birdcage coil comprising a pair of third-birdcage end rings and at least four third-birdcage rungs circumferentially arranged along the third-birdcage end rings, wherein the second and third birdcage coils neighbor and are spaced by a second non-zero distance along the axis, wherein the second birdcage coil is between the first and third birdcage coils along the axis, wherein the axis is surrounded by the third-birdcage end rings, and wherein the second non-zero distance is greater than individual lengths of the second and third birdcage coils along the axis.

5. The MRI RF coil according to claim 1, wherein the second birdcage coil has an equivalent impedance, wherein the first and second birdcage coils are inductively coupled together, such that the first birdcage coil is configured to induce a voltage in the second birdcage coil that is equal in magnitude and opposite in polarity to a product of the equivalent impedance and current in the second birdcage coil.

6. The MRI RF coil according to claim 1, wherein the MRI RF coil is devoid of metal traces at the gap surrounded by the RF shield between the first and second birdcage coils.

7. The MRI RF coil according to claim 1, wherein the diameter of the RF shield is equal to the individual diameters of the first and second birdcage coils.

8. The MRI RF coil according to claim 1, wherein each birdcage coil of the MRI RF coil surrounds the axis and is non-overlapping radially from the axis with each other birdcage coil of the MRI RF coil.

9. A magnetic resonance imaging (MRI) system comprising a MRI radio frequency (RF) coil, wherein the MRI RF coil comprises:
a plurality of birdcage coils, including a first birdcage coil, a second birdcage coil, and a third birdcage coil, wherein the birdcage coils are spaced along an axis, wherein each of the birdcage coils comprises a pair of end rings and at least four rungs surrounding the axis circumferentially along the end rings;
wherein the second birdcage coil is between and neighbors the first and third birdcage coils along the axis, wherein the first and second birdcage coils are separated along the axis by a first distance greater than individual lengths of the at least four rungs of the first and second birdcage coils, and wherein the second and third birdcage coils are separated along the axis by a second distance greater than individual lengths of the at least four rungs of the second and third birdcage coils.

10. The MRI system according to claim 9, wherein the MRI RF coil further comprises:
an array receive coil surrounded by the first and second birdcage coils, wherein the array receive coil comprises a first row of receive coils circumferentially arranged around the axis and further comprises a second row of receive coils circumferentially arranged around the axis, wherein the first and second rows overlap along the axis, and wherein the second birdcage coil surrounds an inter-row overlapping region between the first and second rows.

11. The MRI system according to claim 10, wherein the MRI RF coil further comprises:
a conductive trace extending along the axis from one of the end rings of the first birdcage coil to one of the end rings of the second birdcage coil, wherein the conductive trace is radially aligned with an intra-row overlapping region between neighboring receive coils in the first row.

12. The MRI system according to claim 9, wherein the plurality of birdcage coils further comprises a fourth birdcage coil, and wherein the MRI system further comprises:
a cable winding around the axis and electrically coupling individually to each of the birdcage coils at different angles around the axis; and
a transmit circuit electrically coupled to the birdcage coils by the cable.

13. The MRI system according to claim 9, further comprising:
a scanner comprising a main magnet, a plurality of gradient coils, and the MRI RF coil as a whole-body coil, wherein the MRI RF coil further comprises an RF shield separating a gap between the first and second birdcage coils from the gradient coils.

14. A method for magnetic resonance imaging (MRI) comprising:
providing an MRI radio frequency (RF) coil comprising a plurality of birdcage coils, wherein the plurality of birdcage coils comprises a first birdcage coil and a second birdcage coil spaced along an axis, wherein each of the first and second birdcage coils comprises a pair of end rings and at least four rungs surrounding the axis circumferentially along the end rings, and wherein the first and second birdcage coils neighbor along the axis and are separated along the axis by a distance greater than individual lengths of the first and second birdcage coils;
arranging a scan target within the MRI RF coil; and
performing MRI on the scan target to generate an image of the scan target, wherein the performing comprises generating a Bi magnetic field and applying the $B_1$ magnetic field to first nuclei in the scan target to excite the first nuclei at a first working frequency;
wherein each birdcage coil of the plurality of birdcage coils is non-overlapping radially from the axis with each other birdcage coil of the plurality of birdcage coils, and wherein the $B_1$ magnetic field is generated entirely by the plurality of birdcage coils.

15. The method according to claim 14, wherein the first and second birdcage coils are coupled indirectly by mutual inductance or directly through a phase shifter, wherein the first and second birdcage coils have individual resonant frequencies different than the first working frequency, and wherein the individual resonant frequencies are such that coupling leads to the first and second birdcage coils resonating together at the first working frequency.

16. The method according to claim 14, wherein the first and second birdcage coils are decoupled and have individual resonant frequencies that are the same as the first working frequency.

17. The method according to claim 14, wherein the first birdcage coil is tuned to a degenerate mode, and wherein the generating and the applying are performed by parallel transmission (pTx).

18. The method according to claim 14, wherein the generating and the applying comprise driving the MRI RF coil indirectly by inductive coupling with a whole-body coil.

19. The method according to claim 14, wherein the MRI RF coil is double tuned for different nuclei, including the first nuclei and second nuclei, and wherein the performing comprises exciting the second nuclei in the scan target at a second working frequency using the first and second birdcage coils.

20. The method according to claim 14, wherein the MRI RF coil is devoid of metal traces at a gap separating the first and second birdcage coils.

\* \* \* \* \*